United States Patent
Chen et al.

(10) Patent No.: US 12,543,335 B2
(45) Date of Patent: *Feb. 3, 2026

(54) MULTILAYER MASKING LAYER AND METHOD OF FORMING SAME

(71) Applicant: Taiwan Semiconductor Manufacturing Co., Ltd., Hsinchu (TW)

(72) Inventors: Wen-Ju Chen, Taipei (TW); Chung-Ting Ko, Kaohsiung (TW); Ya-Lan Chang, Hsinchu (TW); Ting-Gang Chen, Taipei (TW); Tai-Chun Huang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 183 days.

This patent is subject to a terminal disclaimer.

(21) Appl. No.: 18/364,352

(22) Filed: Aug. 2, 2023

(65) Prior Publication Data

US 2023/0395702 A1   Dec. 7, 2023

Related U.S. Application Data

(62) Division of application No. 17/198,133, filed on Mar. 10, 2021, now Pat. No. 11,855,185.

(Continued)

(51) Int. Cl.
*H10D 30/01* (2025.01)
*H01L 21/02* (2006.01)

(Continued)

(52) U.S. Cl.
CPC ..... *H10D 30/024* (2025.01); *H01L 21/02178* (2013.01); *H01L 21/0332* (2013.01);
(Continued)

(58) Field of Classification Search
CPC .... H10D 30/014; H10D 30/024; H10D 30/43; H10D 30/62; H10D 84/0158; H10D 84/017; H10D 62/119; H10D 62/021
See application file for complete search history.

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

CN   110729245 A   1/2020
CN   110970294 A   4/2020
(Continued)

*Primary Examiner* — Tuan A Hoang
(74) *Attorney, Agent, or Firm* — Slater Matsil, LLP

(57) ABSTRACT

A method includes forming a semiconductor layer over a substrate; etching a portion of the semiconductor layer to form a first recess and a second recess; forming a first masking layer over the semiconductor layer; performing a first thermal treatment on the first masking layer, the first thermal treatment densifying the first masking layer; etching the first masking layer to expose the first recess; forming a first semiconductor material in the first recess; and removing the first masking layer.

20 Claims, 89 Drawing Sheets

Related U.S. Application Data

(60) Provisional application No. 63/052,604, filed on Jul. 16, 2020.

(51) Int. Cl.
  *H01L 21/033* (2006.01)
  *H10D 30/62* (2025.01)
  *H10D 62/00* (2025.01)
  *H10D 62/10* (2025.01)
  *H10D 84/01* (2025.01)
  *H10D 84/03* (2025.01)

(52) U.S. Cl.
  CPC ........... *H10D 30/62* (2025.01); *H10D 62/021* (2025.01); *H10D 62/119* (2025.01); *H10D 84/0158* (2025.01); *H10D 84/038* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,008,583 B1 | 6/2018 | Rodder et al. |
| 10,243,040 B1 | 3/2019 | Park et al. |
| 10,916,477 B2 | 2/2021 | Hung et al. |
| 11,342,411 B2 | 5/2022 | Hsu et al. |
| 2015/0031177 A1 | 1/2015 | Riley et al. |
| 2016/0240652 A1* | 8/2016 | Ching ................. H10D 84/038 |
| 2017/0373063 A1 | 12/2017 | Bao et al. |
| 2018/0040703 A1 | 2/2018 | Chang et al. |
| 2018/0331179 A1* | 11/2018 | Cheng ................. H10D 30/024 |
| 2019/0088820 A1* | 3/2019 | Danesh ................... H01L 25/13 |
| 2020/0135729 A1 | 4/2020 | Ng et al. |
| 2020/0212186 A1 | 7/2020 | Metz et al. |

FOREIGN PATENT DOCUMENTS

| | | | |
|---|---|---|---|
| EP | 0154670 A2 * | 9/1985 | ........... H10D 64/685 |
| KR | 20190043359 A | 4/2019 | |
| TW | 201907453 A | 2/2019 | |
| TW | 202013461 A | 4/2020 | |

* cited by examiner

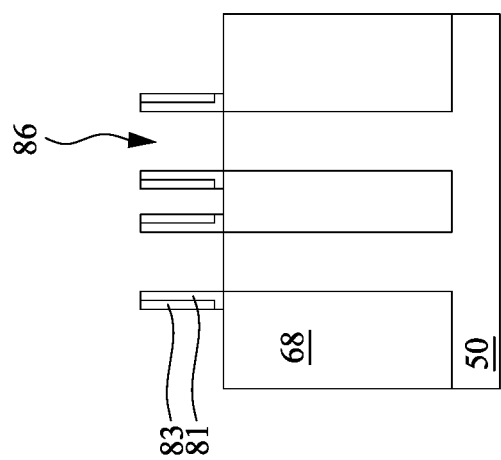

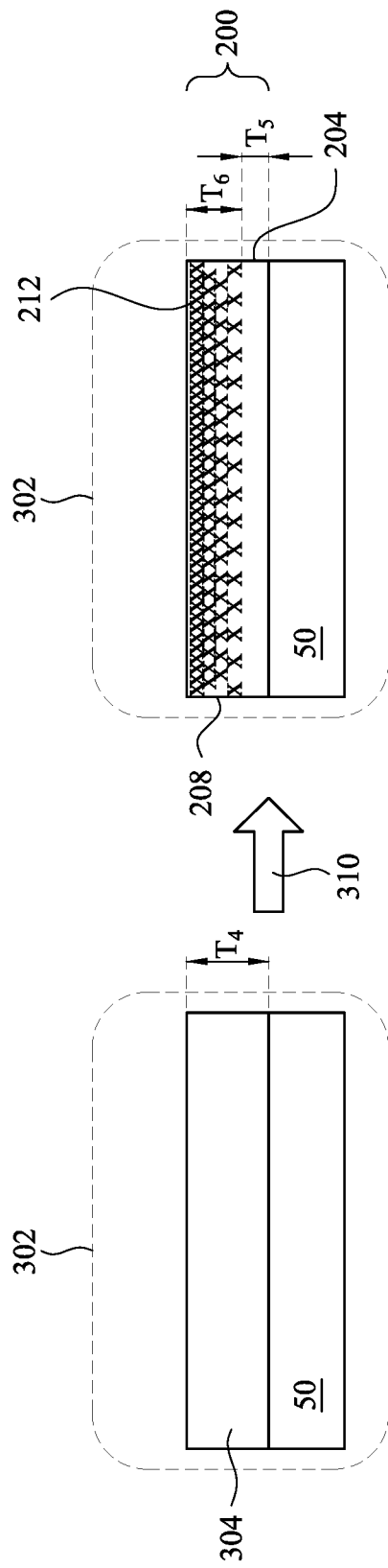
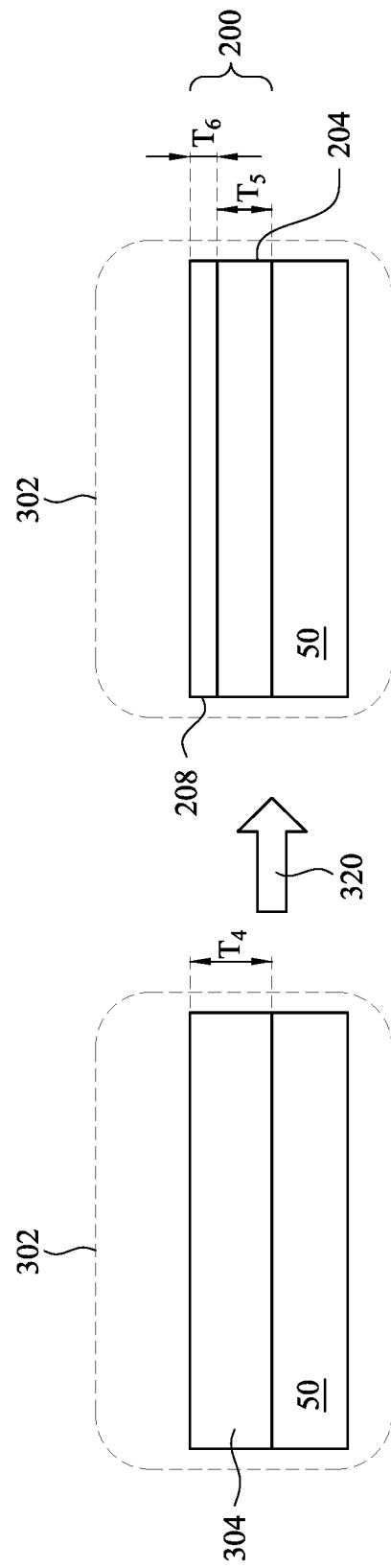

MULTILAYER MASKING LAYER AND METHOD OF FORMING SAME

PRIORITY CLAIM AND CROSS-REFERENCE

This application is a divisional of U.S. patent application Ser. No. 17/198,133, filed on Mar. 10, 2021, entitled "Multilayer Masking Layer and Method of Forming Same," which claims the benefit of U.S. Provisional Application No. 63/052,604, filed on Jul. 16, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 12A, 12B, 13A, 13B, 13C, 14A, 14B, 15A, 15B, 15C, 16A, 16B, 16C, 17A, 17B, 17C, 17D, 18A, 18B, 18C, 19A, 19B, 19C, 20A, 20B, 20C, 20D, 21A, 21B, 21C, 22A, 22B, 23A, 23B, 24A, 24B, 25A, 25B, 26A, 26B, 26C, 27A, 27B, 27C, 28A, 28B, 28C, 29A, 29B, 30A, 30B, 31A, 31B, 31C, 31D, 32A, 32B, 33A, 33B, 33C, 34A, 34B, 34C, 35A, 35B, 35C, 35D, 35E, 36A, 36B, 36C, 37A, 37B, and 37C are cross-sectional views of intermediate stages in the manufacturing of nano-FETs, in accordance with some embodiments.

DETAILED DESCRIPTION

Figure 1:
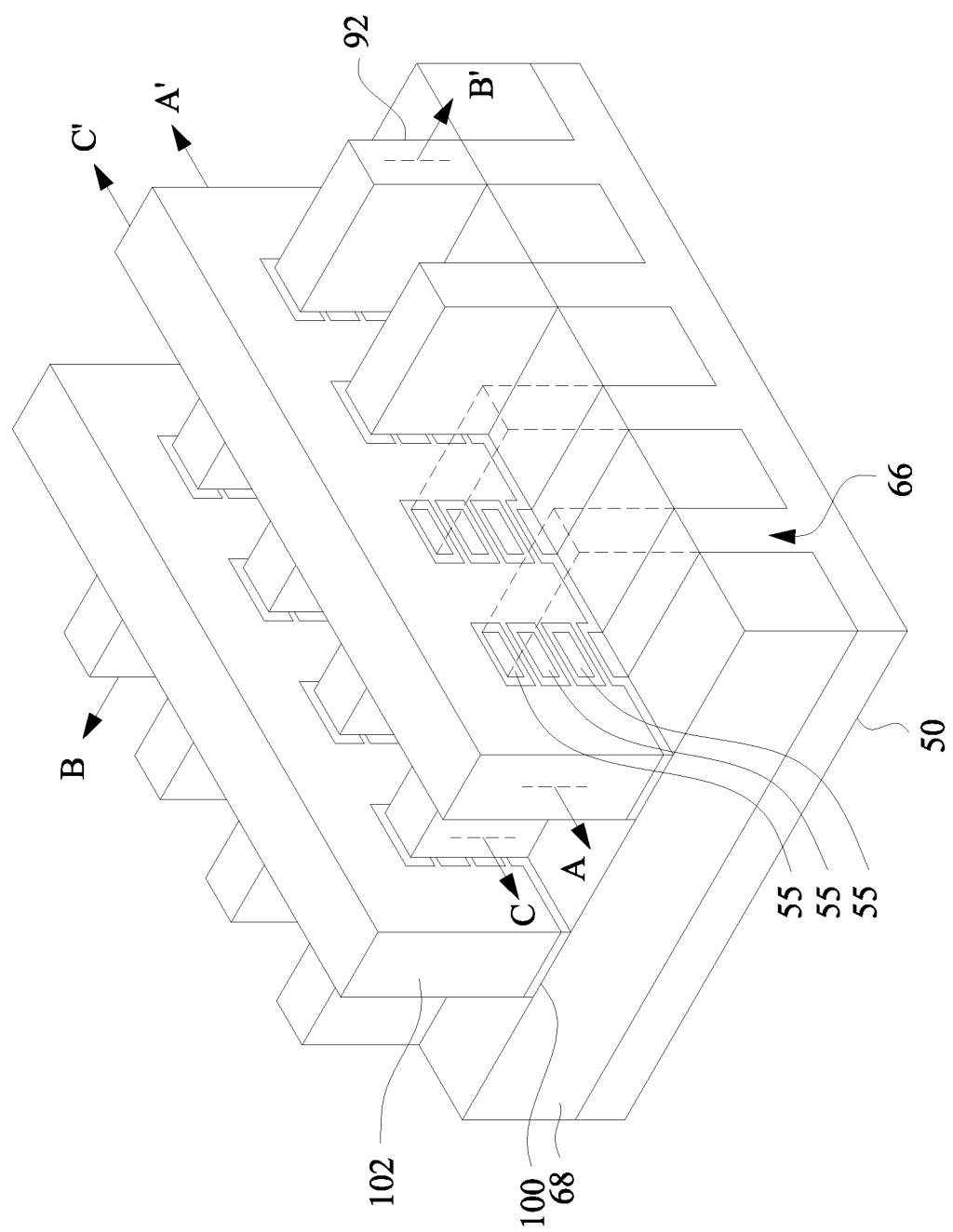
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a die comprising nano-FETs. The methods include forming stacks of semiconductor layers and etching those stacks to form epitaxial source/drain regions. Regions of the die dedicated to p-type transistors may be masked while forming or treating features within regions of the die dedicated to n-type transistors. Similarly, regions of the die dedicated to n-type transistors may be masked while forming or treating features within regions of the die dedicated to p-type transistors. The various mask layers may be formed and treated in such a way to improve the efficiency of those other processes while also making the various mask layers easier to remove afterward. Gate structures may then be formed over the stacks of semiconductor layers to form transistor structures. In addition, a front-side interconnect structure may be formed over a first side of the transistor structures, and a backside interconnect structure may be formed over an opposite side of the transistor structures. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate), wherein the nanostructures 55 act as channel regions for the nano-FETs. The nanostructures 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 37C are cross-sectional views of intermediate stages in the manufacturing of nano-FETs, in accordance with some embodiments. FIGS. 2 through 5, 6A, 21A, 22A, 23A, 24A, 25A, 26A, 27A, and 28A illustrate reference cross-section A-A' illustrated in FIG. 1. FIGS. 6B, 7B, 8B, 9B, 10B, 11B, 12B, 13B, 13C, 14B, 15B, 16B, 17B, 17D, 18B, 19B, 20B, 20D, 21B, 22B, 23B, 24B, 25B, 26B, 27B, 28B, 29B, 30B, 31B, 31C, 31D, 32B, 33B, 34B, 35B, 35D, 35E, 36B, and 37B illustrate reference cross-section B-B' illustrated in FIG. 1. FIGS. 7A, 8A, 9A, 10A, 11A, 12A, 13A, 14A, 15A, 15C, 16A, 16C, 17A, 17C, 18A, 18C, 19A, 19C, 20A, 20C, 21C, 26C, 27C, 28C, 29A, 30A, 31A, 32A, 33A, 33C, 34A, 34C, 35A, 35C, 36A, 36C, 37A, and 37C illustrate reference cross-section C-C' illustrated in FIG. 1.

Figure 2:
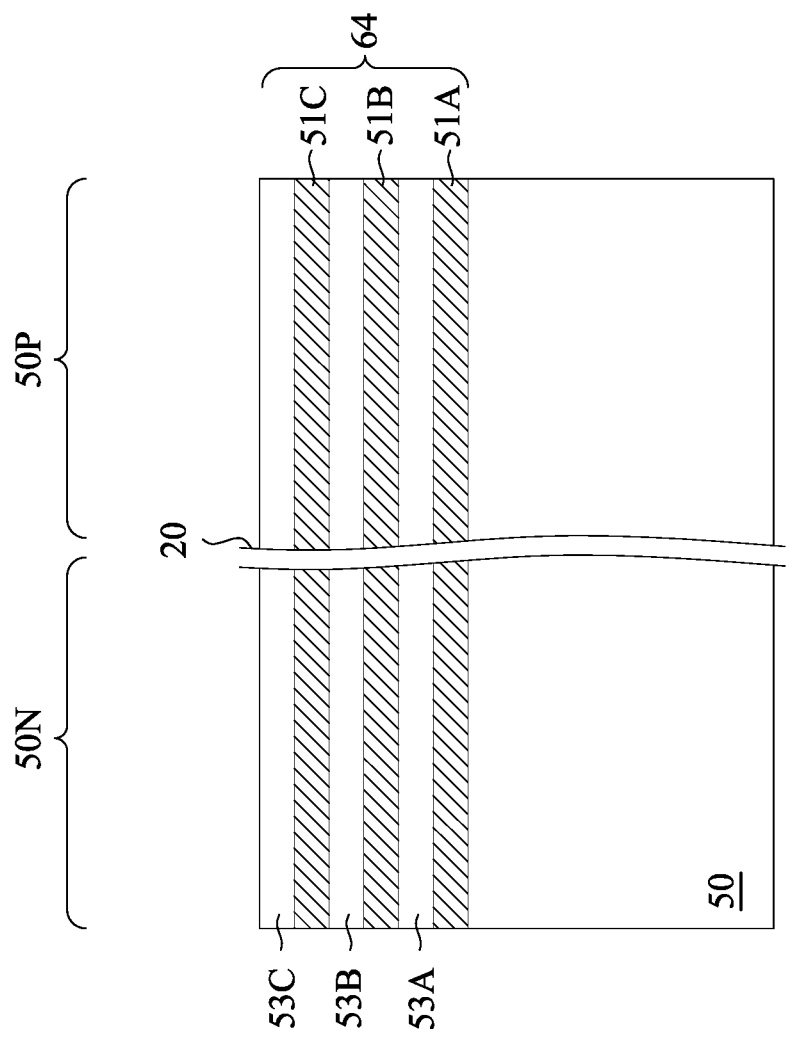

In FIG. 2, the substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P. In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nanostructure field-effect transistors (NSFETs). Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETs.

Figure 3:
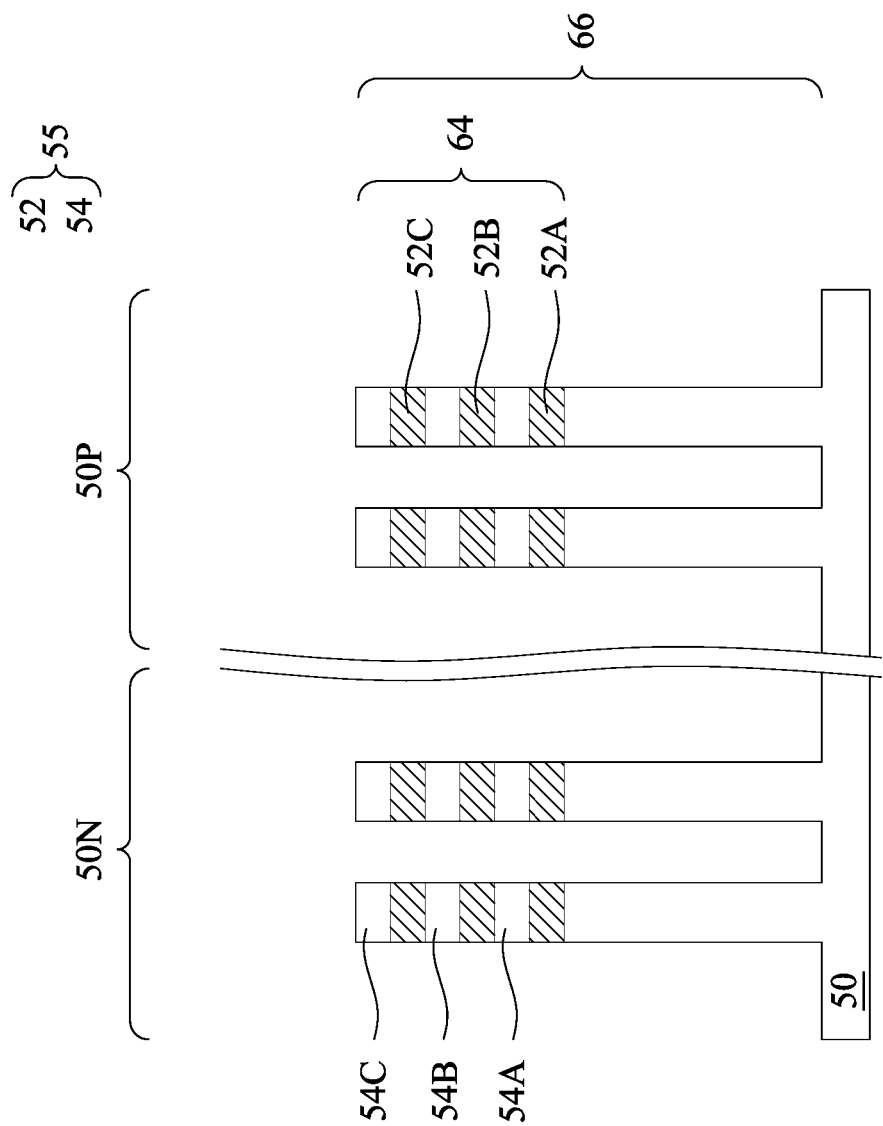

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
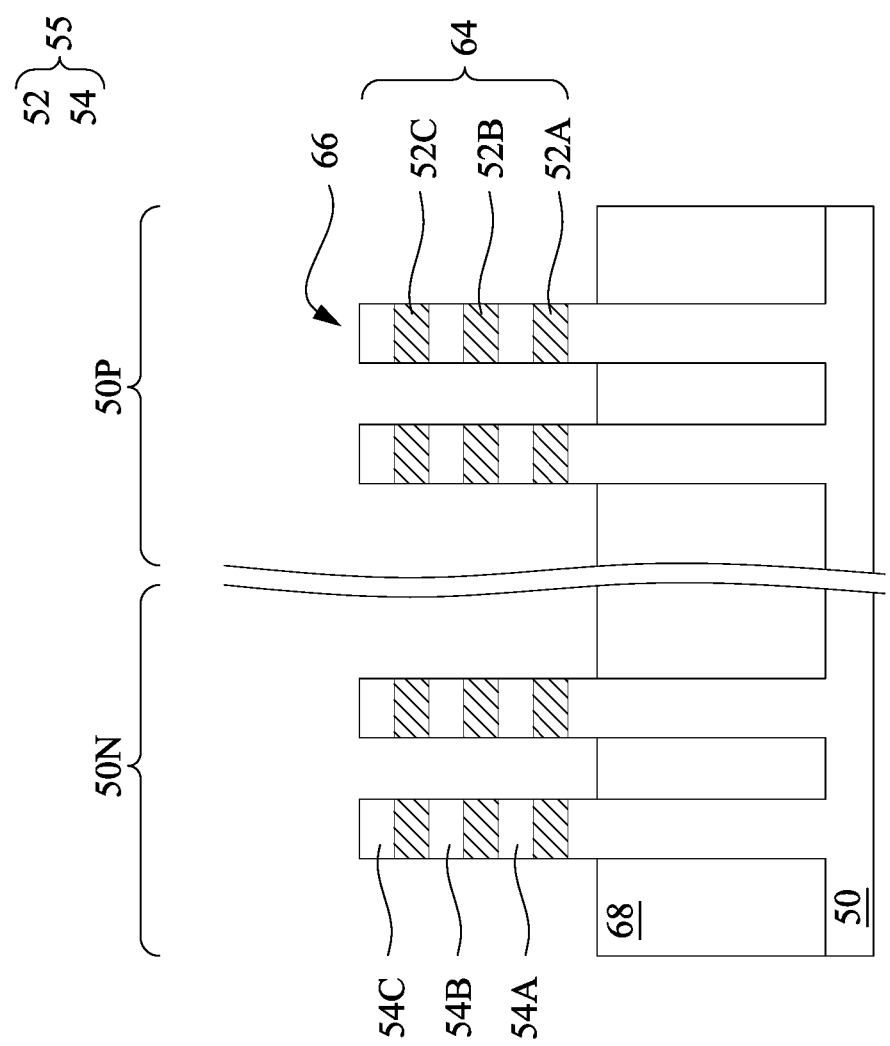

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the region 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55 (not separately labeled in later figures), and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using one or more spin-on or deposition techniques and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using one or more spin-on or deposition techniques and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
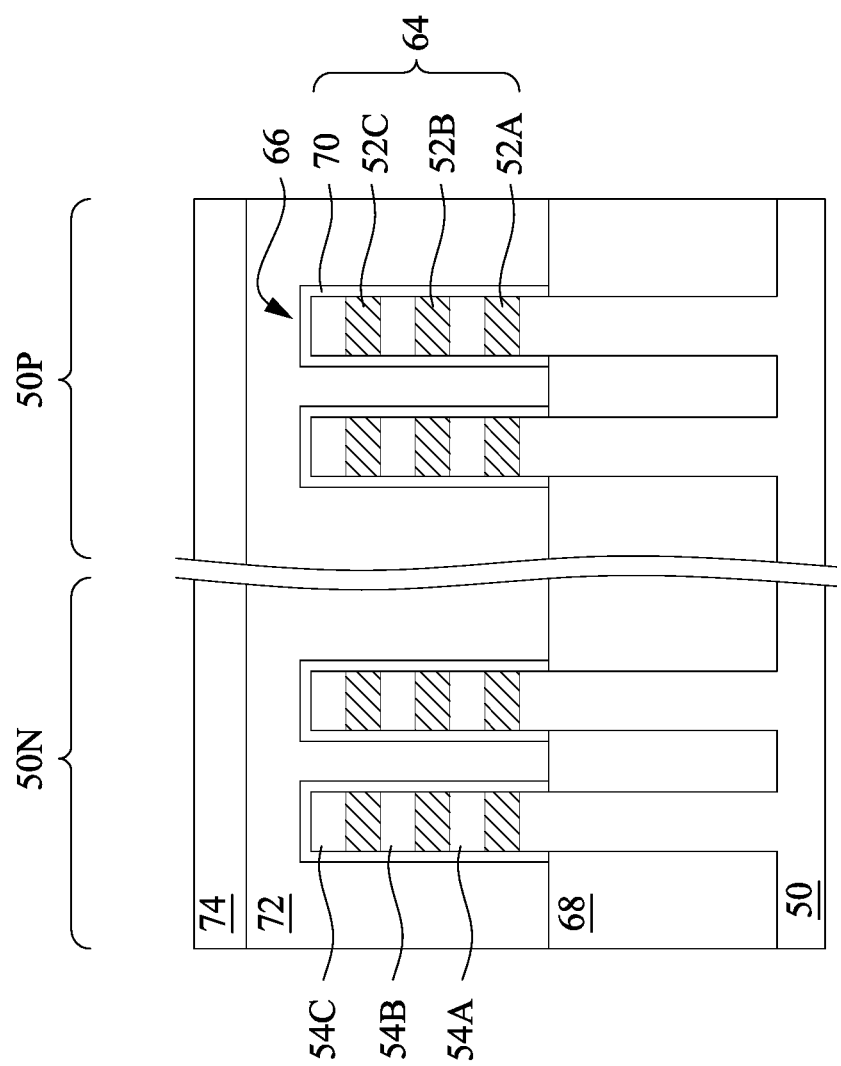

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
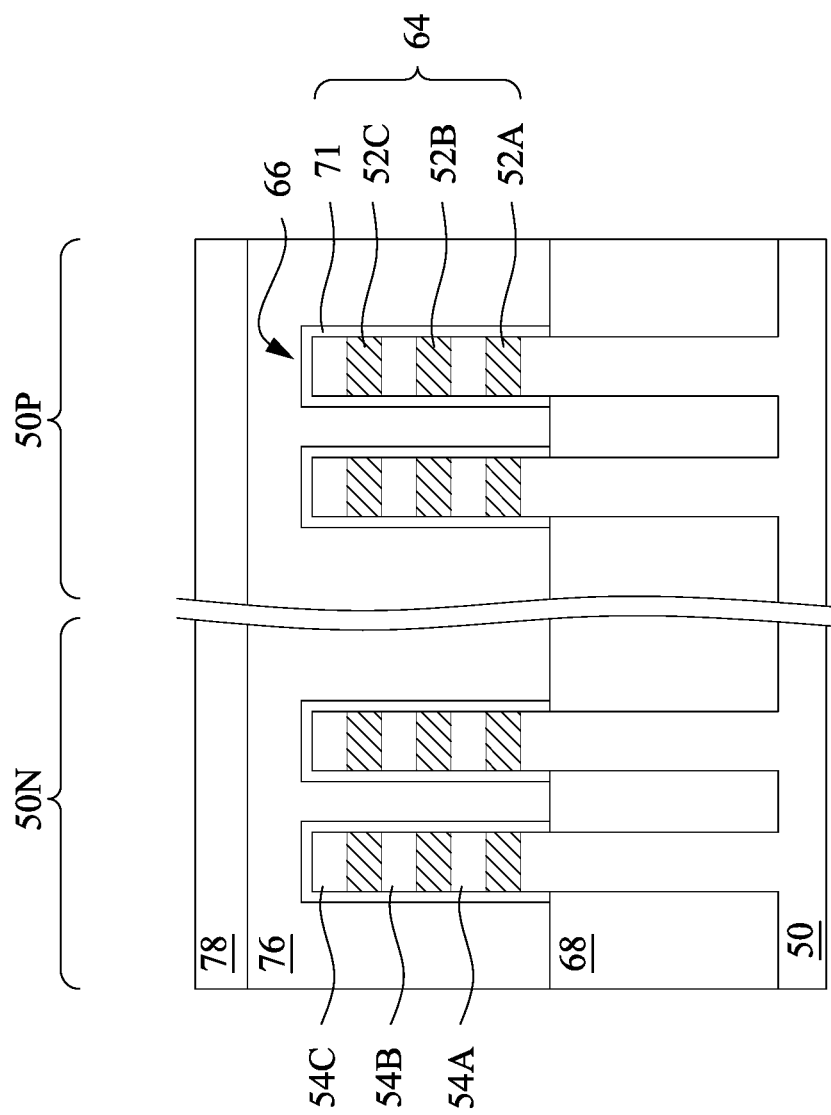
Figure 6B:
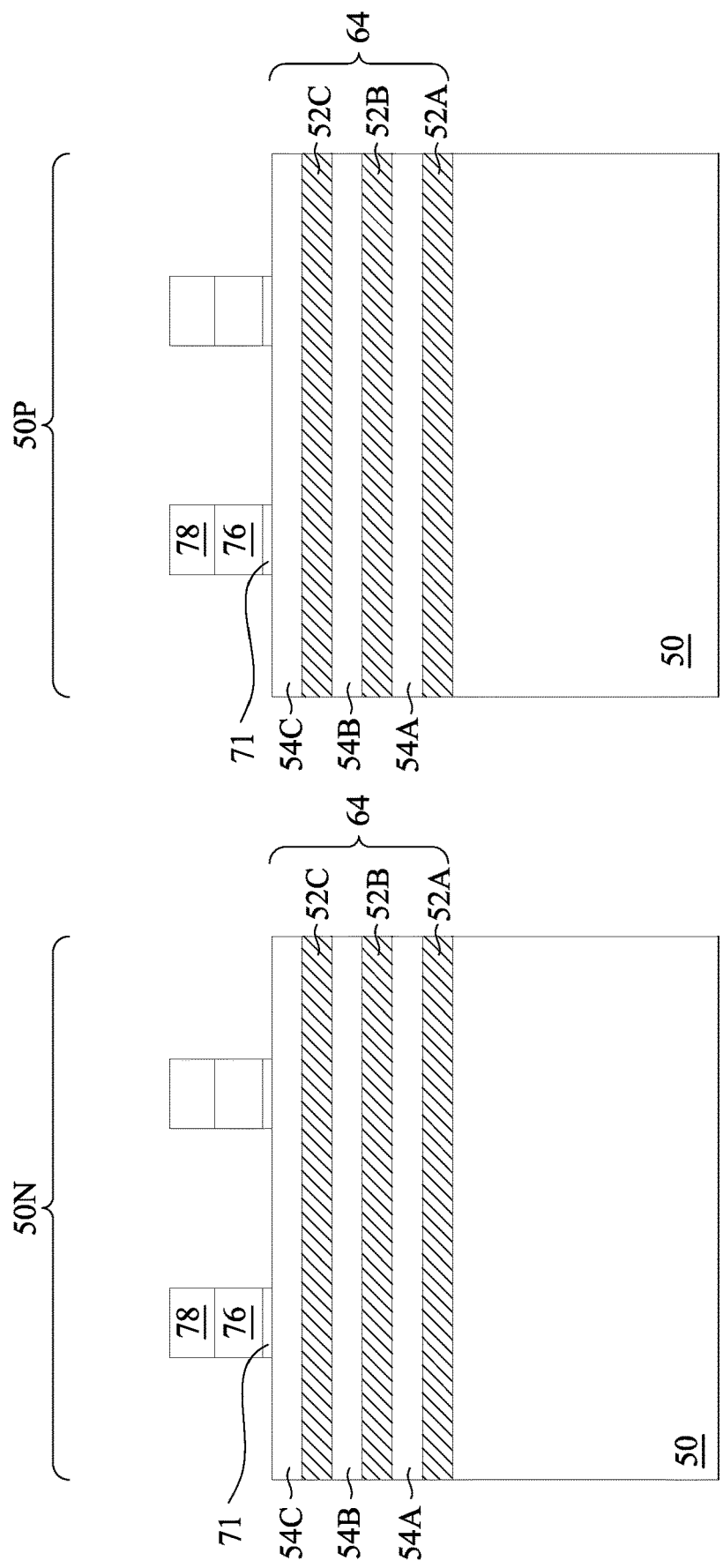

FIGS. 6A through 20D illustrate various additional steps in the manufacturing of embodiment devices. FIGS. 6A, 7A, 8A, 9A, 10A, 11A, 12A, 13A, 13C, 14A, 15A, 15C, 16A, 16C, 17A, 17C, 17D, 18A, 18C, 19A, 19C, 20A, and 20C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
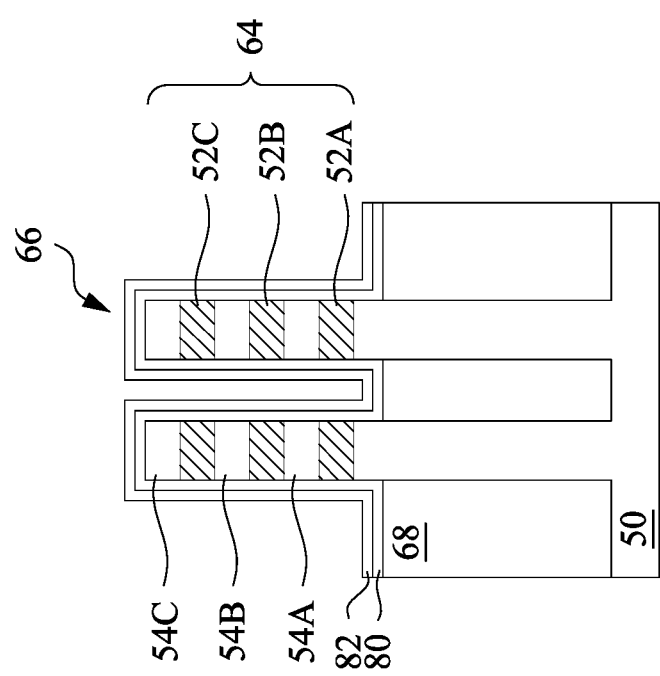
Figure 7B:
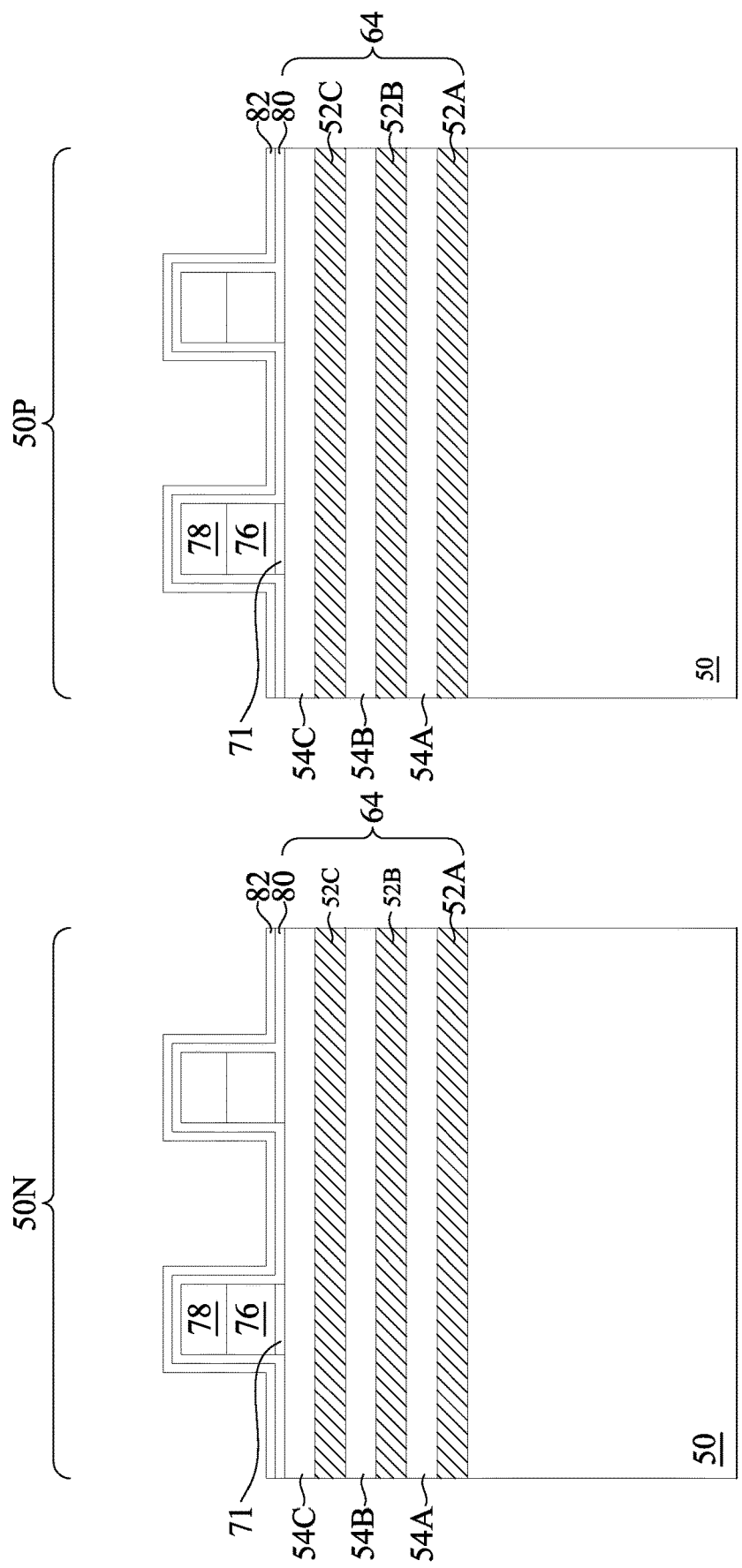

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
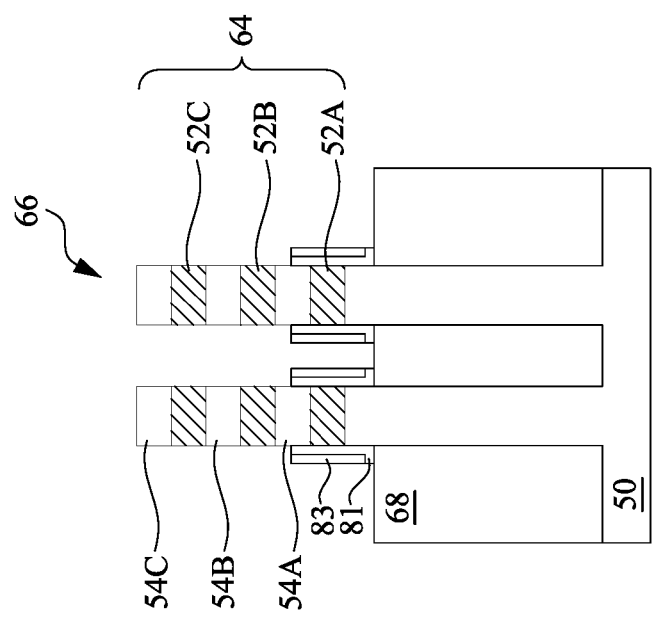
Figure 8B:
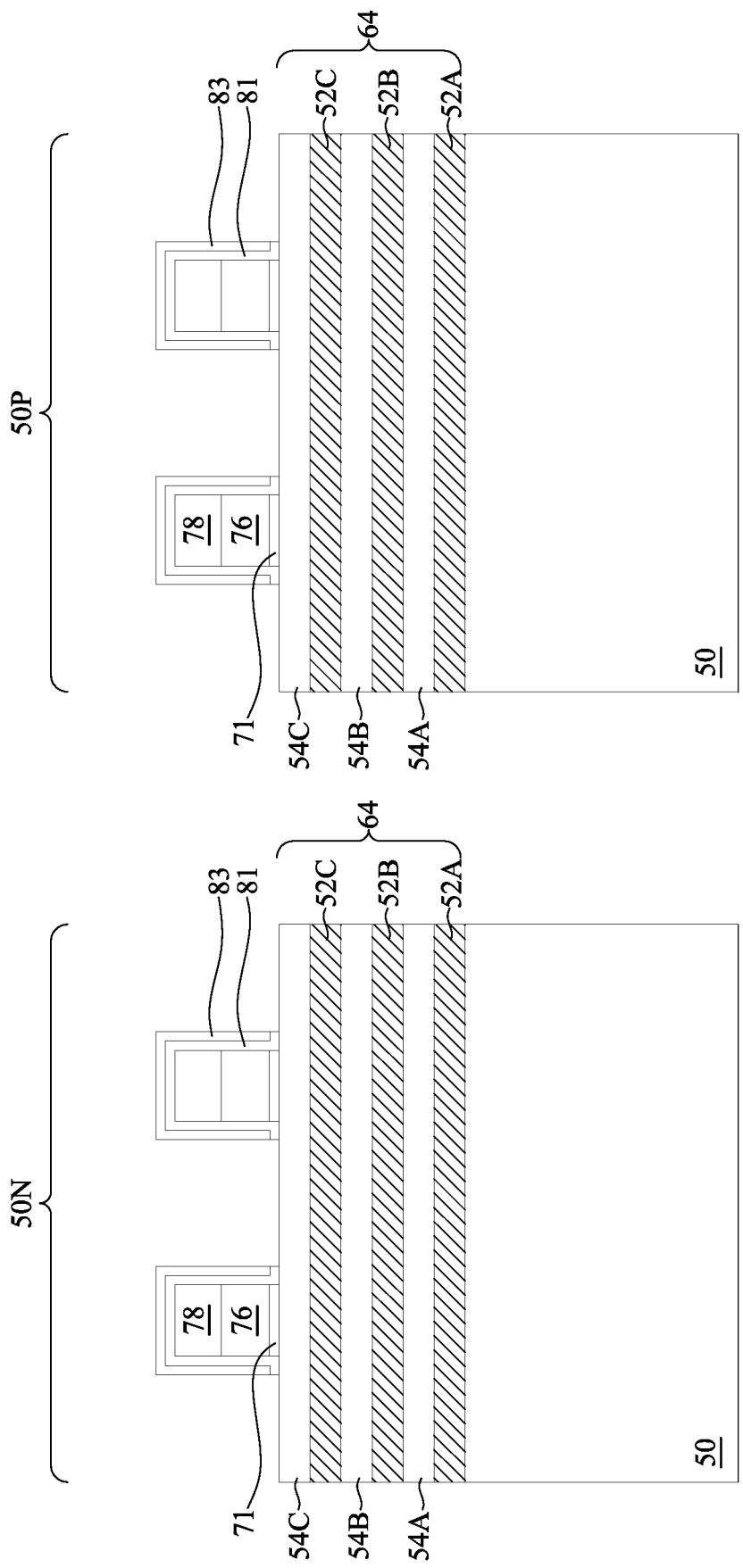

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A. Although not specifically illustrated in FIG. 8B, in accordance with some embodiments, the etch process (e.g., the anisotropic etch process), or even the use of additional masking and etching processes, may additionally remove the first spacer layer 80 and the second spacer layer 82 from over the top of the masks 78 as well as the second spacer layer 82 from the lateral sides of the dummy gates 76 and the masks 78.

As illustrated in FIG. 8A, the first spacers 81 and the second spacers 83 are disposed on sidewalls of the fins 66 and/or nanostructures 55. As illustrated in FIG. 8B, portions of the first spacer 81 and the second spacer 83 may remain adjacent and over the masks 78, the dummy gates 76, and the dummy gate dielectrics 71. In other embodiments not specifically illustrated, the second spacer layer 82 may be removed from over the first spacer layer 80 adjacent and over a top of the masks 78, the dummy gates 76, and the dummy gate dielectrics 71, and the first spacer layer 80 may be removed from over the top of the masks 78.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
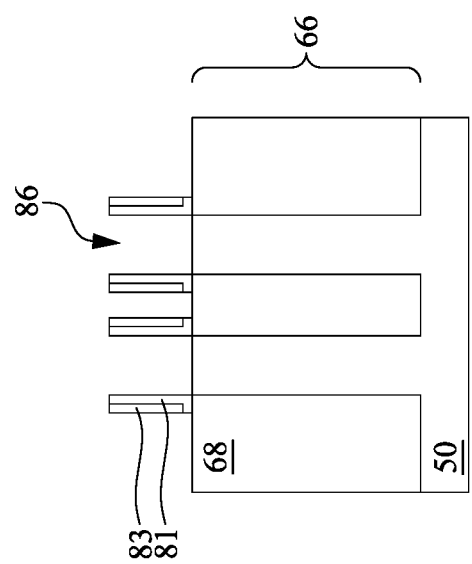
Figure 9B:
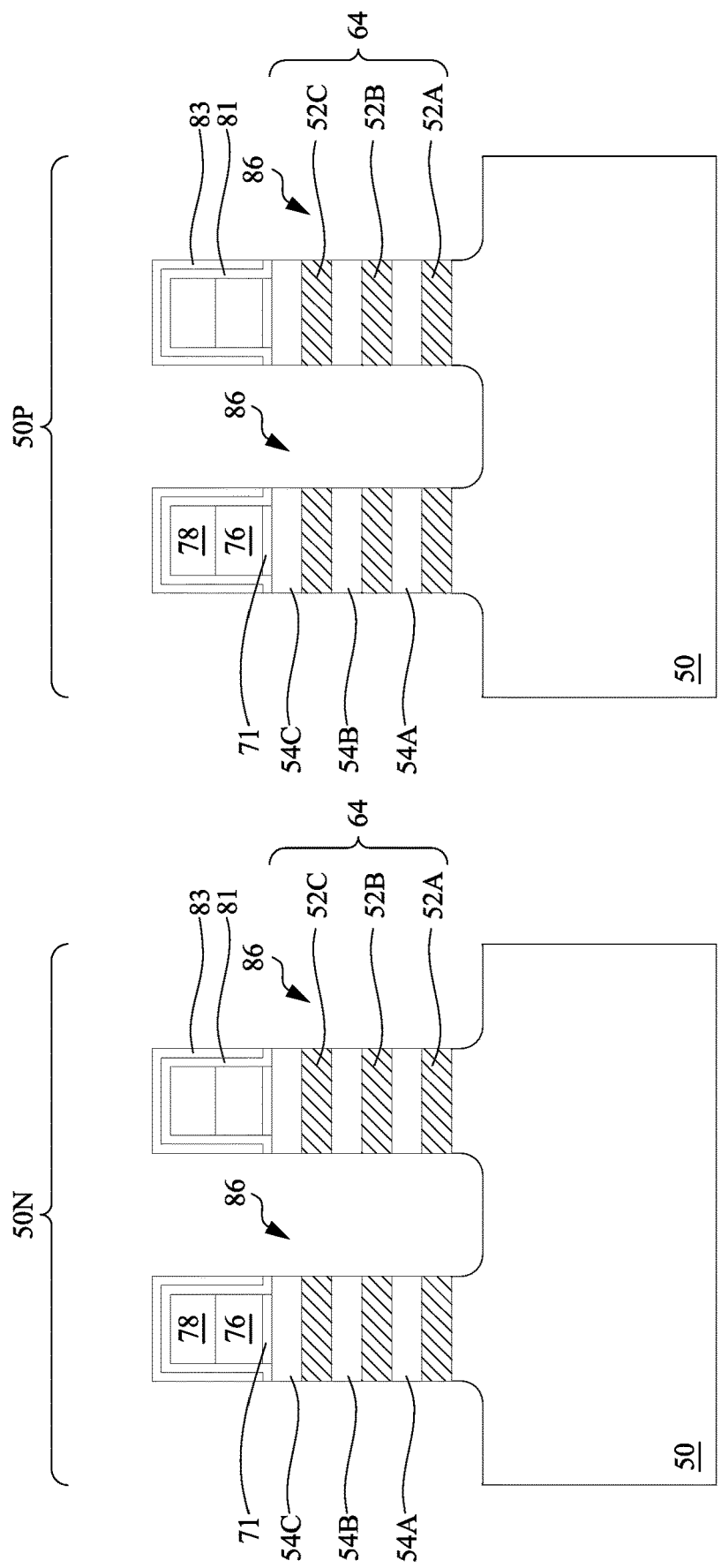

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
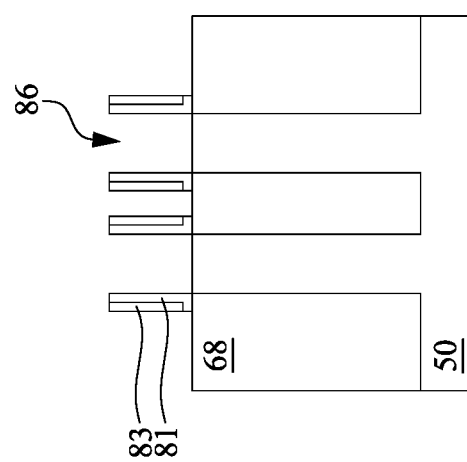
Figure 10B:
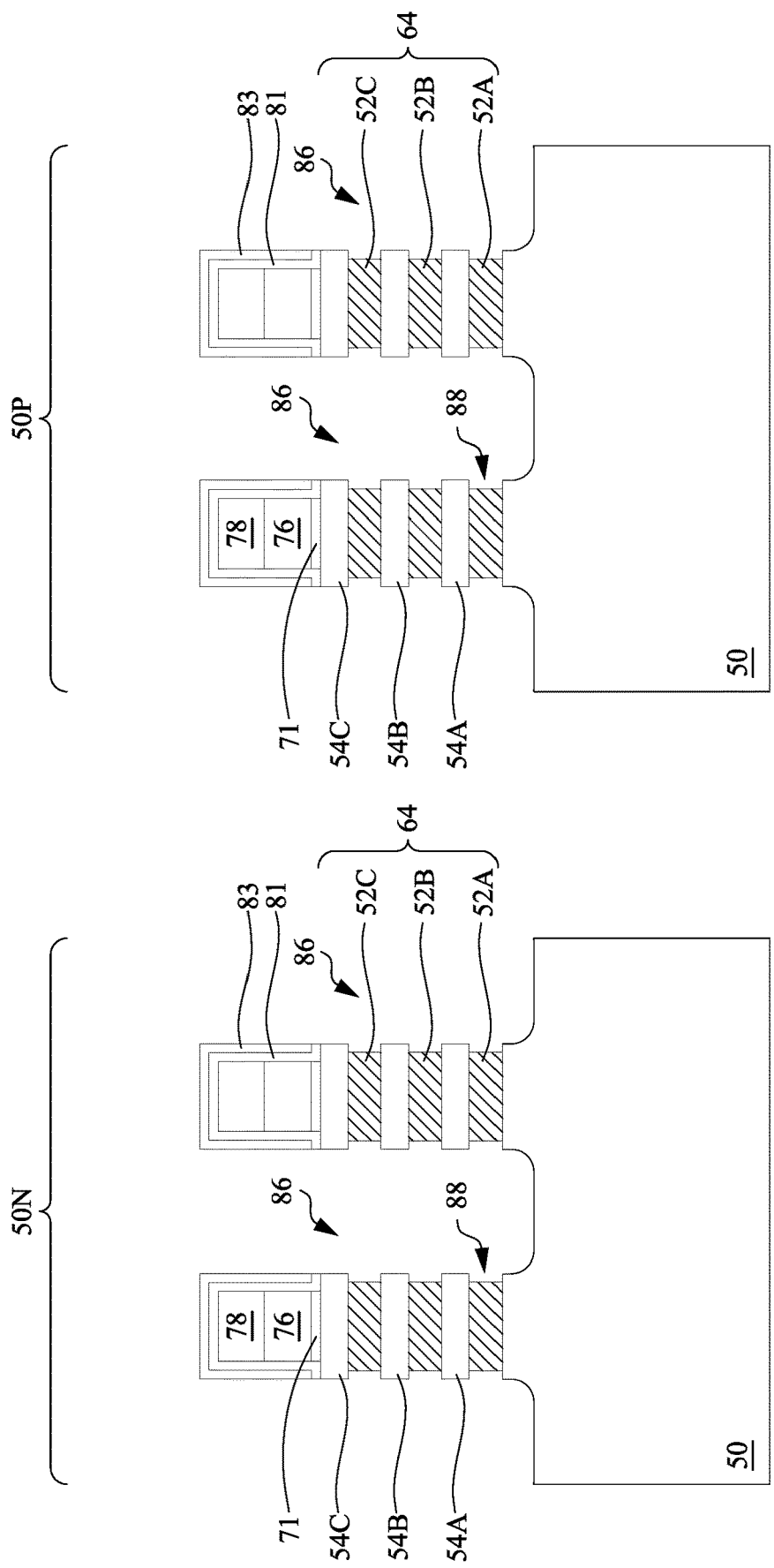

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in the sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, for example, SiGe, and the second nanostructures 54 include, for example, Si or SiC, a dry etch process with tetramethylammonium hydroxide (TMAH), ammonium hydroxide (NH$_4$OH), or the like may be used to etch sidewalls of the first nanostructures 52 in the n-type region 50N, and a dry etch process with hydrogen fluoride, another fluorine-based etchant, or the like may be used to etch sidewalls of the second nanostructures 54 in the p-type region 50P.

Figure 11A:
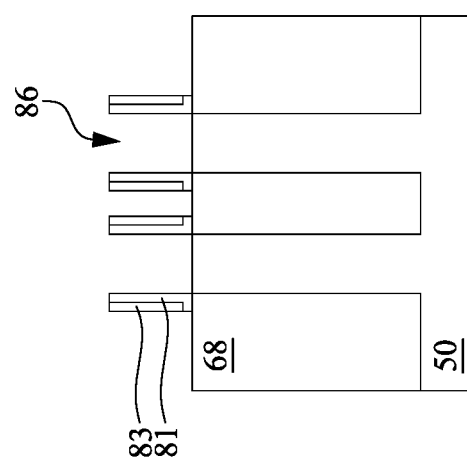
Figure 11B:
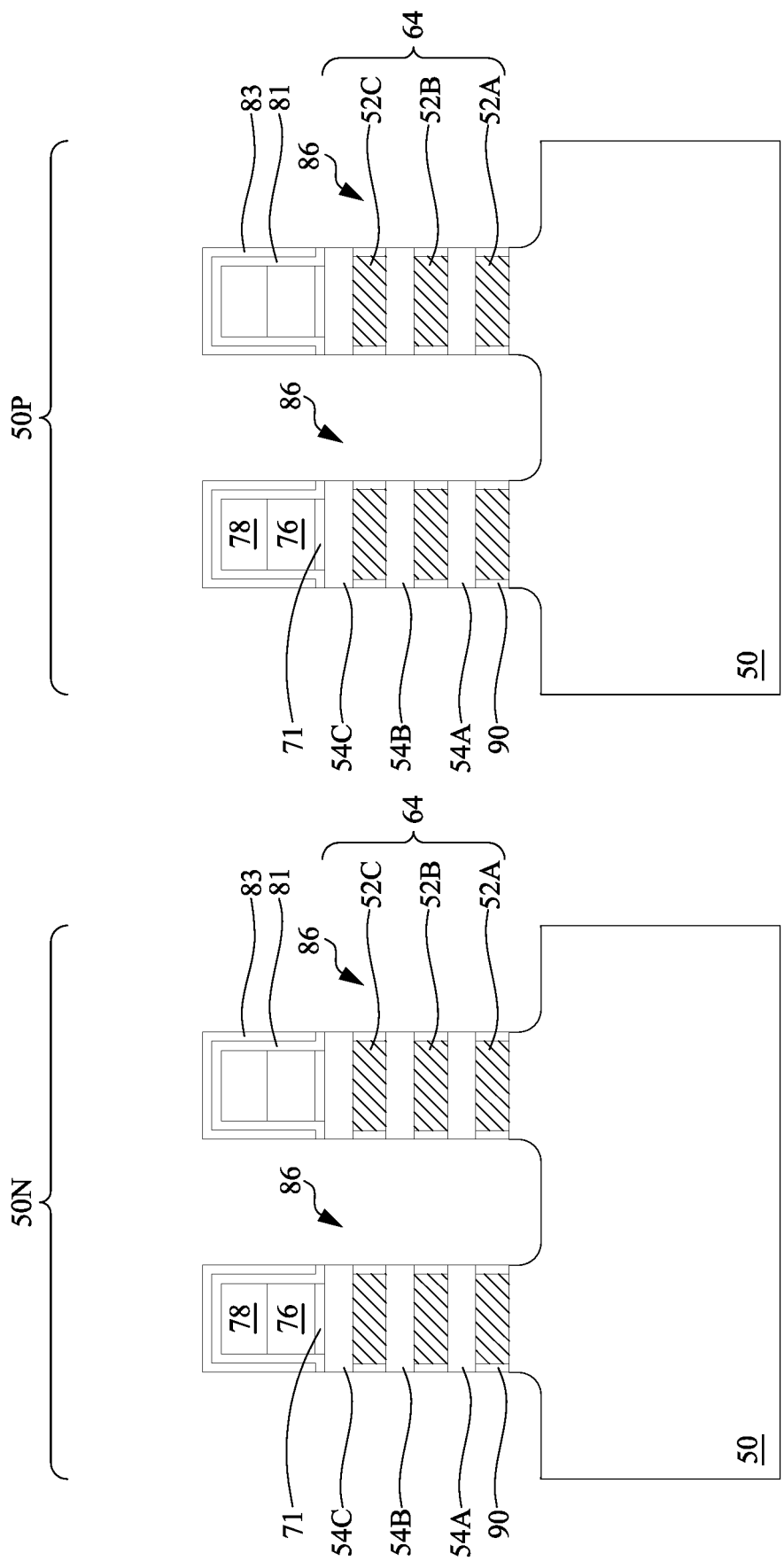

In FIGS. 11A-11B, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. The first inner spacers 90 may be used to prevent damage to subsequently formed source/drain regions (such as the epitaxial source/drain regions 92, discussed below) by subsequent etching processes, such as etching processes used to form gate structures. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

In FIGS. 12A-19C, epitaxial source/drain regions 92 are formed in the first recesses 86. In particular, FIGS. 12A-15D illustrate forming epitaxial source/drain regions 92 in the n-type region 50N, and FIGS. 16A-19C illustrate forming epitaxial source/drain regions 92 in the p-type region 50P. In some embodiments, the epitaxial source/drain regions 92 may exert stress on the second nanostructures 54 in the n-type region 50N and on the first nanostructures 52 in the p-type region 50P, thereby improving performance. As illustrated, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

Figure 18A:
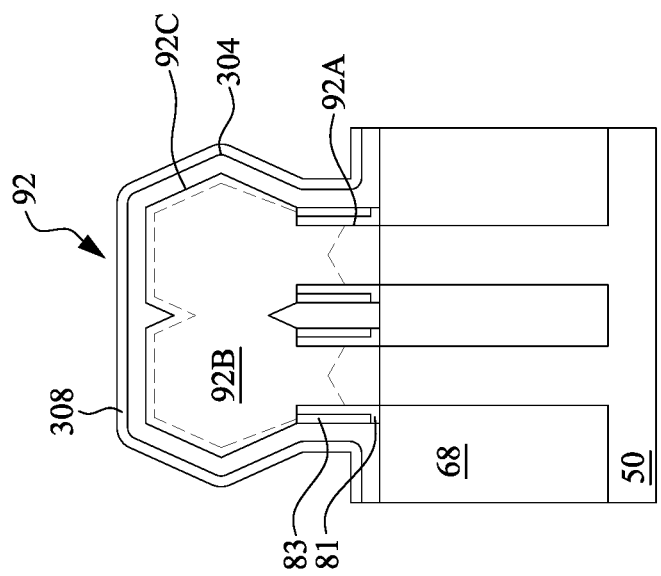
Figure 18B:
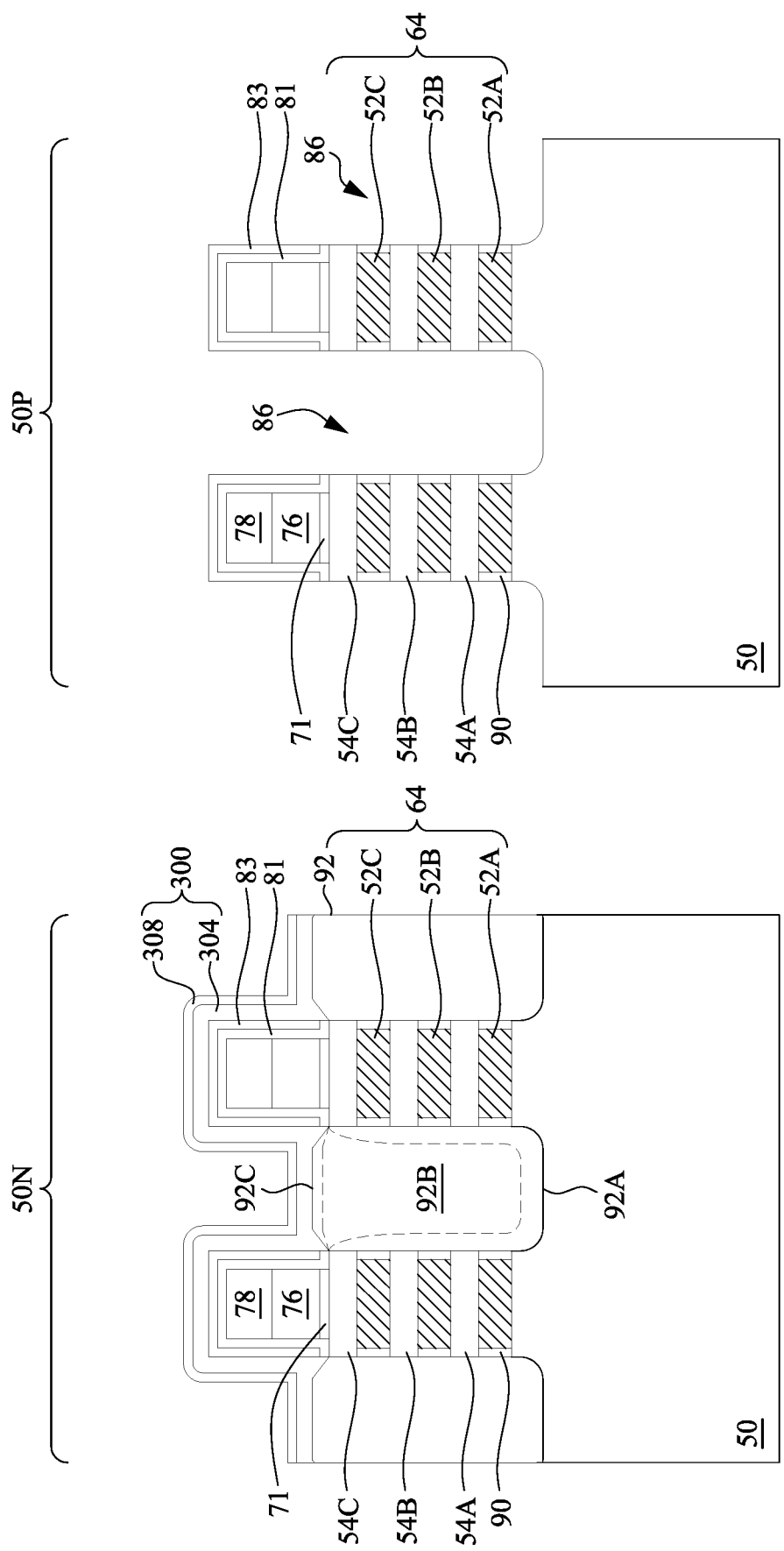
Figure 18C:
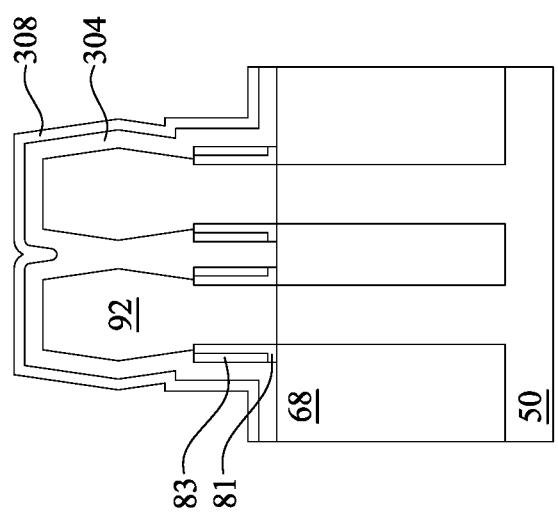
Figure 19A:
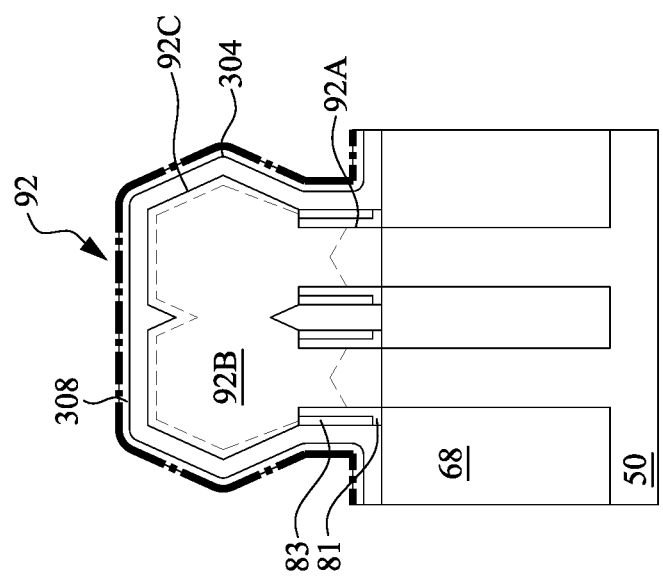
Figure 19B:
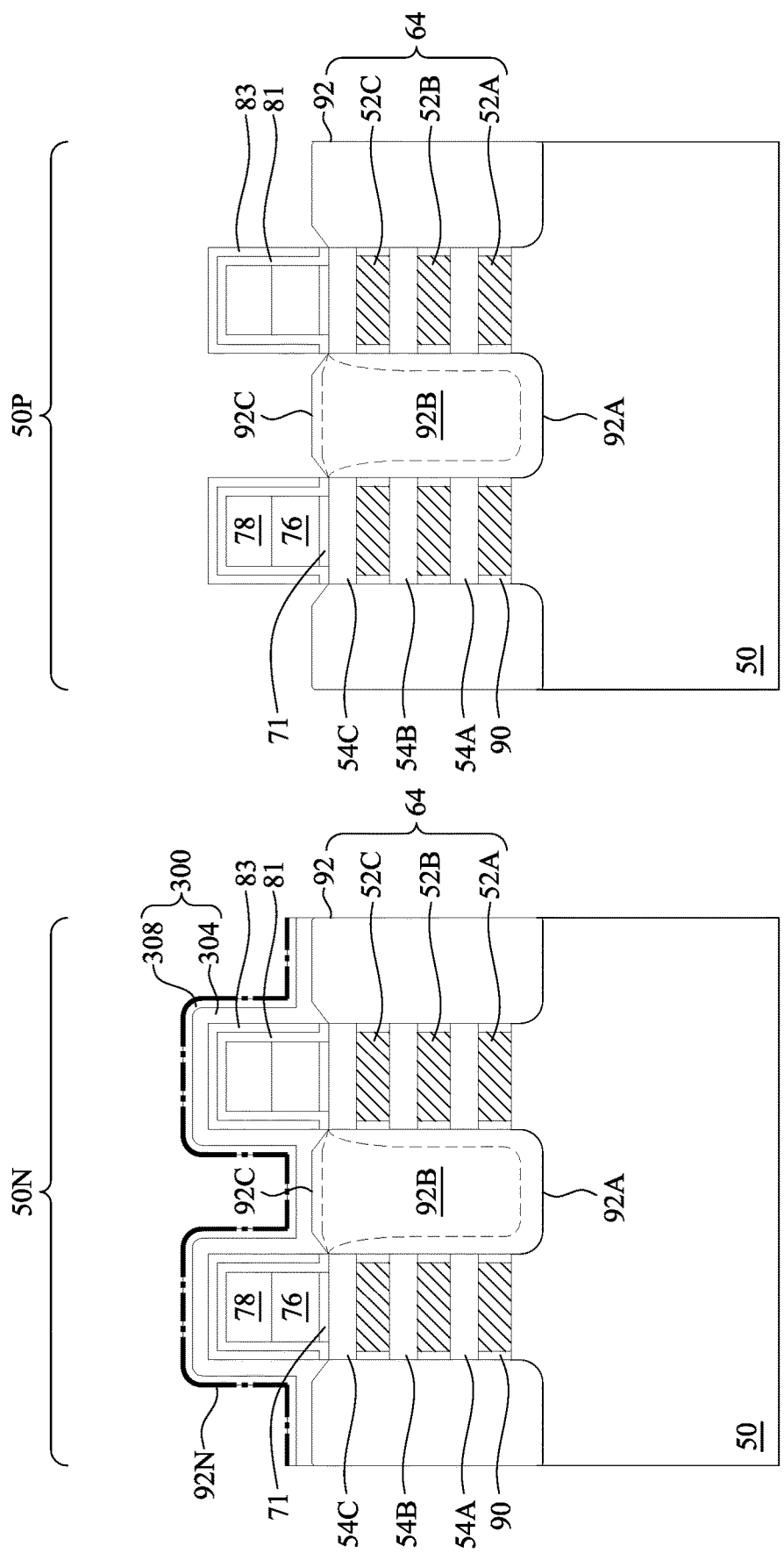
Figure 19C:
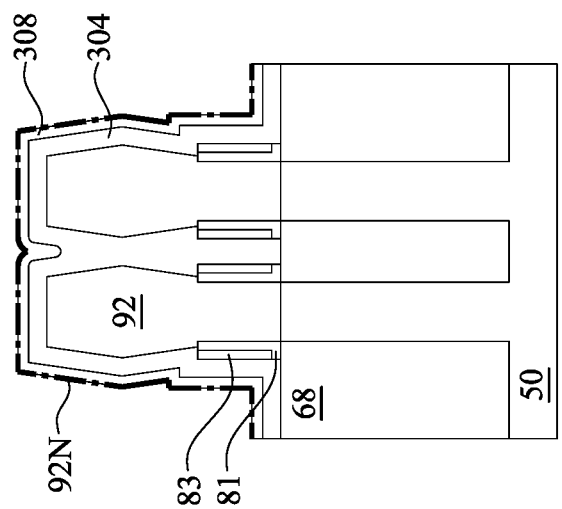

As discussed in greater detail below, in FIGS. 12A-14B, a multilayer p-masking layer 200 is formed over the structure and patterned to remain over the p-type region 50P. In FIGS. 15A-15C, the epitaxial source/drain regions 92 are grown predominantly in the n-type region 50N. In FIGS. 16A-18C, the multilayer p-masking layer 200 is removed, and a multilayer n-masking layer 300 is formed over the structure and patterned to remain over the n-type region 50N. In FIGS. 19A-19C, the epitaxial source/drain regions 92 are grown predominantly in the p-type region 50P.

Figure 12A:
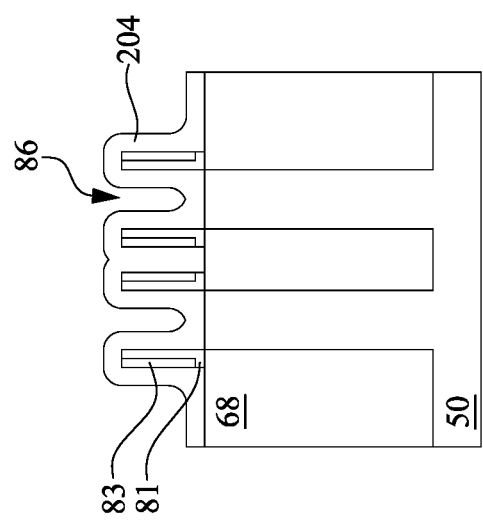
Figure 12B:
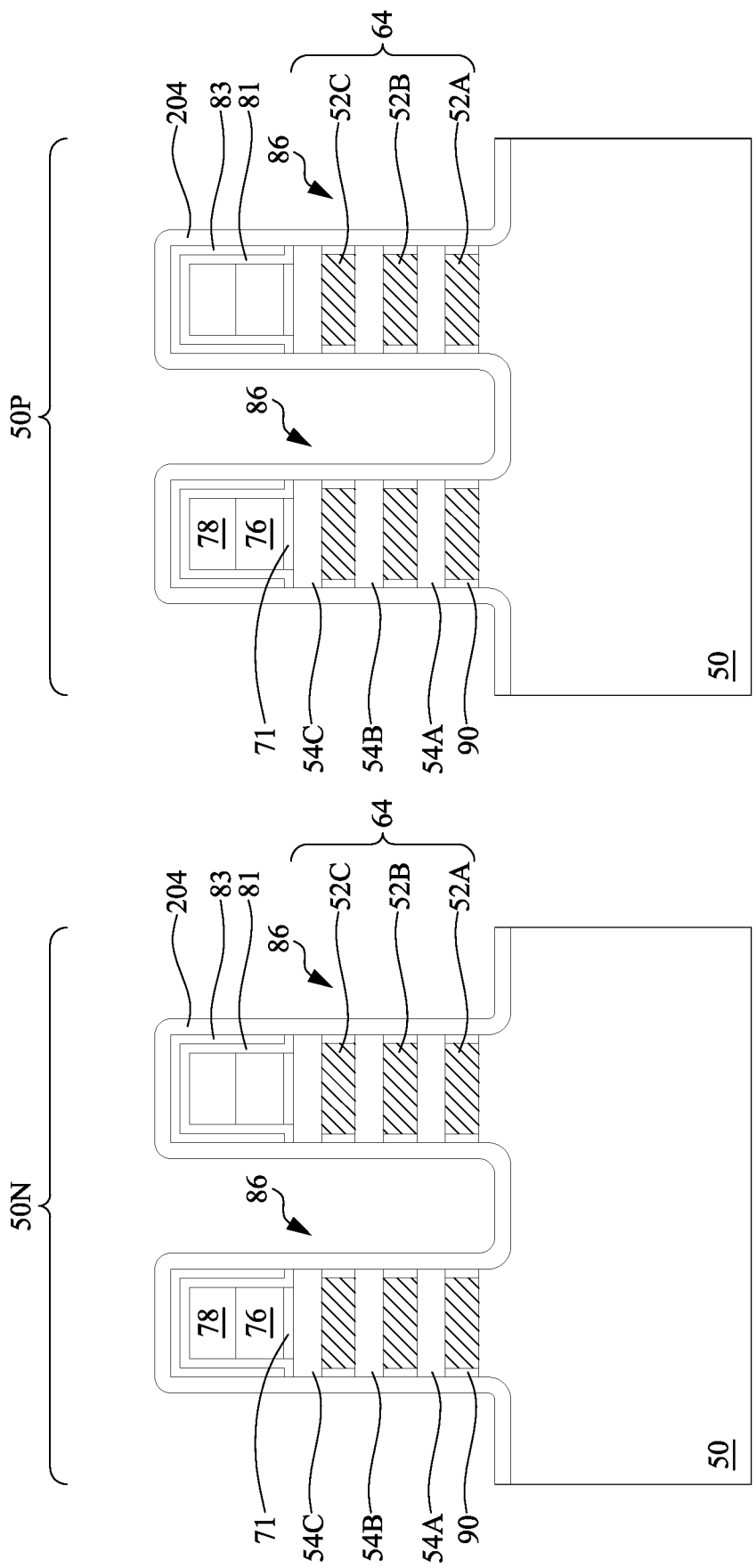

Referring to FIGS. 12A-12B, a first p-masking layer 204 is formed over the structure (e.g., the n-type region 50N and the p-type region 50P). The first p-masking layer 204 will protect the p-type region 50P during formation of n-type epitaxial source/drain regions 92 in the first recesses 86 of the n-type region 50N (e.g., the NMOS region). The first p-masking layer 204 may be deposited by a conformal deposition process, such as ALD, CVD, epitaxial growth, lamination, or the like. The first p-masking layer 204 may comprise a material such as a metal oxide, including aluminum oxide ($Al_2O_3$), hafnium oxide ($HfO_x$), zirconium oxide ($ZrO_x$), titanium oxide ($TiO_x$), zinc oxide, silicon oxide, silicon oxynitride, silicon nitride, silicon carbide, or the like. Using a metal oxide as the first p-masking layer 204 allows for a thin first p-masking layer 204 (and a corresponding thin multilayer p-masking layer 200 as shown in subsequent figures), which advantageously protects substrates by providing full coverage even when features such as the first recesses 86 have very small critical dimensions. Following deposition, the first p-masking layer 204 may have a substantially smooth exposed surface and be substantially or entirely amorphous. For example, in some embodiments the first p-masking layer 204 may be deposited to a thickness $T_1$ (see FIG. 13C) of between about 0.1 nm and about 10 nm, with a density of between about 1.2 g/cm³ and about 4 g/cm³, and with a surface roughness of between about 0.05 nm and about 5 nm.

Figure 13A:
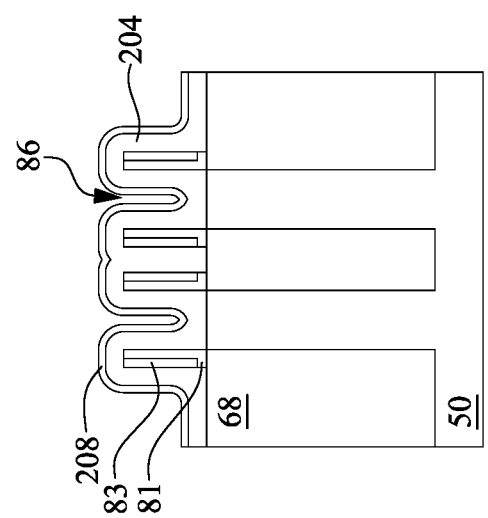
Figure 13B:
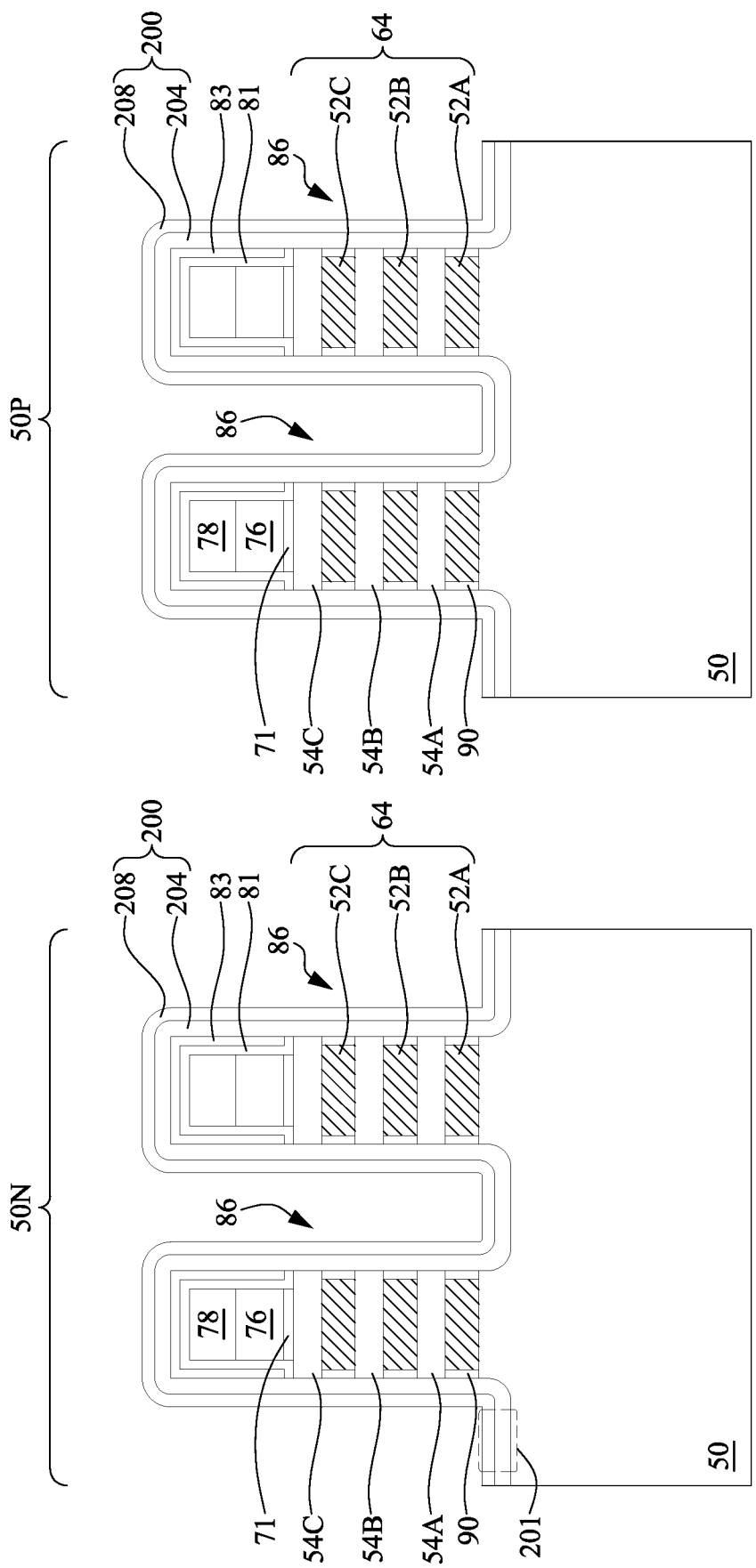
Figure 13C:
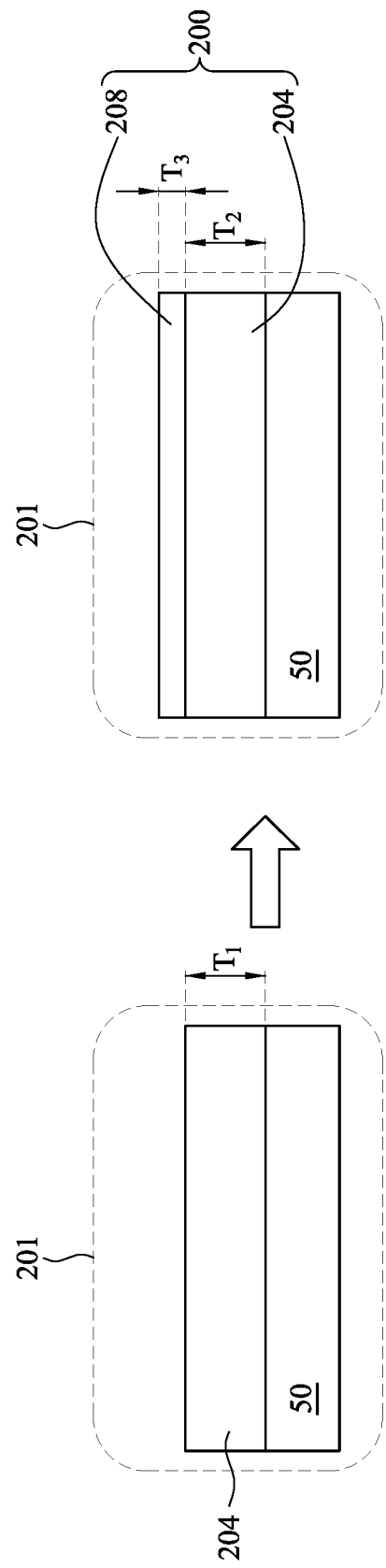

Referring to FIGS. 13A-13C, a second p-masking layer 208 is formed over the first p-masking layer 204 to collectively form the multilayer p-masking layer 200 as a laminate structure. The second p-masking layer 208 will further protect the p-type region 50P during formation of the n-type epitaxial source/drain regions 92 in the first recesses 86 of the n-type region 50N. The second p-masking layer 208 also provides an exposed surface that improves selectivity during epitaxial growth in subsequent steps (see FIGS. 15A-15C) because the epitaxial material grows less easily and in smaller nodules on the exposed surface of the second p-masking layer 208. Less growth of the epitaxy over the second p-masking layer 208 also allows for more efficient removal of the first p-masking layer 204 and the second p-masking layer 208 (see FIG. 16A-16C) following formation of the epitaxial source/drain regions 92 in the n-type region 50N.

The second p-masking layer 208 may be formed over the first p-masking layer 204 using CVD, ALD, lamination, epitaxial growth, or any suitable techniques for depositing the selected material. The second p-masking layer 208 may comprise silicon nitride, silicon oxide, silicon oxynitride, or the like. The second p-masking layer 208 may be formed to a thickness $T_2$ of between about 0.5 nm and about 10 nm.

In accordance with a particular embodiment, the second p-masking layer 208 may be deposited to form silicon nitride over the first p-masking layer 204. Silicon nitride ($SiN_x$) may be formed such that x is between about 0.8 and about 1.6. The precursor gases may include a silicon precursor, such as silane ($SiH_4$), dichlorosilane ($SiH_2Cl_2$), $SiH_2I_2$, $SiCl_4$, or the like, and a nitrogen precursor, such as nitrogen ($N_2$), ammonia ($NH_3$), any combinations and plasmas thereof, or the like. For example, the silicon precursor may be flowed at a flowrate of between about 20 sccm and about woo sccm, and the nitrogen precursor may be flowed at a flowrate of between about 20 sccm and about 2 SLM (standard liters per minute). The deposition may be performed at a temperature of between about 50° C. and about 650° C. and at a pressure of between about 0.5 Torr and about w Torr.

In other embodiments, the second p-masking layer 208 may be deposited to form silicon oxynitride over the first p-masking layer 204. Silicon oxynitride ($SiO_xN_y$) may be formed such that x is between about 0.8 and about 2 and y is between about 0.8 and about 1.6. The precursor gases may include a silicon precursor, such as silane ($SiH_4$), dichlorosilane ($SiH_2Cl_2$), $SiH_2I_2$, $SiCl_4$, or the like, an oxygen precursor, such as oxygen ($O_2$), ozone ($O_3$), hydrogen peroxide ($H_2O_2$), any combinations and plasmas thereof, or the like, and a nitrogen precursor, such as nitrogen ($N_2$), ammonia ($NH_3$), any combinations and plasmas thereof, or the like. For example, the silicon precursor may be flowed at a flowrate of between about 20 sccm and about woo sccm, the oxygen precursor may be flowed at a flowrate of between about 20 sccm and about 2 SLM, and the nitrogen precursor may be flowed at a flowrate of between about 20 sccm and about 2 SLM. The deposition may be performed at a temperature of between about 50° C. and about 650° C. and at a pressure of between about 0.5 Torr and about w Torr.

Alternatively, the second p-masking layer 208 may be deposited to form silicon oxide over the first p-masking layer 204. Silicon oxide ($SiO_x$) may be formed such that x is between about 0.8 and about 2. The precursor gases may include a silicon precursor, such as silane ($SiH_4$), dichlorosilane ($SiH_2Cl_2$), $SiH_2I_2$, $SiCl_4$, or the like, and an oxygen precursor, such as oxygen ($O_2$), ozone ($O_3$), hydrogen peroxide ($H_2O_2$), any combinations and plasmas thereof, or the like. For example, the silicon precursor may be flowed at a flowrate of between about 20 sccm and about woo sccm, and the oxygen precursor may be flowed at a flowrate of between about 20 sccm and about 2 SLM. The deposition may be performed at a temperature of between about 50° C. and about 650° C. and at a pressure of between about 0.5 Torr and about w Torr.

Note that the deposition of the second p-masking layer 208 may be calibrated to form a very thin layer, such as a monolayer, of silicon nitride. For example, using a CVD process, the process may be completed in a short duration and/or with low flowrates for the precursors. For example, the CVD process may occur for between about 1 second and about 120 seconds. In addition, the silicon precursor may be flowed at a flowrate of between about 20 sccm and about woo sccm, and the nitrogen precursor may be flowed at a flowrate of between about 20 sccm and about 2 SLM. Alternatively, using an ALD process, the process may be completed with only one pulse of each of the precursors. In either case, the formation of the second p-masking layer 208 may be described as a surface treatment, such as a silicon nitride surface treatment, of the first p-masking layer.

Figure 14A:
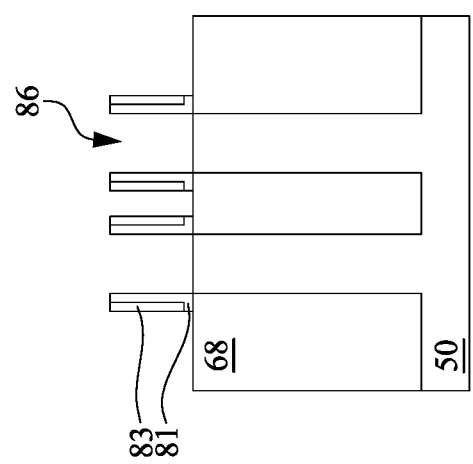
Figure 14B:
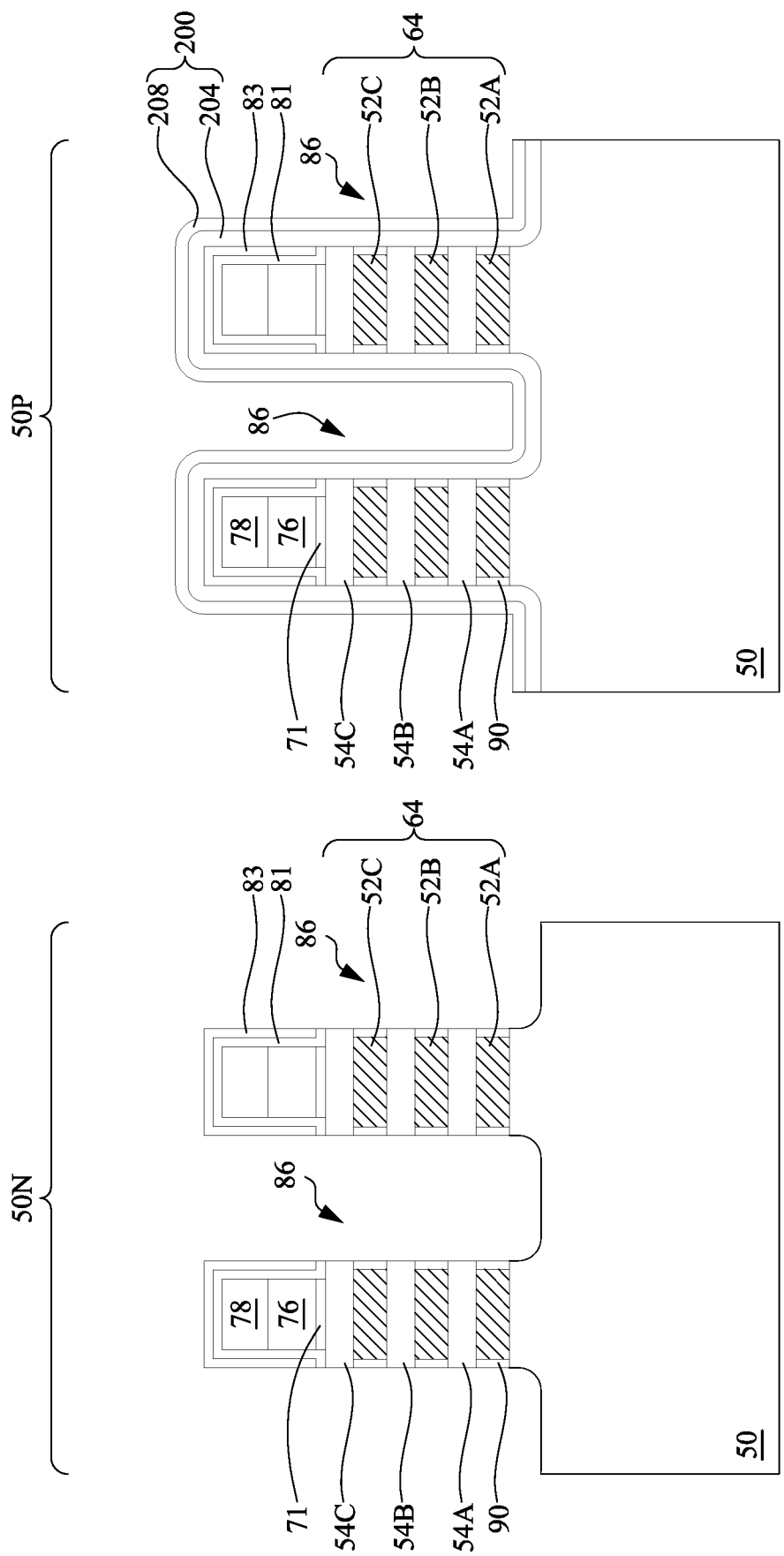
Figure 15A:
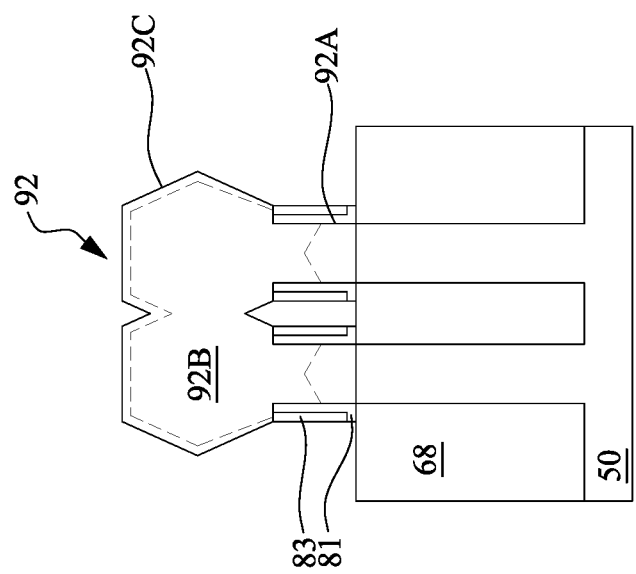
Figure 15B:
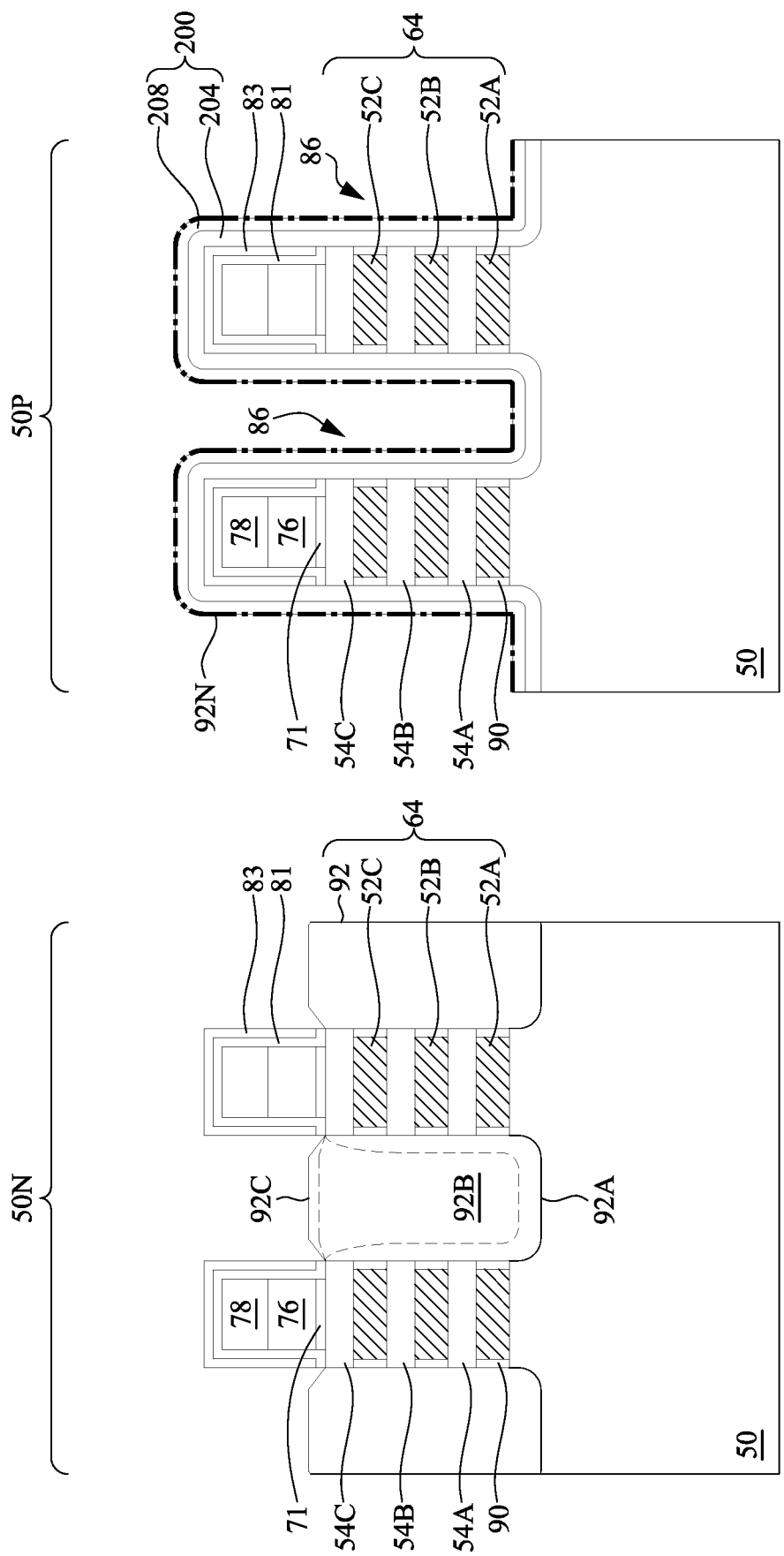
Figure 15C:
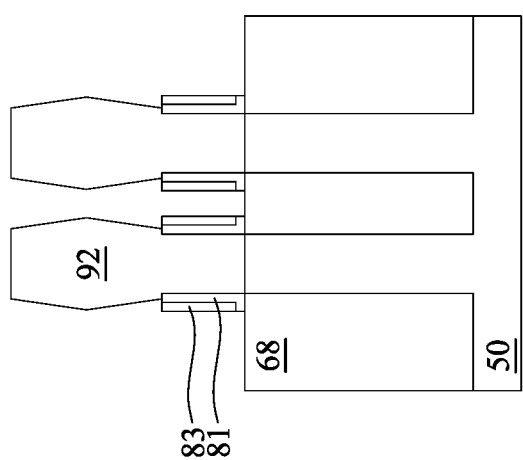

Referring to FIGS. 14A-14B, after formation of the second p-masking layer 208, the multilayer p-masking layer 200 is removed from the n-type region 50N. A photoresist (not specifically illustrated), such as a hardmask, may be formed over the multilayer p-masking layer 200 and patterned to expose the multilayer p-masking layer 200 in the n-type region 50N. The multilayer p-masking layer 200 may then be etched using a suitable etching process, such as an isotropic etching process (e.g., a wet etching process), an anisotropic etching process (e.g., a dry etching process), or the like. The photoresist may then be removed by a suitable process, such as an isotropic etching process or an anisotropic etching process. In other embodiments, the multilayer p-masking layer 200 is removed in the n-type region 50N by one of the above processes without first forming the photoresist over the multilayer p-masking layer 200.

Referring to FIGS. 15A-15C, the epitaxial source/drain regions 92 are epitaxially grown in the first recesses 86 in the n-type region 50N, and nodules 92N of epitaxial material may form over the multilayer p-masking layer 200 (e.g., over the second p-masking layer 208). The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

As stated above, nodules 92N (e.g., small amounts of the epitaxy) may grow over the second p-masking layer 208. However, the chemical composition and/or roughness of the exposed surface of the second p-masking layer 208 reduces the number and size of the nodules 92N that may otherwise form, such as directly over the first p-masking layer 204. The reduced number and size of the nodules 92N allows for greater control of the formation of the epitaxial source/drain regions 92 and improves removal of the multilayer p-masking layer 200 (and nodules 92N) in subsequent steps discussed in greater detail below. As illustrated, each of the epitaxial source/drain regions 92 forms to become one continuous material, while the nodules 92N form as discontinuous clusters or nodules.

The epitaxial source/drain regions 92, the first nanostructures 52, the second nanostructures 54, and/or the substrate 50 may be implanted with dopants to form source/drain regions, similarly to the processes previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type impurities for source/drain regions may be any of the impurities previously discussed. The n-type impurities may be implanted while the multilayer p-masking layer 200 remains protecting the p-type region 50P. In some embodiments, the epitaxial source/drain regions 92 may be in situ doped during growth.

As a result of the epitaxy processes used to form the epitaxial source/drain regions 92, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 15A. In other embodiments, adjacent epitaxial source/drain regions 92 remain separated after the epitaxy process is completed as illustrated by FIG. 15C. In the embodiments illustrated in FIGS. 15A and 15C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

In FIGS. 16A-19C, the multilayer p-masking layer 200 and the nodules 92N may be removed from the p-type region 50P, and the epitaxial source/drain regions 92 in the p-type region 50P (e.g., the PMOS region) may be formed in a similar way as described above in connection with the epitaxial source/drain regions 92 in the n-type region 50N.

Figure 16A:
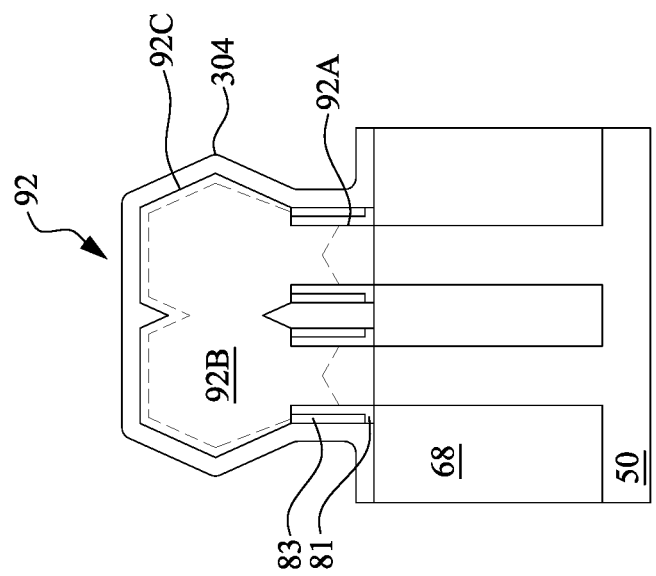
Figure 16B:
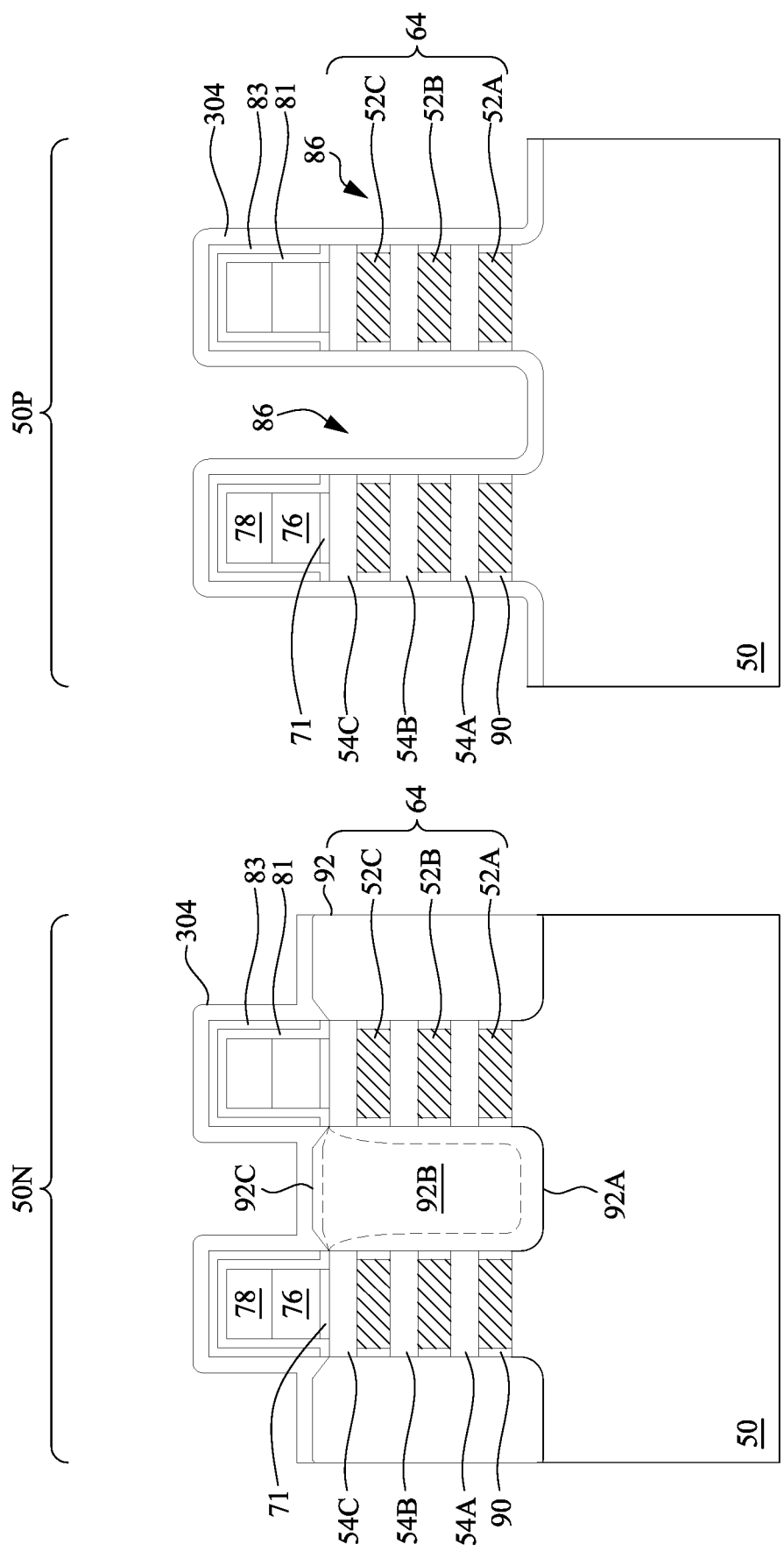
Figure 16C:
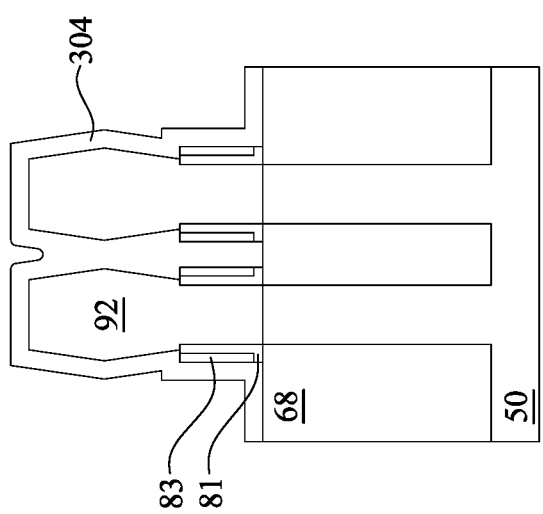
Figure 17A:
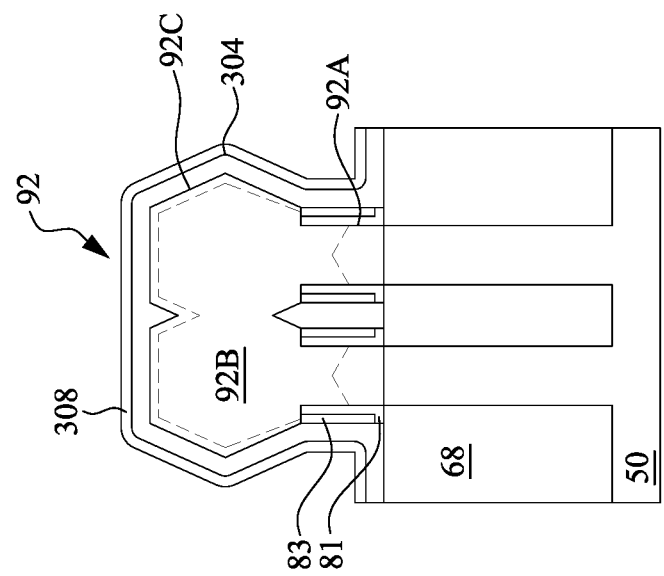
Figure 17B:
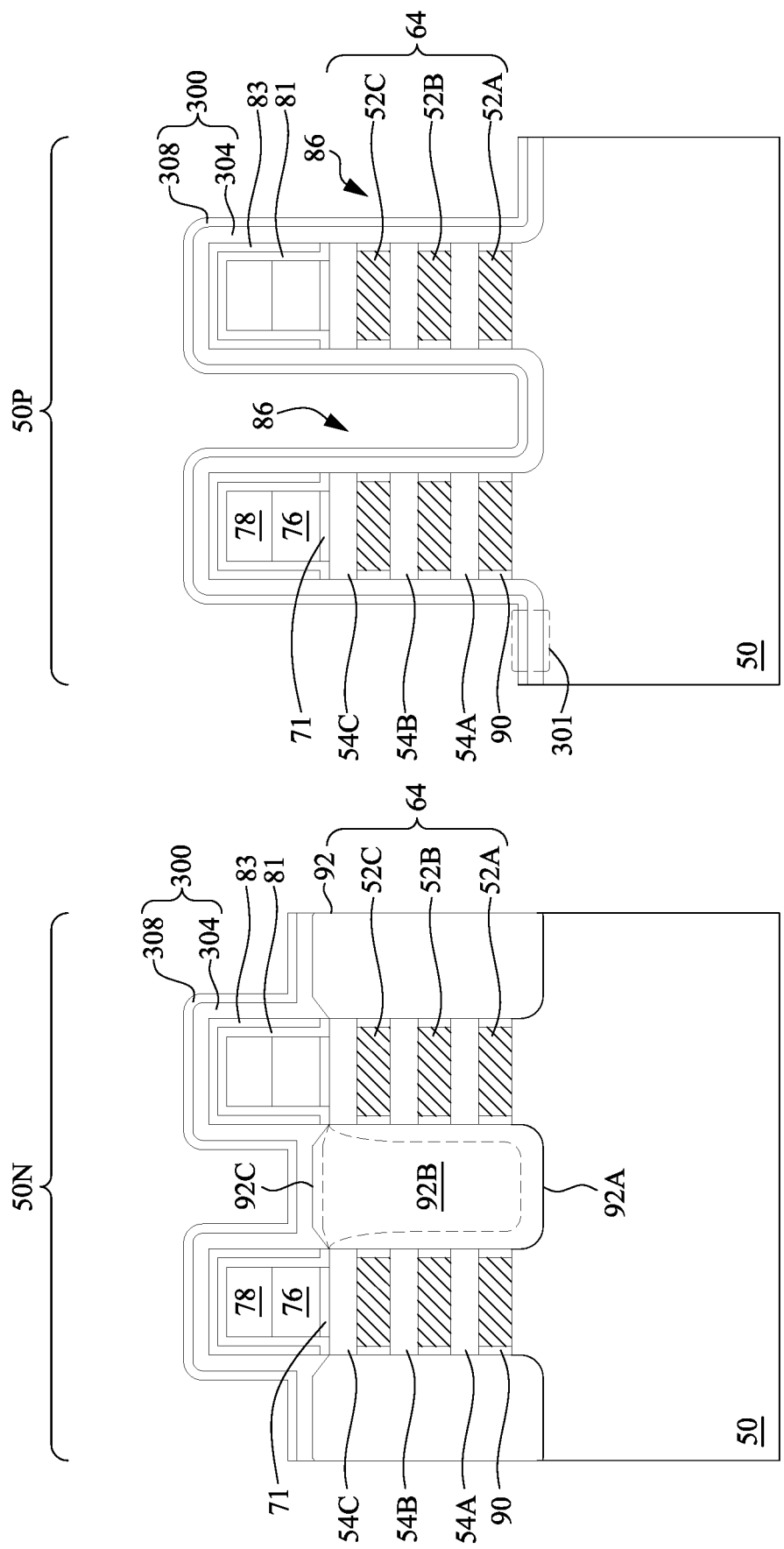
Figure 17C:
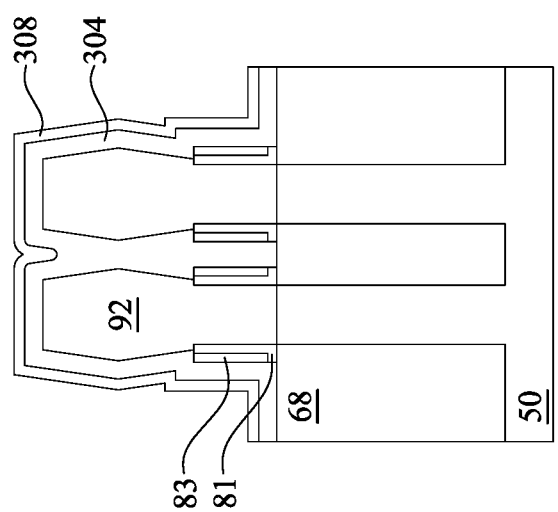
Figure 17D:
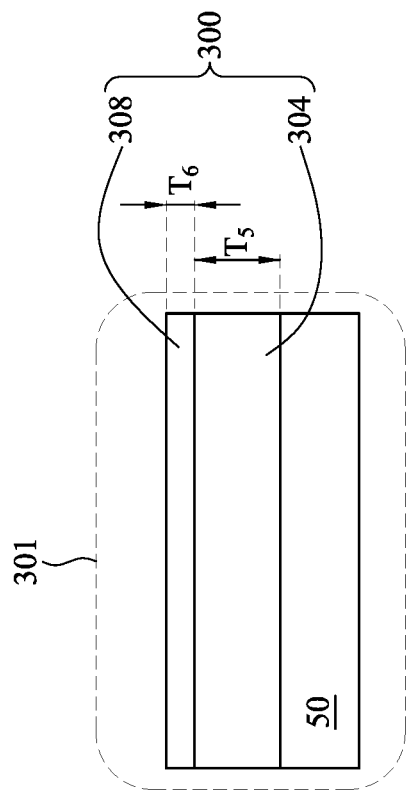
Figure 17D:
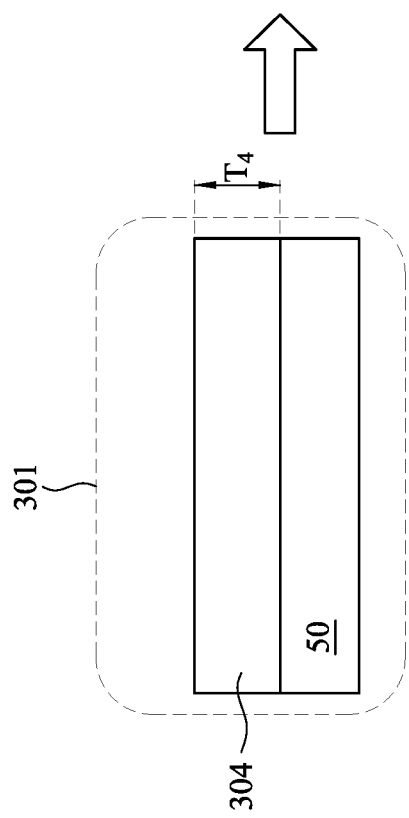

Referring to FIGS. 16A-16C, the multilayer p-masking layer 200 and the nodules 92N may be removed from the p-type region 50P. For example, the multilayer p-masking layer 200 and the nodules 92N may be removed using a wet or dry etch with etchants such as sulfuric acid ($H_2SO_4$), hydrogen fluoride (HF), hydrogen chloride (HCl), ammonia ($NH_3+H_2O$), the like, any combinations thereof, or any suitable etchants. The reduced size and number of the nodules 92N (due to the exposed surface of the second p-masking layer 208) improve the efficiency of removing the multilayer p-masking layer 200 and the nodules 92N by the above-described process.

A multilayer n-masking layer 300 may then be formed over the structure (e.g., the n-type region 50N and the p-type region 50P). The multilayer n-masking layer 300 protects the n-type region 50N during formation of p-type epitaxial source/drain regions 92 in the first recesses 86 of the p-type region 50P (e.g., the PMOS region). The multilayer n-masking layer 300 may be formed using any of the same methods and materials and with the same specifications discussed above for the multilayer p-masking layer 200.

Still referring to FIGS. 16A-16C, a first n-masking layer 304 of the multilayer n-masking layer 300 may be formed using any of the methods and materials and to any of the specifications discussed above for the first p-masking layer 204 in connection with FIGS. 12A-12B to achieve any of the same or similar advantages. Referring to FIGS. 17A-17D, a second n-masking layer 308 may be formed over the first n-masking layer 304 using any of the methods and materials and to any of the specifications discussed above for the second p-masking layer 208 in connection with FIGS. 13A-13C to achieve any of the same or similar advantages. Referring to FIGS. 18A-18C, after formation of the second n-masking layer 308, the multilayer n-masking layer 300 may be removed from the p-type region 50P using any of the same methods and materials discussed above for removing the multilayer p-masking layer 200 in connection with FIGS. 14A-14B.

Referring to FIGS. 19A-19C, the epitaxial source/drain regions 92 are epitaxially grown in the first recesses 86 in the p-type region 50P, and nodules 92N of epitaxial material may form over the multilayer n-masking layer 300 using any of the same methods and materials and to any of the same specifications discussed above for the epitaxial source/drain regions 92 in the first recesses 86 in the n-type region 50N and the nodules 92N of epitaxial material over the multilayer p-masking layer 200 in connection with FIGS. 15A-15C. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, germanium, germanium tin, or the like. The epitaxial source/drain regions 92 may also have surfaces raised from respective surfaces of the multi-layer stack 64 and may have facets.

Figure 20A:
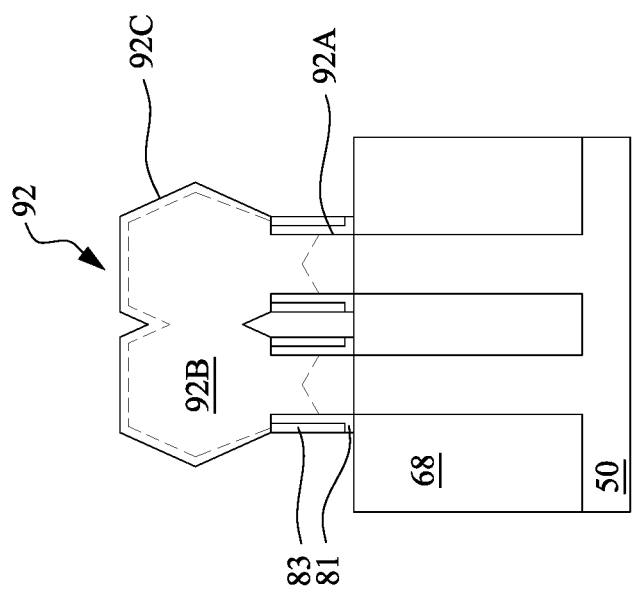
Figure 20B:
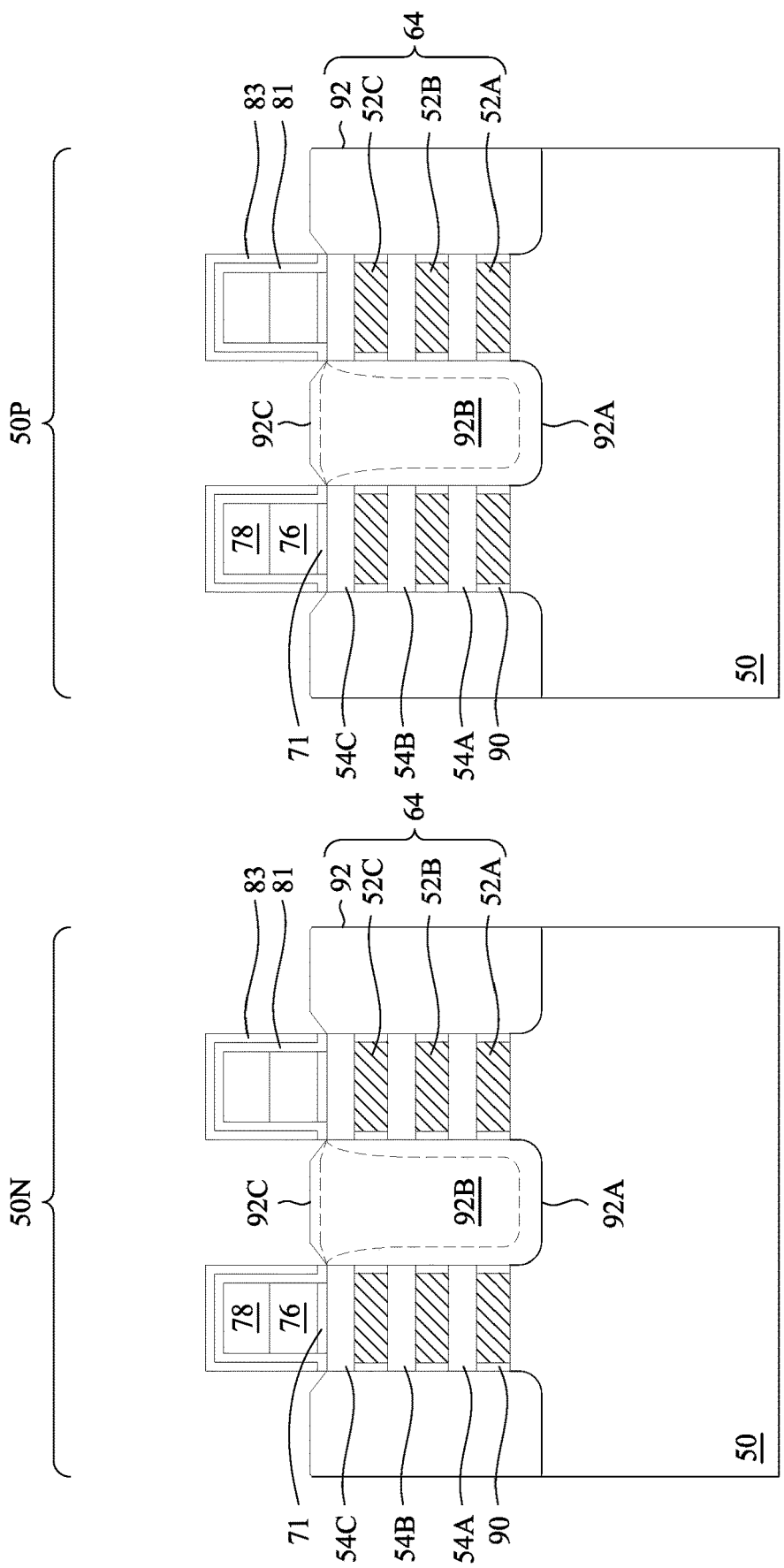
Figure 20C:
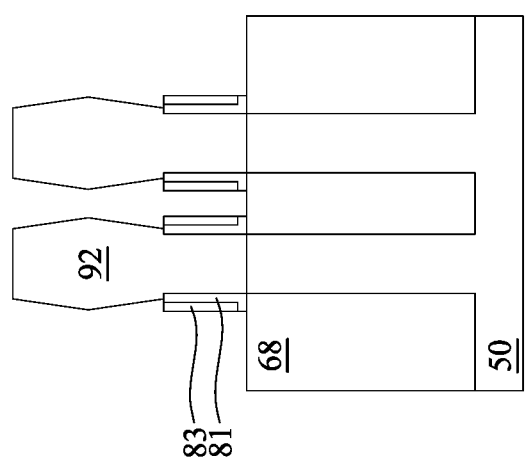

Referring to FIGS. 20A-20D, the multilayer n-masking layer 300 and the nodules 92N may be removed from the n-type region 50N. For example, the multilayer n-masking layer 300 and the nodules 92N may be removed using a wet or dry etch with etchants such as sulfuric acid ($H_2SO_4$), hydrogen fluoride (HF), hydrogen chloride (HCl), ammonia ($NH_3+H_2O$), the like, any combinations thereof, or any suitable etchants. The reduced size and number of the nodules 92N (due to the exposed surface of the second n-masking layer 308) improve the efficiency of removing the multilayer n-masking layer 300 and the nodules 92N by the above-described process. FIG. 20C illustrates an embodiment in which the epitaxial source/drain regions 92 remain separated after the epitaxy process is completed, for example, in the n-type region 50N in connection with FIG. 15C.

Figure 20D:
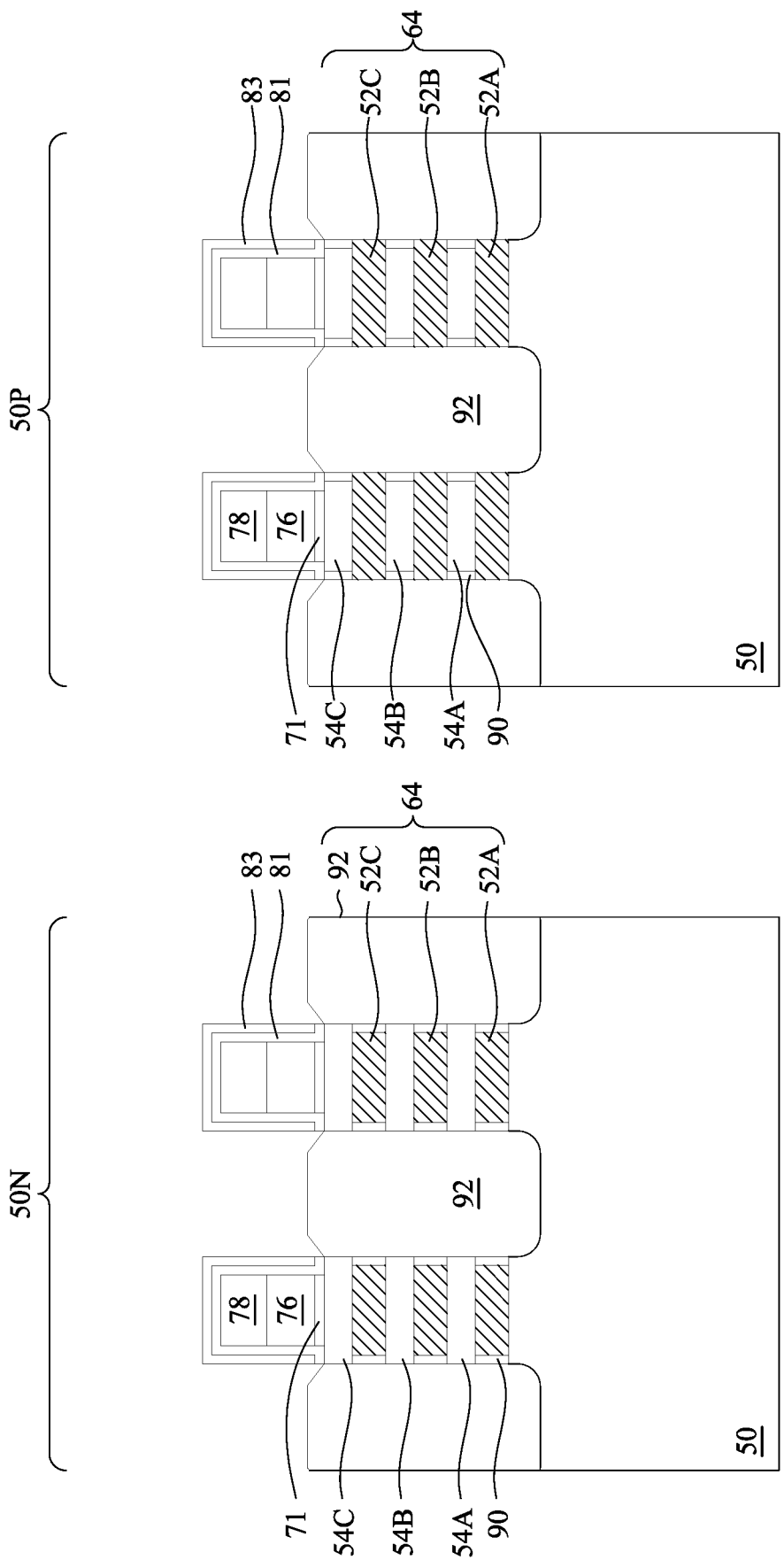

Referring to FIG. 20D, although the outer sidewalls of the first inner spacers 90 are illustrated as being straight in FIGS. 10B through 20B, the outer sidewalls of the first inner spacers 90 may be concave or convex. As an example, FIG. 20D illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. As illustrated in connection with the n-type region 50N, the epitaxial source/drain regions 92 may be formed in contact with the first inner spacers 90 and may extend past sidewalls of the second nanostructures 54. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. As illustrated in connection with the p-type region 50P, the epitaxial source/drain regions 92 may be formed in contact with the first inner spacers 90 and may extend past sidewalls of the second nanostructures 54.

Figure 21A:
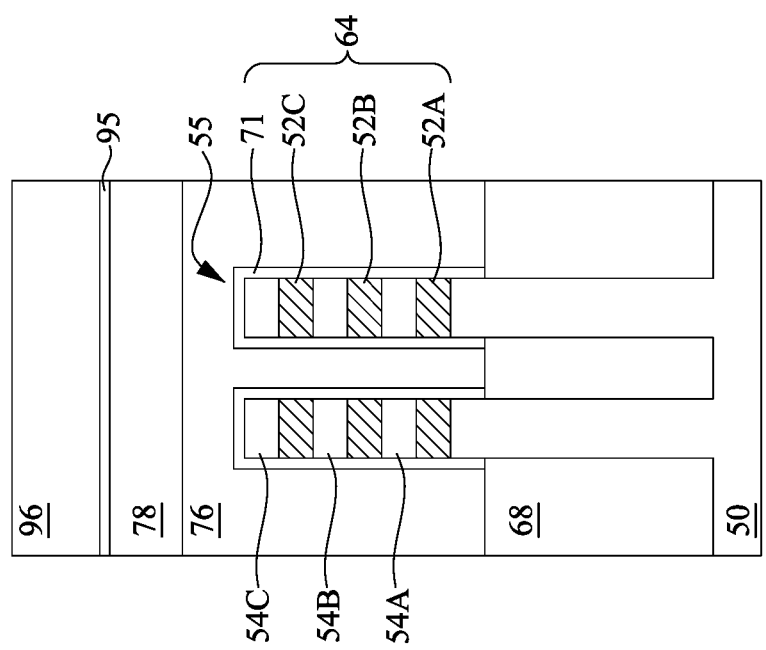
Figure 21B:
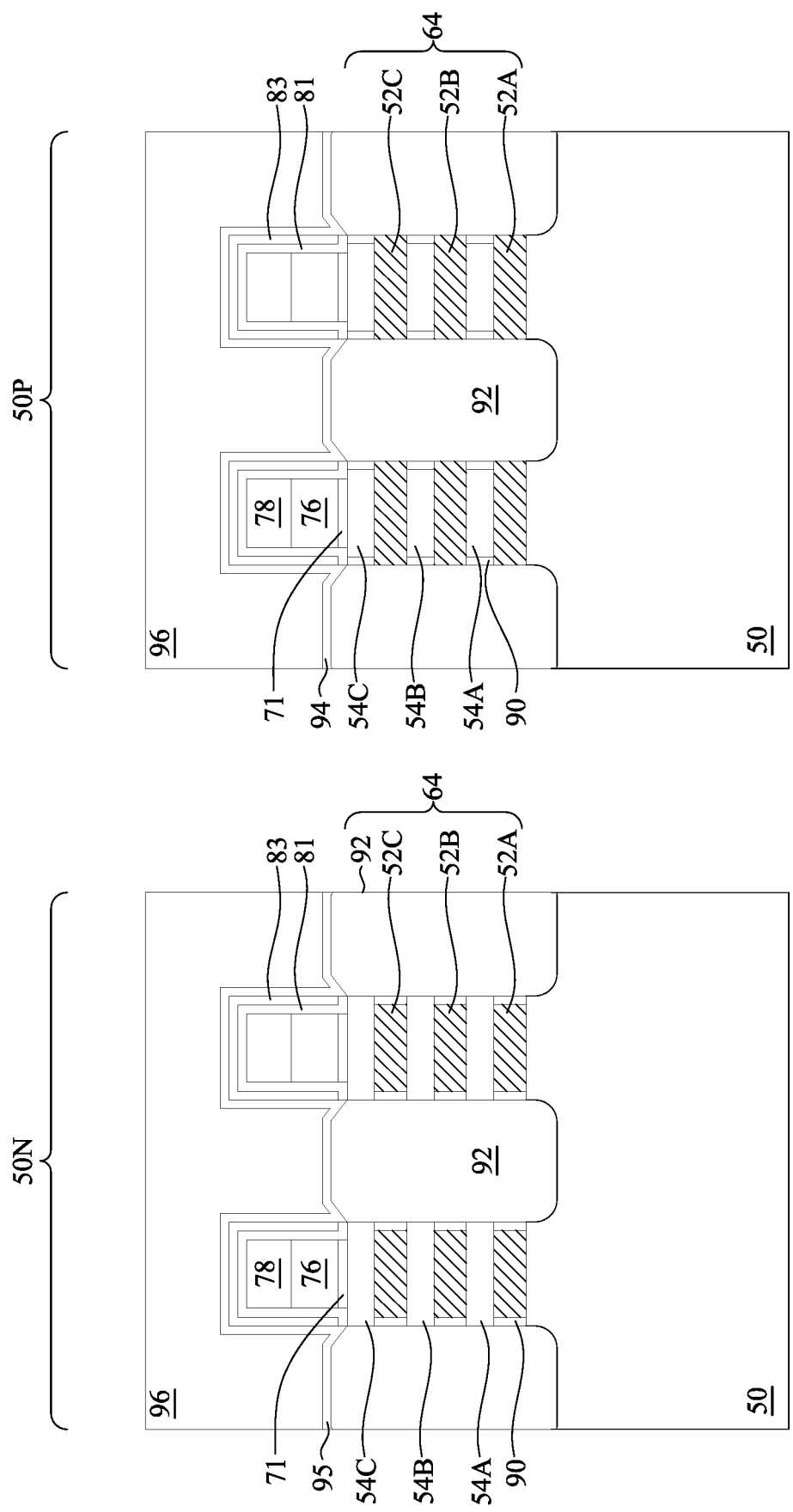
Figure 21C:
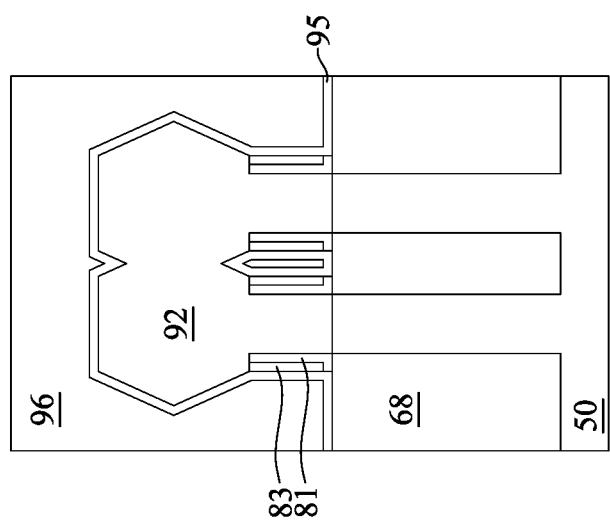

In FIGS. 21A-21C, a first interlayer dielectric (ILD) 96 is deposited over the structure illustrated in FIGS. 6A and 20A-20D (the processes of FIGS. 7A-20D do not alter the cross-section illustrated in FIG. 6A). The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 95 is disposed between the first ILD 96 and the epitaxial source/drain regions 92, the masks 78, and the first spacers 81. The CESL 95 may comprise a dielectric material, such as, silicon nitride, silicon oxide, silicon oxynitride, or the like, having a different etch rate than the material of the overlying first ILD 96.

Figure 22A:
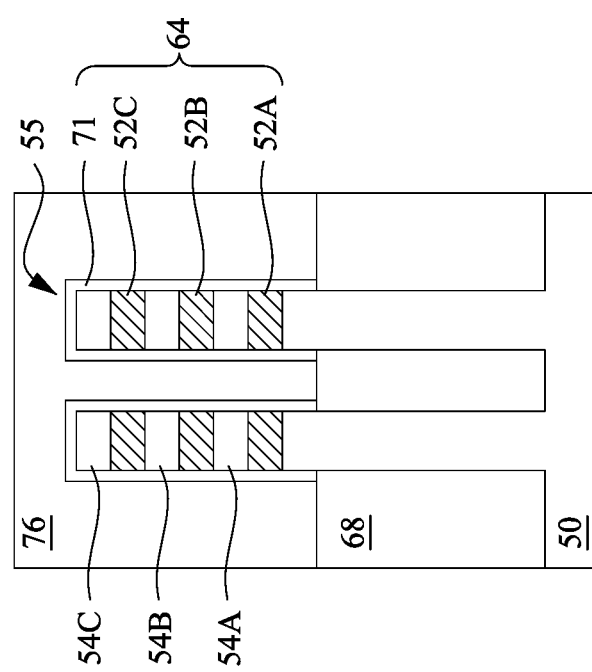
Figure 22B:
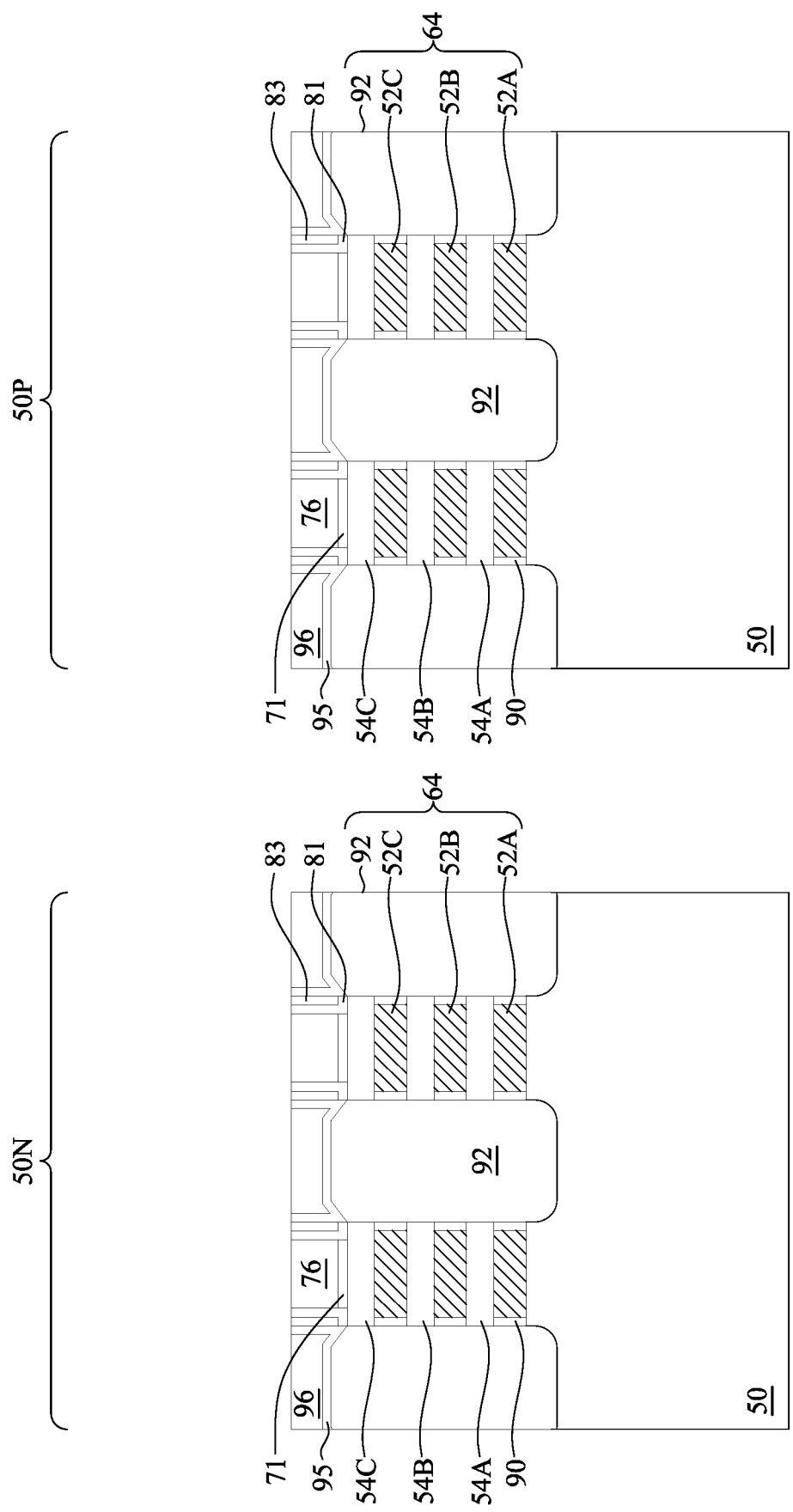

In FIGS. 22A-22B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 23A:
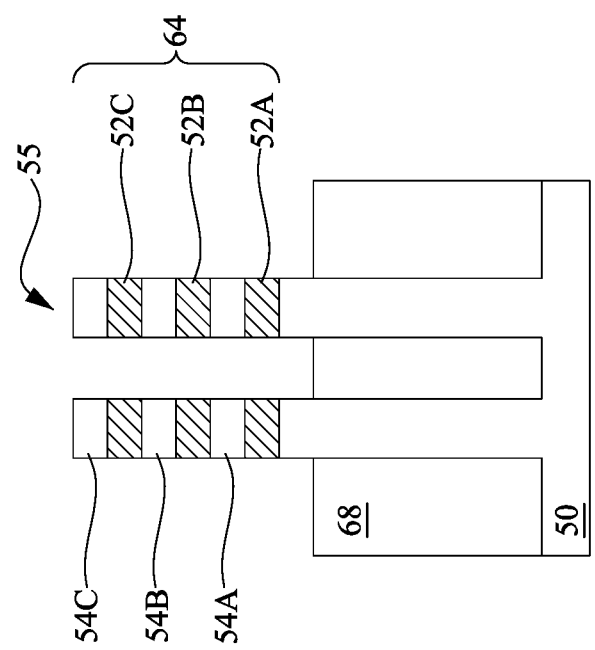
Figure 23B:
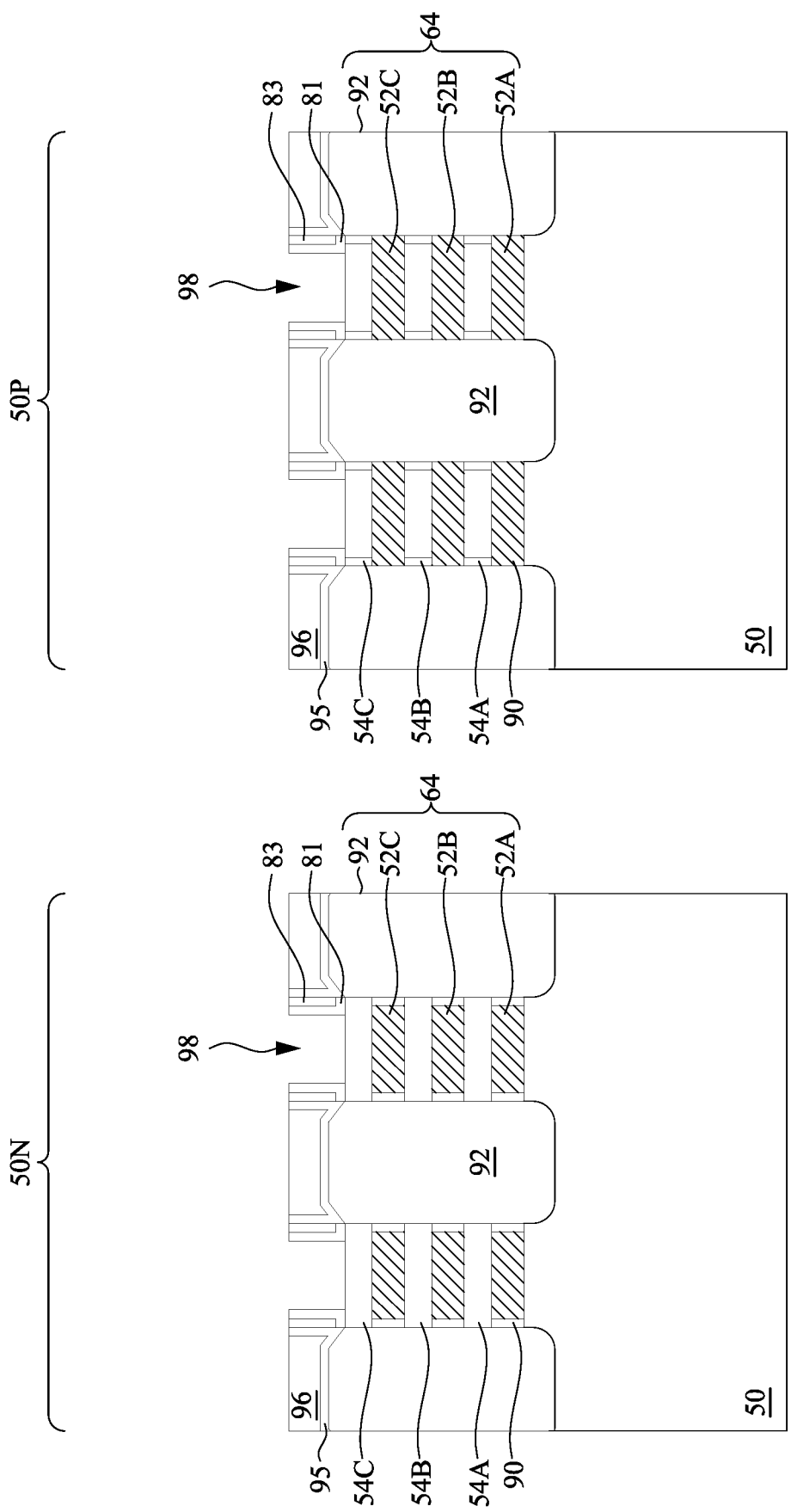

In FIGS. 23A and 23B, the dummy gates 76, and the masks 78 if present, are removed in one or more etching steps, so that second recesses 98 are formed. Portions of the dummy dielectric layers 71 in the second recesses 98 may also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Figure 24A:
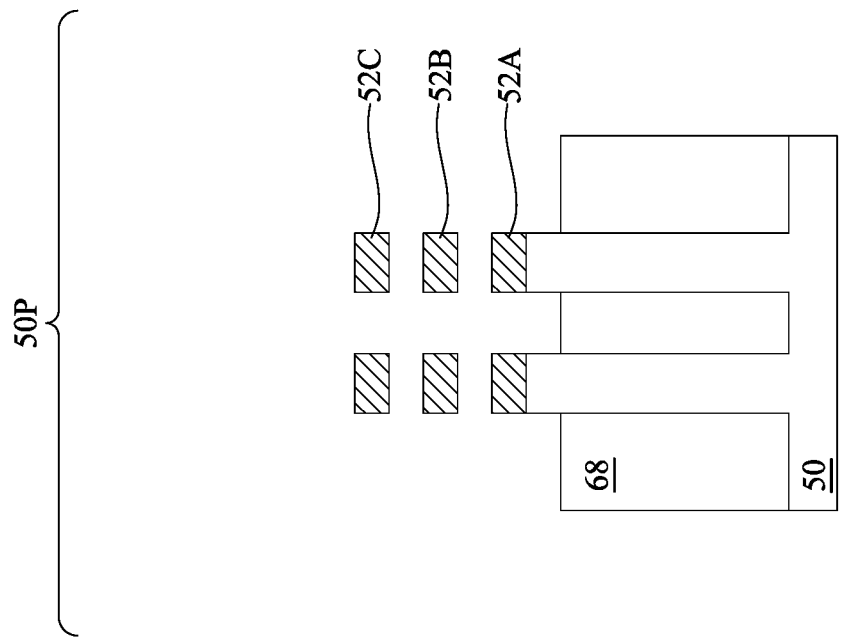
Figure 24A:
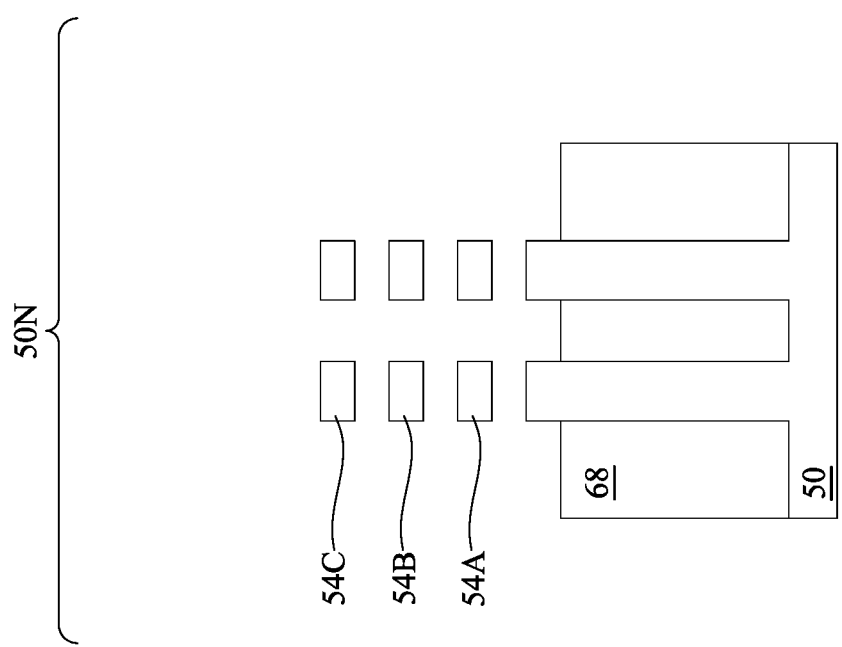
Figure 24B:
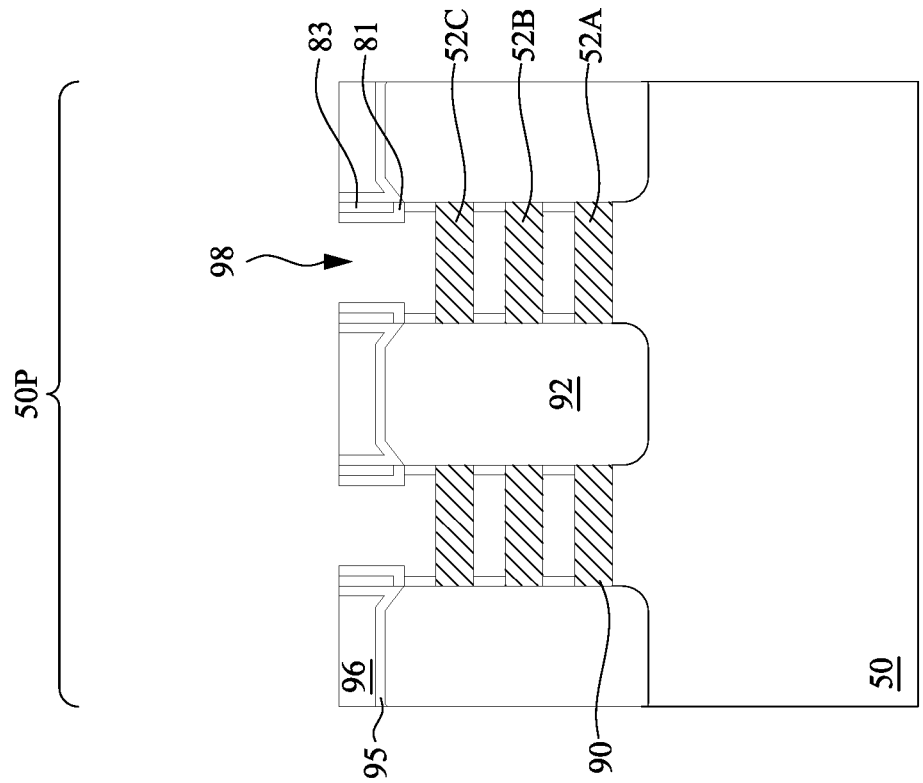
Figure 24B:
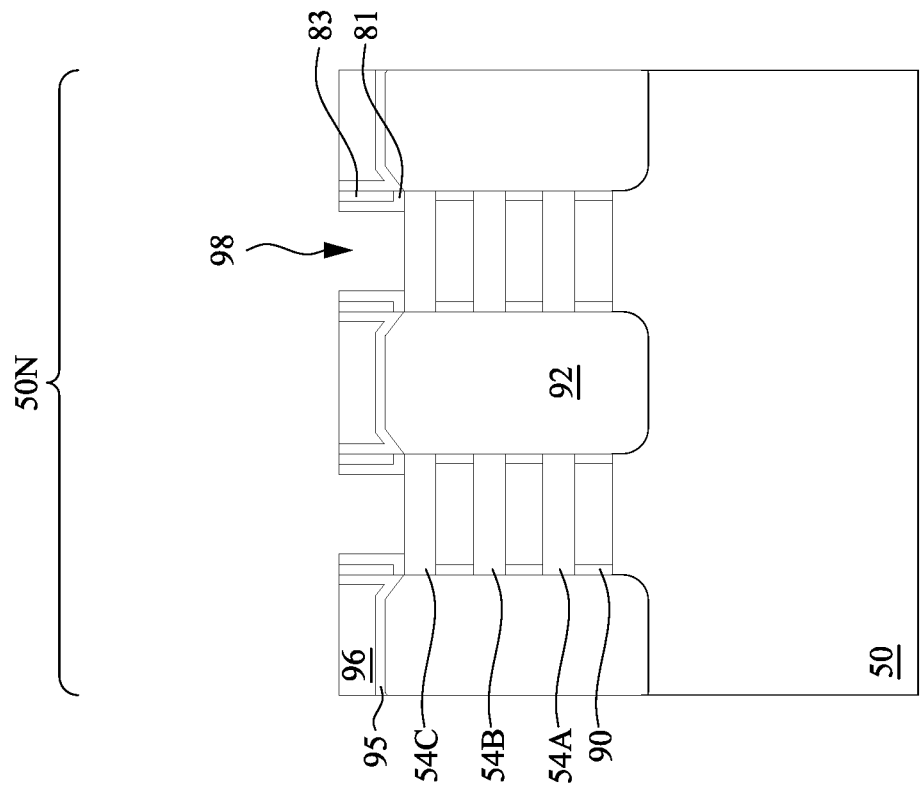

In FIGS. 24A and 24B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

Figure 25A:
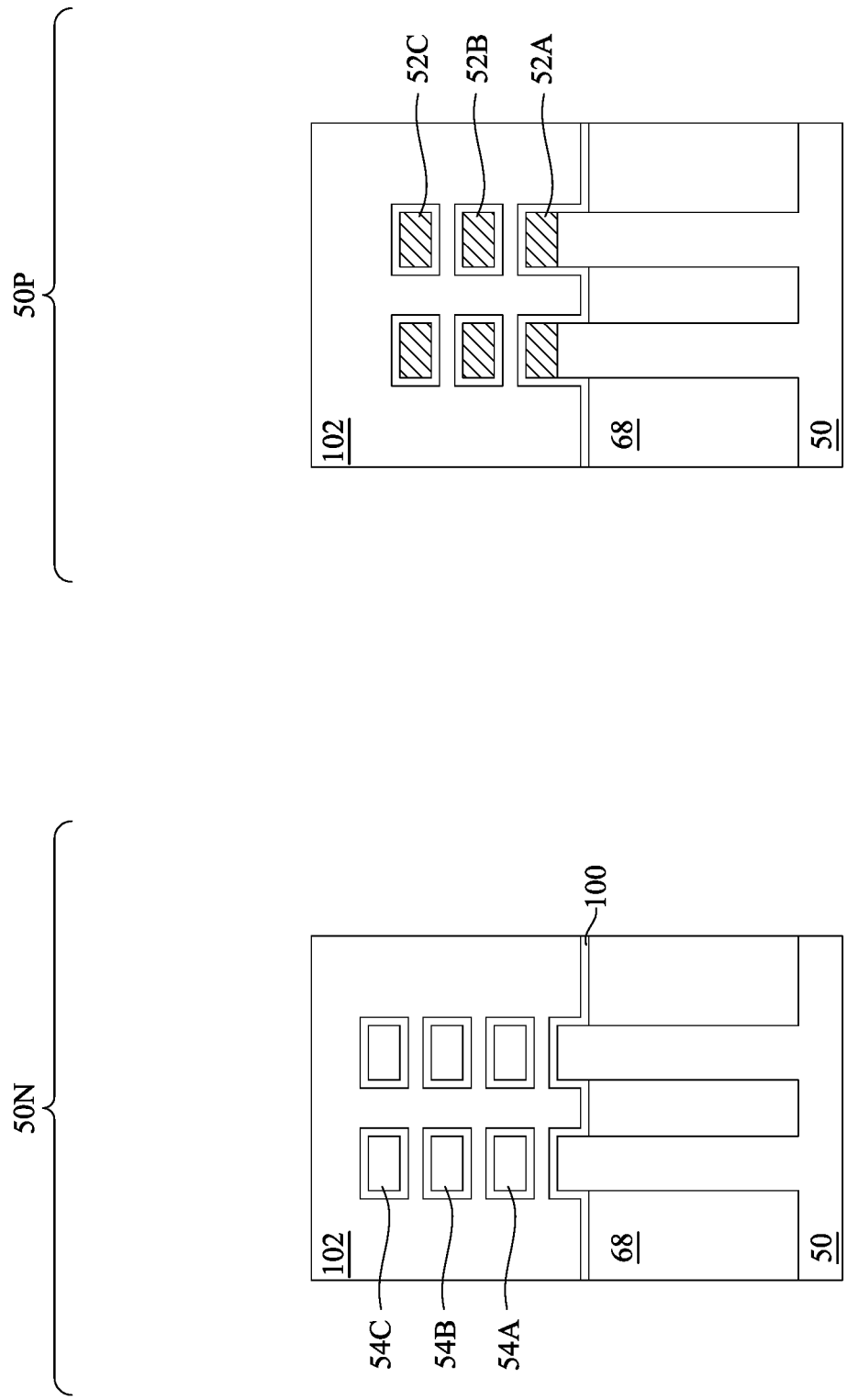
Figure 25B:
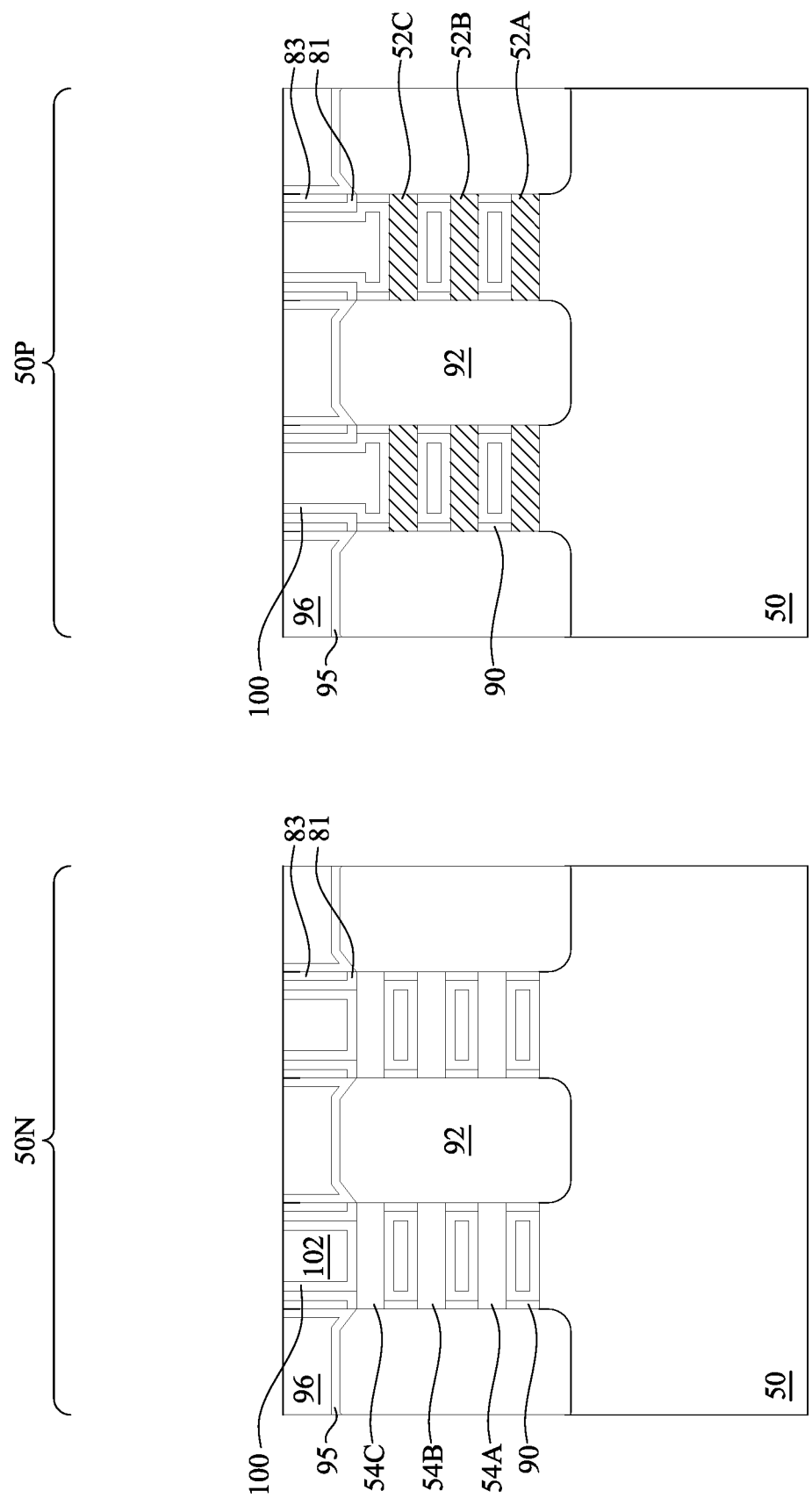

In FIGS. 25A and 25B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 95, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 25A and 25B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 26A:
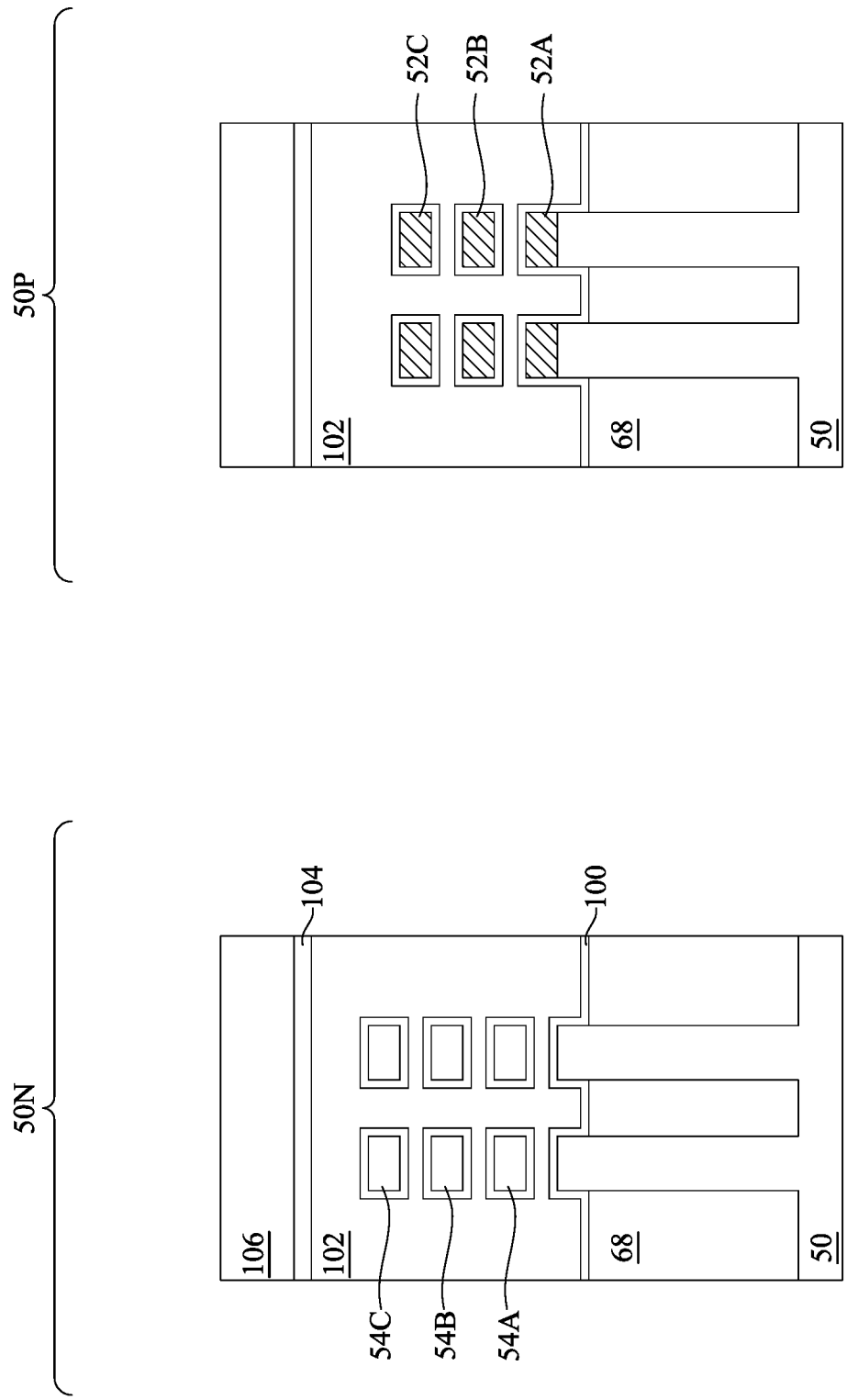
Figure 26B:
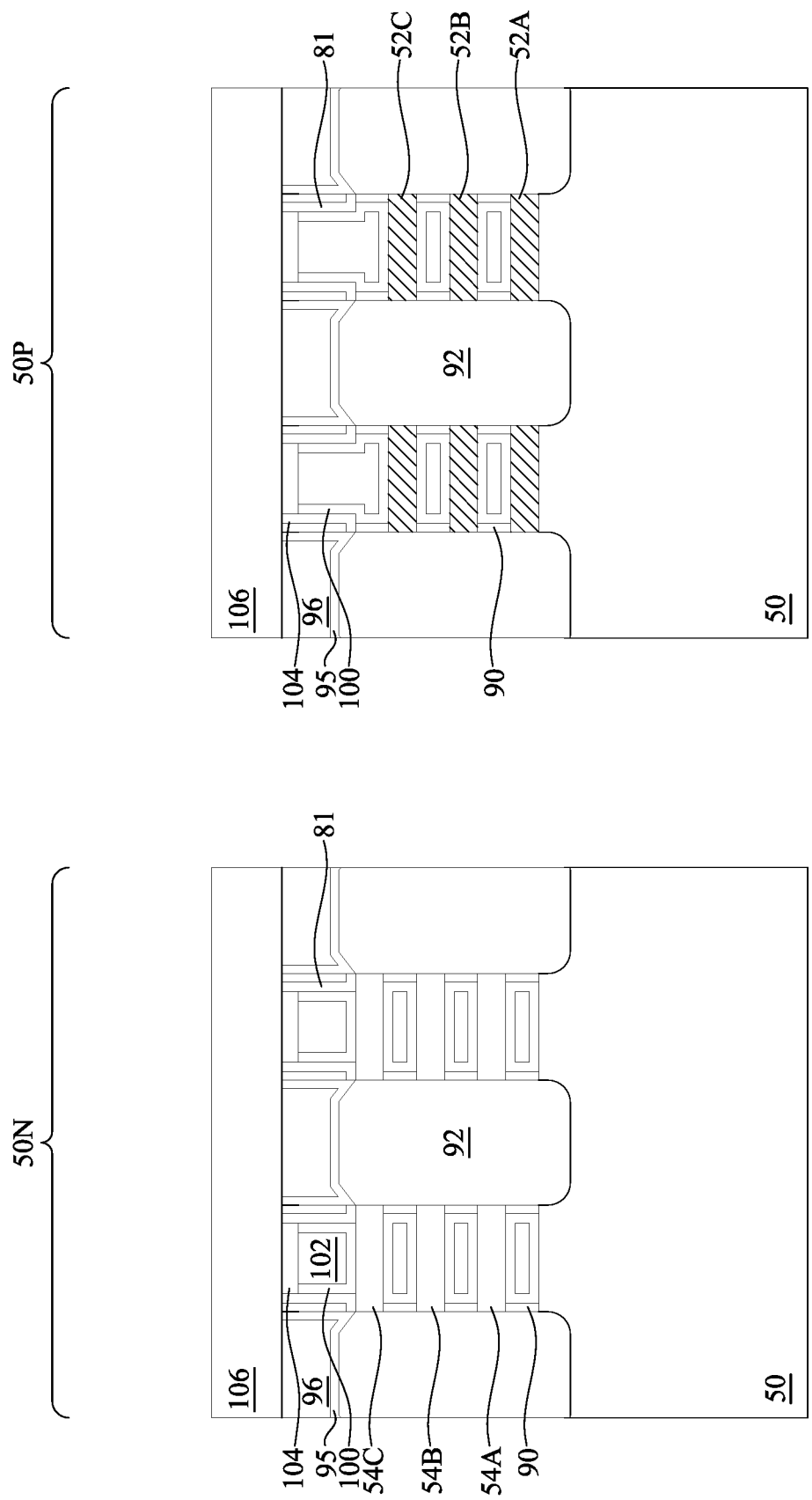
Figure 26C:
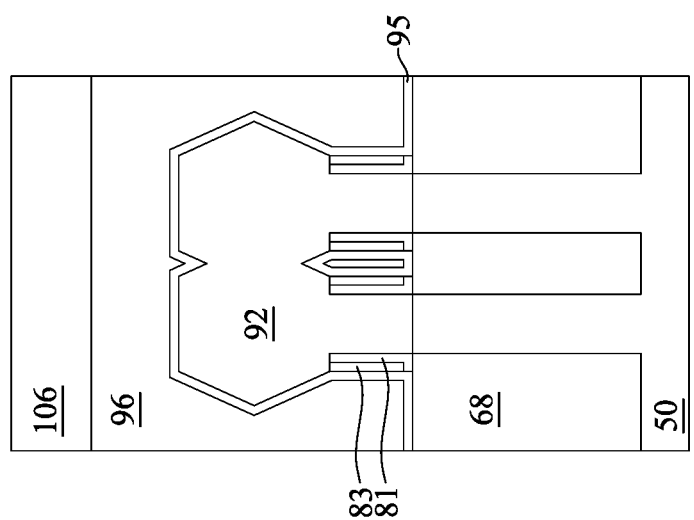

In FIGS. 26A-26C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 27A-28C) penetrate through the gate mask 104 to contact the top surface of the recessed gate electrodes 102.

As further illustrated by FIGS. 26A-26C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 27A:
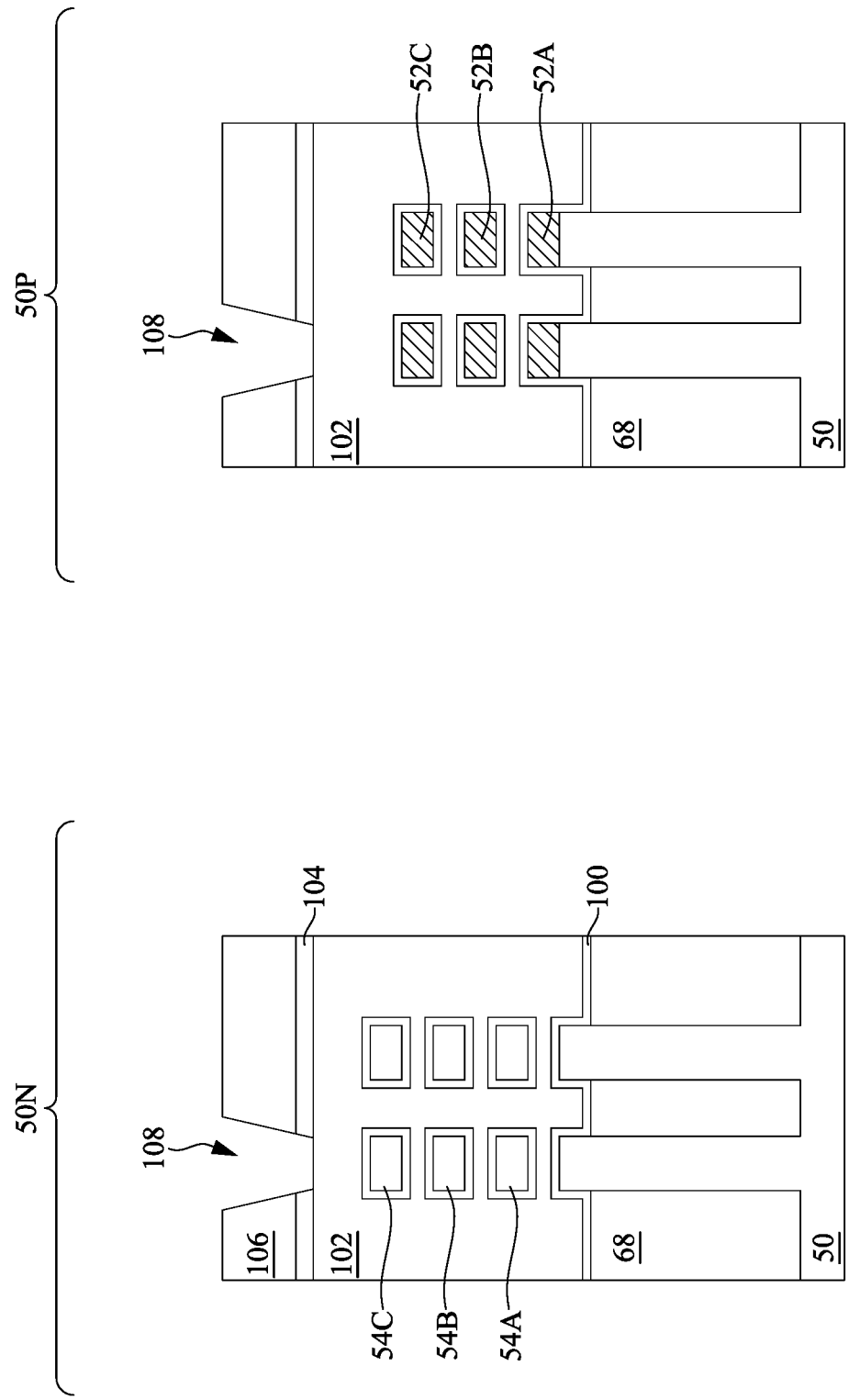
Figure 27B:
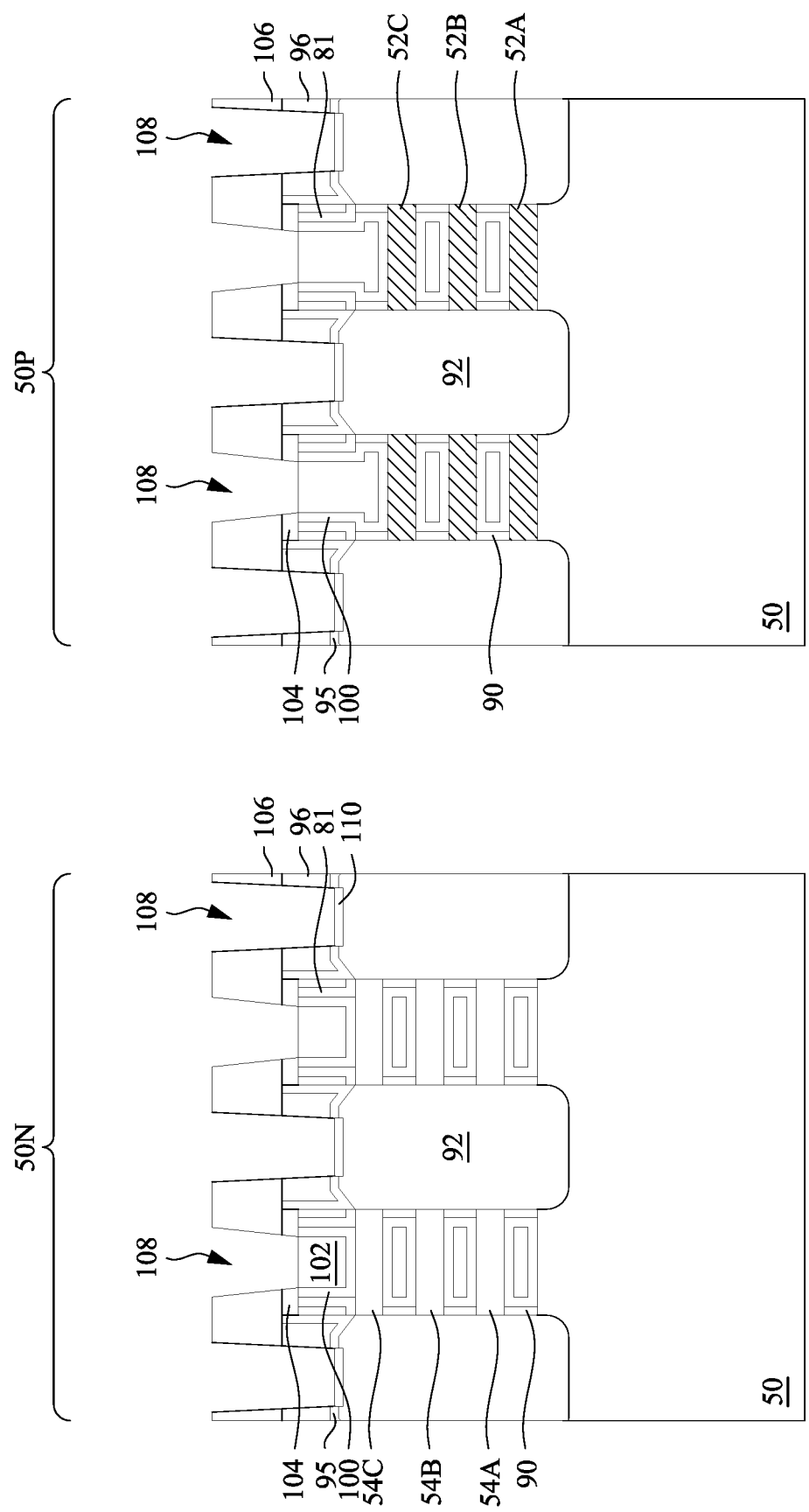
Figure 27C:
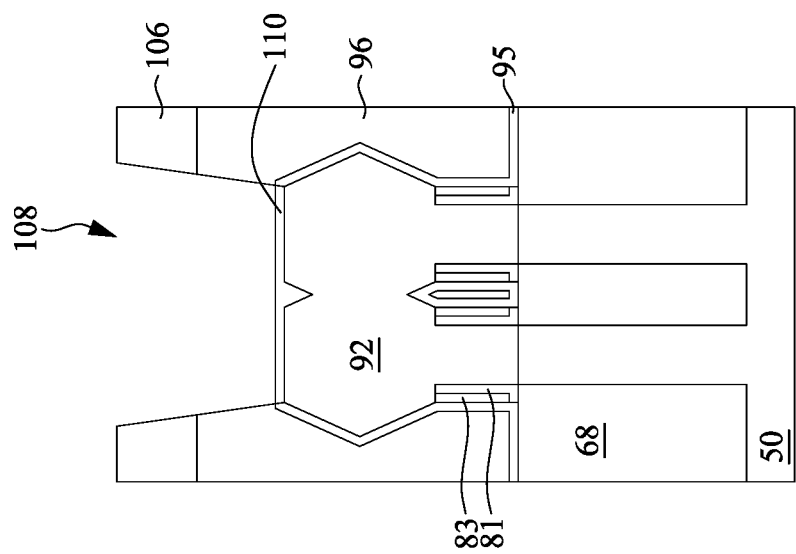

In FIGS. 27A-27C, the second ILD 106, the first ILD 96, the CESL 95, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 95 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 27B illustrates the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions no are formed over the epitaxial source/drain regions 92. In some embodiments, the silicide regions no are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions no. The un-reacted portions of the deposited metal are then removed, e.g., by an etching process. Although silicide regions no are referred to as silicide regions, silicide regions no may also be germanide regions, or silicon germanide regions (e.g., regions comprising silicide and germanide). In an embodiment, the silicide region no comprises TiSi, and has a thickness in a range between about 2 nm and about 10 nm.

Figure 28A:
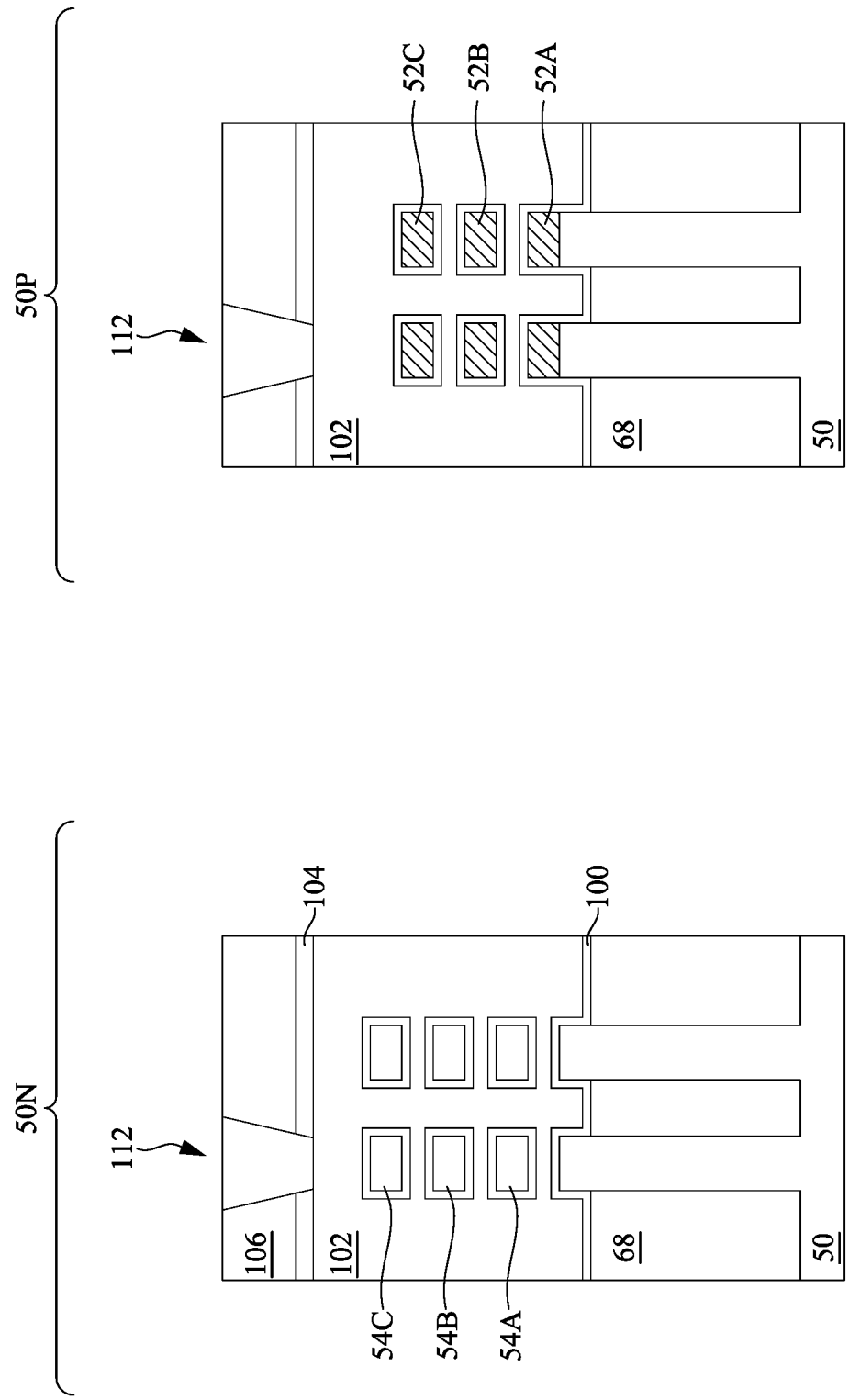
Figure 28B:
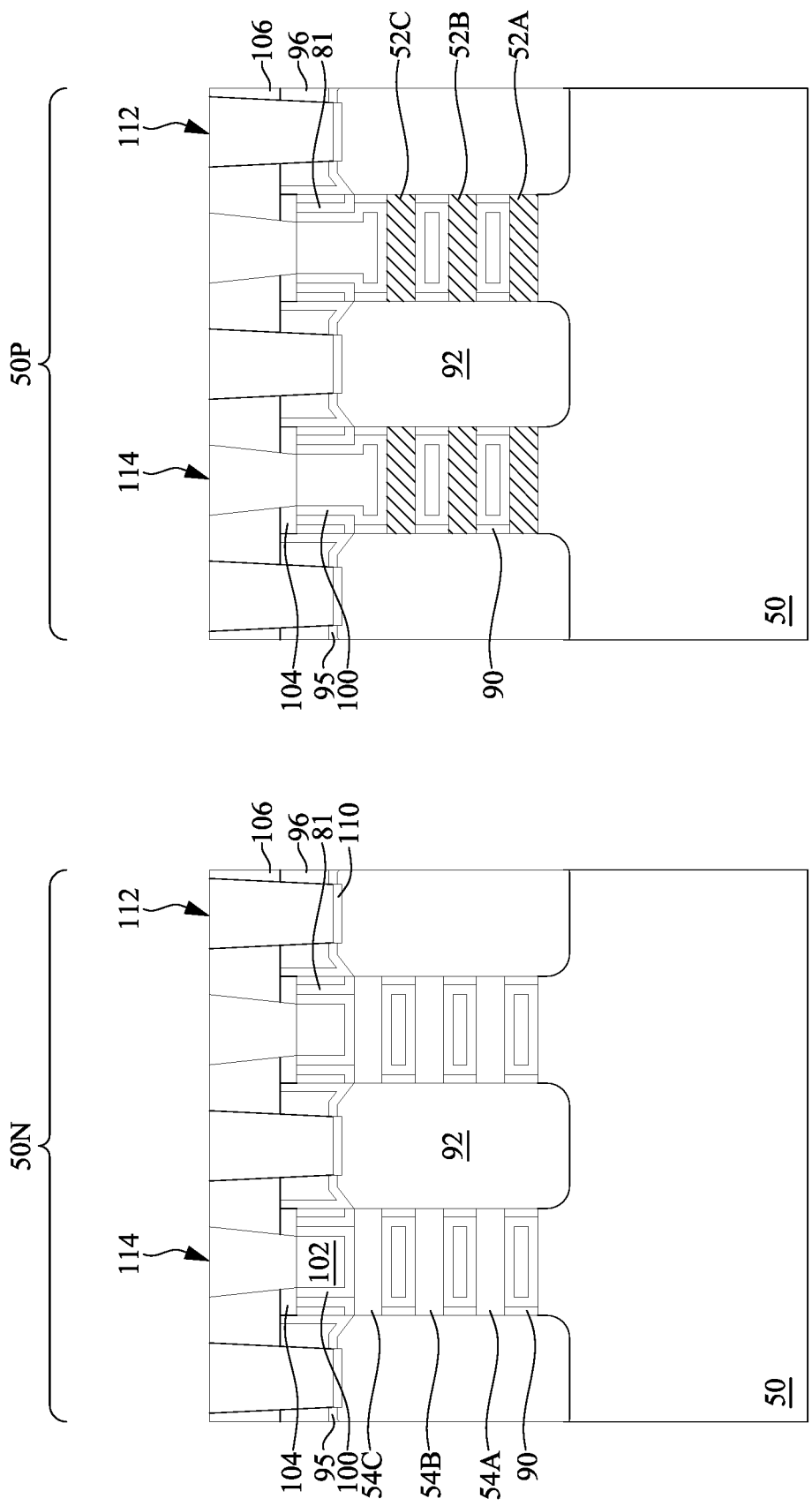
Figure 28C:
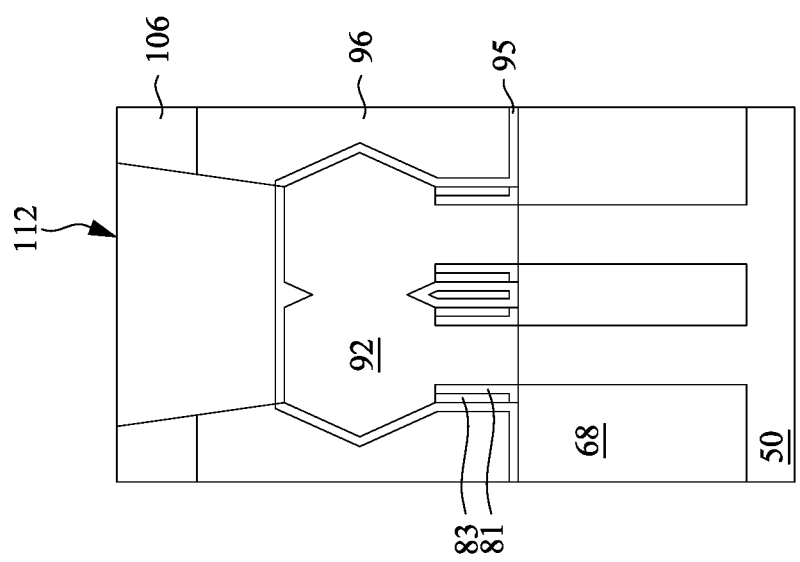

Next, in FIGS. 28A-28C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material (not separately illustrated), and is electrically coupled to the underlying conductive feature (e.g., the gate electrode 102 and/or silicide region no in the illustrated embodiment). The contacts 114 are electrically coupled to the gate structure (e.g., the gate electrodes 102) and may be referred to as gate contacts, and the contacts 112 are electrically coupled to the silicide regions no and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Although FIGS. 28A-28C illustrate a contact 112 extending to each of the epitaxial source/drain regions 92, the contact 112 may be omitted from certain ones of the epitaxial source/drain regions 92. For example, although not specifically illustrated, conductive features (e.g., power rails) may be subsequently attached through a backside of one or more of the epitaxial source/drain regions 92. For these particular epitaxial source/drain regions 92, the source/drain contacts 112 may be omitted or may be a dummy contact that is not electrically connected to any overlying conductive lines (also not specifically illustrated).

Figure 29A:
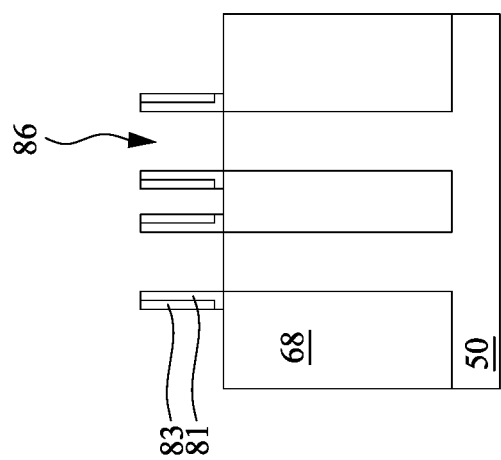
Figure 29B:
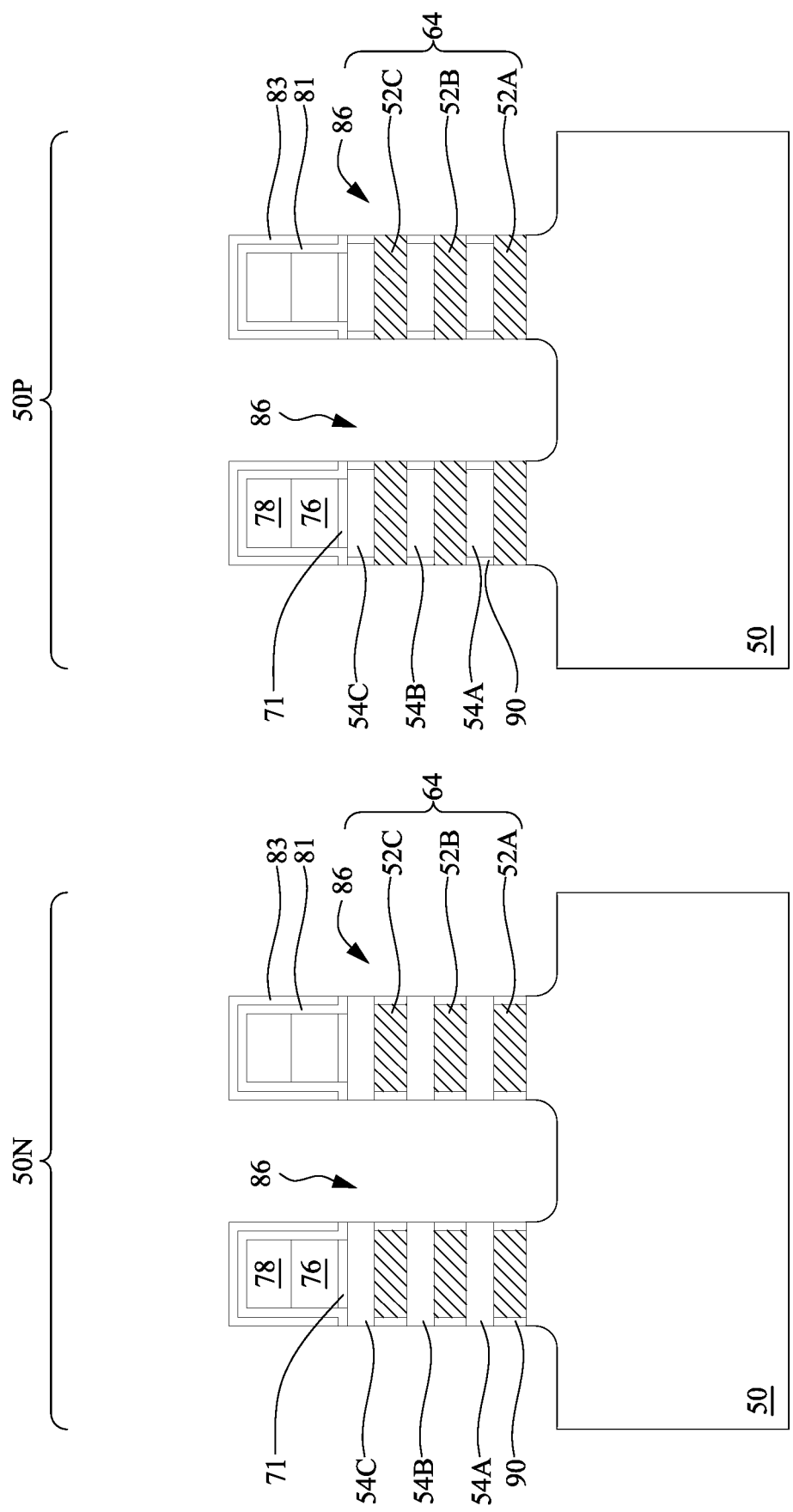

In FIGS. 29A-37C, in accordance with some embodiments, the multilayer p-masking layer 200 may be formed using alternative methods starting from FIGS. 29A-29B, which illustrate the structures formed in FIGS. 11A-11B. For example, the multilayer p-masking layer 200 may be formed by forming the first p-masking layer 204 and modifying an upper portion to form the second p-masking layer 208. In addition, the multilayer n-masking layer 300 may be formed similarly. In both cases, the methods discussed in greater detail below achieve the same or similar benefits discussed above in connection with the multilayer p-masking layer 200 and the multilayer n-masking layer 300.

Figure 30A:
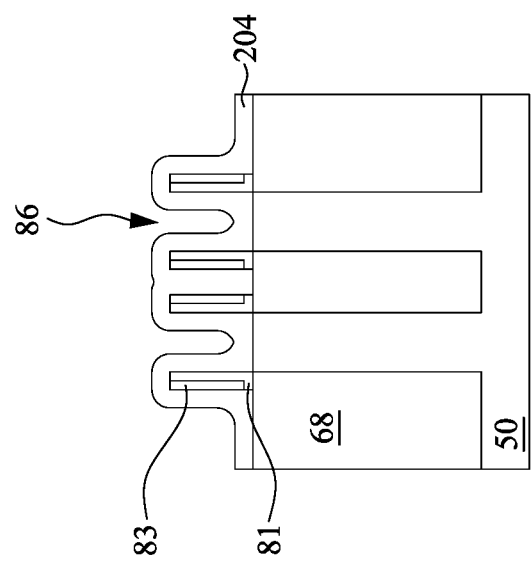
Figure 30B:
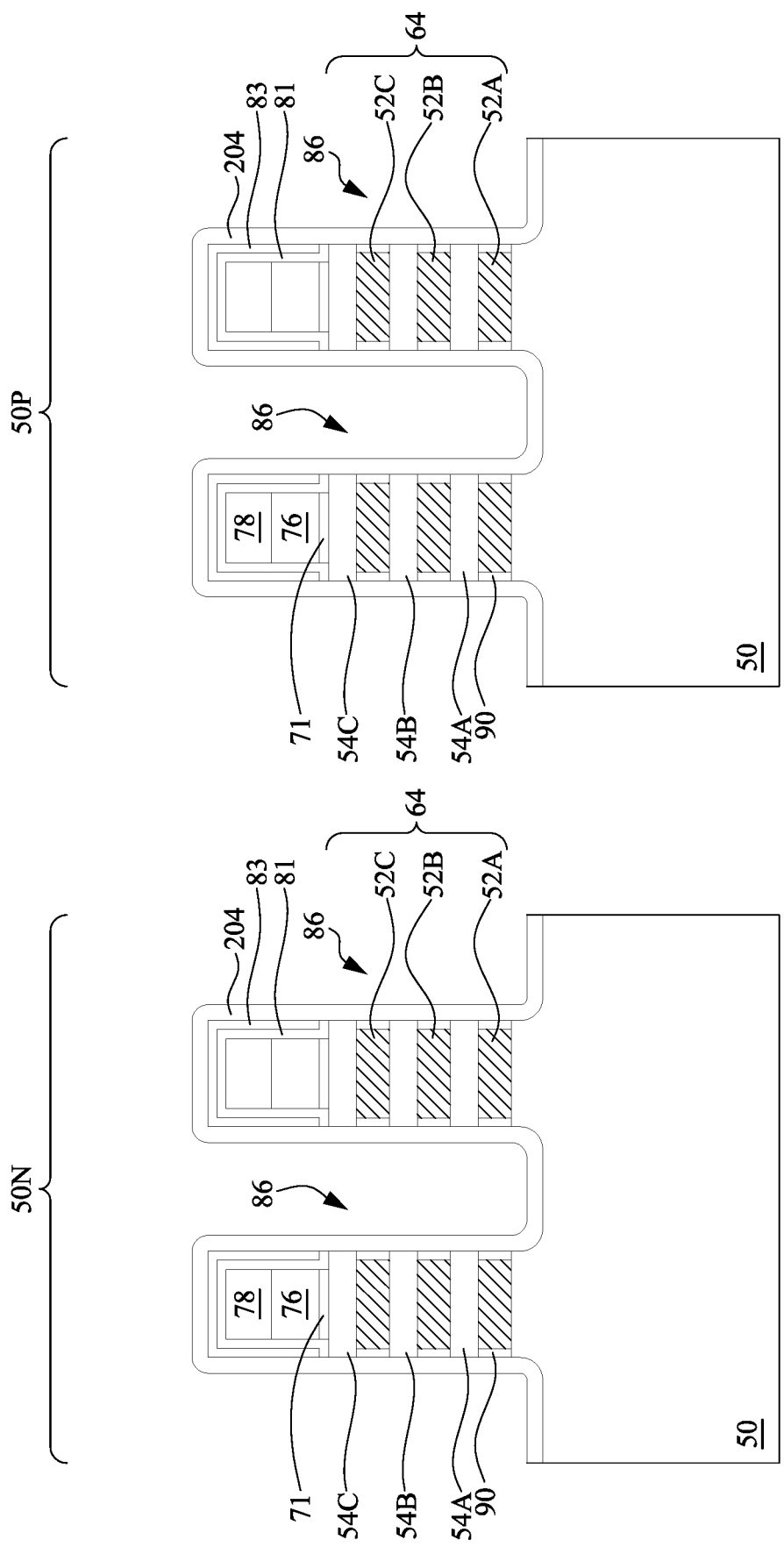

In FIGS. 30A-30B, the first p-masking layer 204 may be formed over the structures in the n-type region 50N and the p-type region 50P. The first p-masking layer 204 (e.g., aluminum oxide) may be formed using any of the methods described above in connection with FIGS. 12A-12B.

As discussed above, following the formation of the first p-masking layer 204, the first p-masking layer 204 may have a substantially smooth exposed surface and be substantially or entirely amorphous. In addition, the first p-masking layer 204 may be deposited to a thickness $T_1$ (see FIGS. 31C-31D) of between about 0.1 nm and about 1000 nm, with a density of between about 1.2 g/cm³ and about 4 g/cm³, and with a surface roughness of between about 0.05 nm and about 5 nm.

In FIGS. 31A-31D, the second p-masking layer 208 may be formed not by depositing another layer over the first p-masking layer 204, but by modifying an upper portion of the first p-masking layer 204. In some embodiments discussed in greater detail below (see FIGS. 31A-31C), the modification may comprise a treatment 210 of the first p-masking layer 204. In other embodiments discussed in greater detail further below (see FIGS. 31A-31B and 31D), the modification may comprise a dopant implantation 220 of the first p-masking layer 204.

Figure 31A:
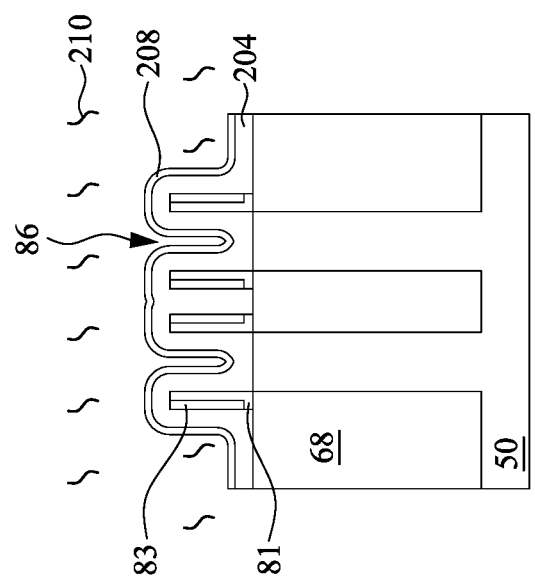
Figure 31B:
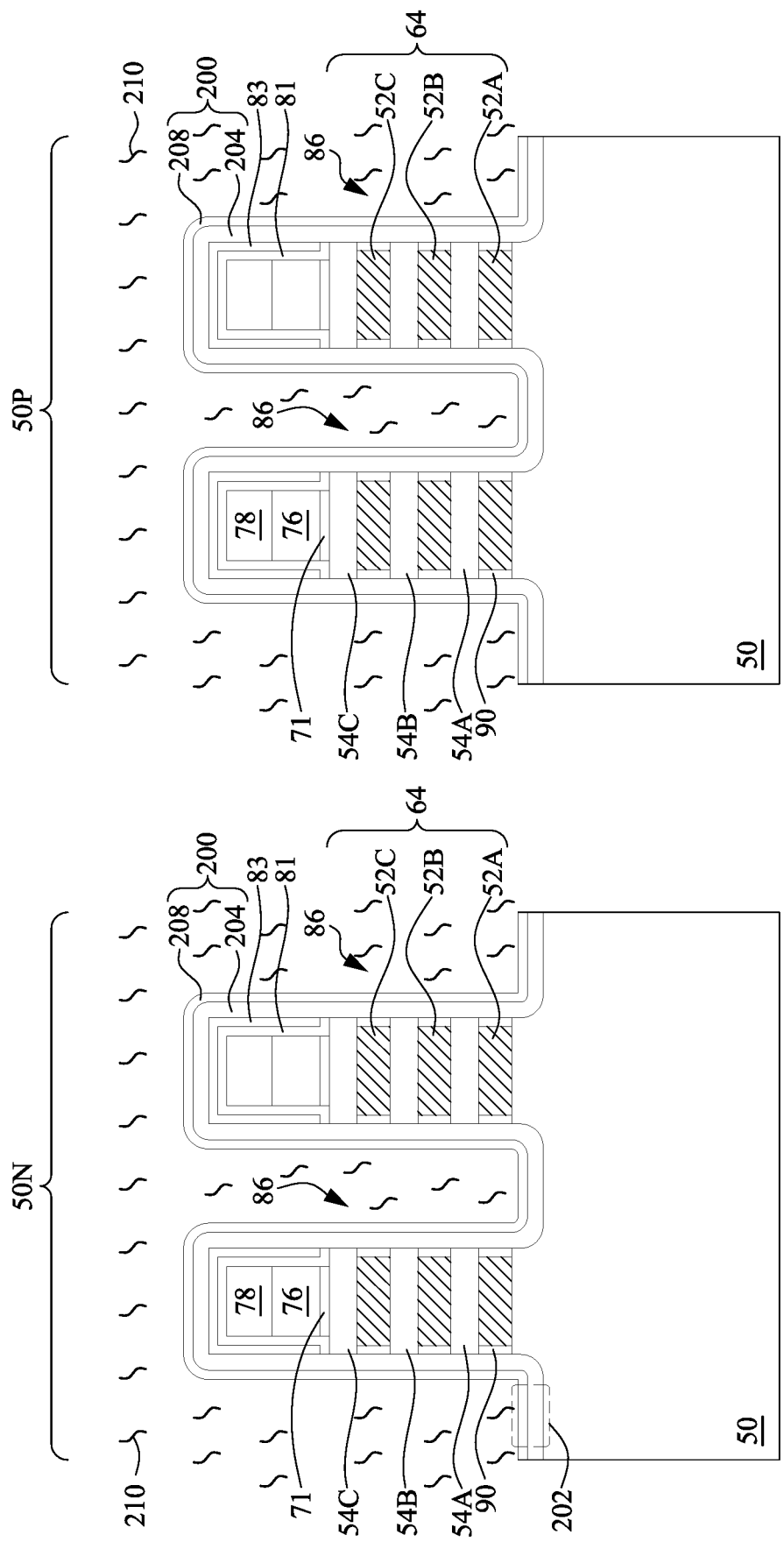
Figure 31C:
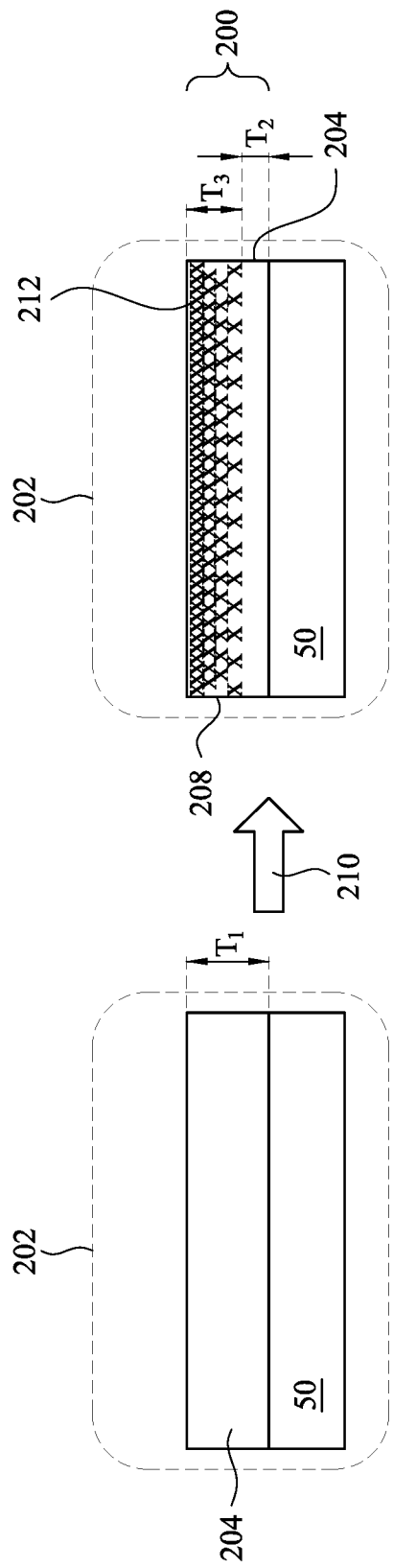

Referring specifically to FIGS. 31A-31C, the treatment 210 to form the second p-masking layer 208 may be an ion treatment (e.g., a plasma treatment) or a soak treatment. In the case of, for example, a plasma treatment, a plasma precursor is converted into plasma ions and flowed over the first p-masking layer 204. In the case of a soak treatment, a precursor gas is flowed over the first p-masking layer 204. In both cases, the plasma ions or the precursor gas may react with an exposed surface of the first p-masking layer 204. In some embodiments, the plasma ions or the precursor gas may additionally diffuse into and/or react with the first p-masking layer 204, resulting in a concentration gradient (e.g., a linear gradient) of impurities 212 throughout the second p-masking layer 208 as illustrated in FIG. 31C. The treatment 210 may further result in changes to the first p-masking layer 204. For example, the first p-masking layer 204 may have an increased or decreased density and/or an increased or decreased thickness $T_2$ following the treatment 210. The resulting second p-masking layer 208 may form over some or all of the first p-masking layer 204 and may diffuse to convert an upper portion of the first p-masking layer 204 into part of the second p-masking layer 208.

FIG. 31C illustrates a zoomed-in view of region 202 of FIG. 31B. Note that the illustrated region 202 depicts a portion of the multilayer p-masking layer 200 that is representative of any or all other portions of the multilayer p-masking layer 200 disposed over the structures. As stated above, the treatment 210 may be performed such that the impurities 212 have a concentration gradient (e.g., a linear gradient) through the second p-masking layer 208 (e.g., part of the second p-masking layer may have formerly been the upper portion of the first p-masking layer 204). For example, a topmost region of the second p-masking layer 208 may have a greater total concentration of the impurities 212, while a lowermost region or a bulk region of the second p-masking layer 208 (e.g., adjacent or more proximal than the topmost region to the first p-masking layer 204) may have a lesser total concentration of the impurities 212. In some cases, there may be a less distinguishable boundary between the first p-masking layer 204 and the second p-masking layer 208. For example, following the treatment 210, the first p-masking layer 204 may have a thickness $T_2$ of between about nm and about 8 nm, and the second p-masking layer 208 may have a thickness $T_3$ of between about 0.5 nm and about 8 nm. In various embodiments a sum of the thickness $T_2$ and the thickness $T_3$ may be about equal to the thickness T 1, less than the thickness $T_1$, or greater than the thickness $T_1$. In addition, the second p-masking layer 208 may have a density of between about 1.2 g/cm³ and about 4 g/cm³ and a surface roughness of between about 0.05 nm and about 5 nm.

In accordance with some embodiments, the second p-masking layer 208 is formed wherein the treatment 210 uses nitrogen whereby ions formed from nitrogen gas are flowed over the first p-masking layer 204. For example, the nitrogen ions may be flowed at a flowrate of between about 20 sccm and about 2 SLM. The treatment 210 may be performed at a temperature of between about 50° C. and about 1200° C. and at a pressure of between about 0.5 Torr and about 100 Torr. As such, the second p-masking layer 208 may have a nitrogen concentration in an upper portion of between about $1\times10^{15}$ atoms/cm$^3$ and about $1\times10^{22}$ atoms/cm$^3$, and a nitrogen concentration in a bulk portion of between about $1\times10^{10}$ atoms/cm$^3$ and about $1\times10^{17}$ atoms/cm$^3$.

Alternatively, the second p-masking layer 208 is formed wherein the treatment 210 uses ammonia whereby ions formed from ammonia are flowed over the first p-masking layer 204. In some embodiments, the ammonia ions do not substantially diffuse into the first p-masking layer 204. As a result, the second p-masking layer 208 may comprise a monolayer of —NH$^2$ functional groups bonded to the exposed surface of the first p-masking layer 204. In many cases, this change in bonding at the surface of the first p-masking layer 204 will affect other bonds within the first p-masking layer 204 near the —NH$^2$ functional groups, which may cause the thickness $T_2$ to differ from the thickness $T_1$. For example, the ammonia ions may be flowed at a flowrate of between about 20 sccm and about 2 SLM. The treatment 210 may be performed at a temperature of between about 50° C. and about 650° C. and at a pressure of between about 0.5 Torr and about 100 Torr. As such, the second p-masking layer 208 may have a nitrogen concentration (from the ammonia reactions and bonding) in an upper portion of between about $1\times10^{15}$ atoms/cm$^3$ and about $1\times10^{22}$ atoms/cm$^3$, and a nitrogen concentration in a bulk portion of between about $1\times10^{10}$ atoms/cm$^3$ and about $1\times10^{17}$ atoms/cm$^3$.

In different embodiments using the treatment 210 using ammonia, the ammonia ions do diffuse into the first p-masking layer 204. For example, the ammonia ions may be flowed at a flowrate of between about 20 sccm and about 2 SLM. The treatment 210 may be performed at a temperature of between about 50° C. and about 1200° C. and at a pressure of between about 0.5 Torr and about 100 Torr. As such, the second p-masking layer 208 may have a nitrogen concentration (from the ammonia reactions and bonding) in an upper portion of between about $1\times10^{15}$ atoms/cm$^3$ and about $1\times10^{22}$ atoms/cm$^3$, and a nitrogen concentration in a bulk portion of between about $1\times10^{10}$ atoms/cm$^3$ and about $1\times10^{17}$ atoms/cm$^3$.

In yet other embodiments, the second p-masking layer 208 is formed using the treatment 210 using silicon whereby a silicon precursor is flowed over the first p-masking layer 204 (e.g., a soak treatment). The silicon precursor may comprise silane (SiH$_4$), dichlorosilane (SiH$_2$Cl$_2$), diiodosilane (SiH$_2$I$_2$), SiH$_2$I$_2$, SiCl$_4$, the like, or any combinations thereof. For example, the silicon precursor may be flowed at a flowrate of between about 20 sccm and about woo sccm. The treatment 210 may be performed at a temperature of between about 50° C. and about 650° C. and at a pressure of between about 0.5 Torr and about 10 Torr. As such, the second p-masking layer 208 may have a silicon concentration in an upper portion of between about $1\times10^{15}$ atoms/cm$^3$ and about $1\times10^{22}$ atoms/cm$^3$, and a silicon concentration in a bulk portion of between about $1\times10^{10}$ atoms/cm$^3$ and about $1\times10^{17}$ atoms/cm$^3$.

Figure 31D:
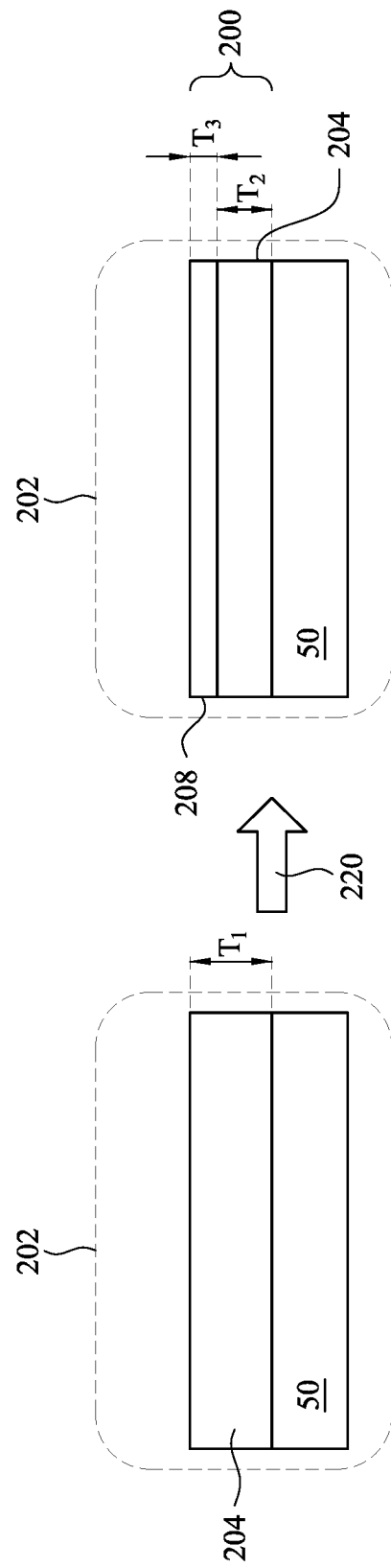

Instead of using the treatment 210 to form the second p-masking layer 208, FIGS. 31A-31B and 31D illustrate using the dopant implantation 220 to form the second p-masking layer 208 with an ex situ doping of the first p-masking layer 204 with dopants 222. The dopants 222 may be implanted to impinge the exposed surface (e.g., a top surface) of the first p-masking layer 204 and reach a specified depth under the surface, resulting in a substantially consistent concentration of dopants 222 throughout the second p-masking layer 208 as illustrated in FIG. 31D. The dopant implantation 220 may further result in changes to the first p-masking layer 204. For example, the first p-masking layer 204 may have an increased or decreased density and/or an increased or decreased thickness $T_2$ following the dopant implantation 220. The resulting second p-masking layer 208 forms over some or all of the first p-masking layer 204 to convert an upper portion of the first p-masking layer 204 into part of the second p-masking layer 208.

In this embodiment, the dopant implantation 220 may be performed such that the dopants 222 have a substantially consistent concentration through the second p-masking layer 208 (e.g., part of the second p-masking layer may have formerly been the upper portion of the first p-masking layer 204). That is, an entire thickness $T_2$ of the second p-masking layer 208 may comprise a same concentration of the dopants 222 (e.g., an element of the dopants 222). For example, following the treatment 210, the thickness $T_2$ of the first p-masking layer 204 may be between about 0.5 nm and about 8 nm, and the second p-masking layer 208 may have a thickness $T_3$ of between about 0.5 nm and about 8 nm. In various embodiments a sum of the thickness $T_2$ and the thickness $T_3$ may be about equal to the thickness $T_1$, less than the thickness $T_1$, or greater than the thickness $T_1$. In addition, the second p-masking layer 208 may have a density of between about 1.2 g/cm$^3$ and about 4 g/cm$^3$ and a surface roughness of between about 0.5 nm and about 5 nm.

In accordance with some embodiments, the second p-masking layer 208 is formed using a dopant implantation 220 of silicon nitride dopants whereby silicon ions and nitrogen ions are directed at high energies into the top surface of the first p-masking layer 204. For example, the silicon ions may be injected at an energy of between about 1 eV and about 10 eV, and the nitrogen ions may be injected at an energy of between about 1 eV and about 10 eV. The silicon ion and nitrogen ion implantations of the implantation 220 may be performed in any order or simultaneously. The dopant implantation 220 may be performed at a temperature of between about 50° C. and about 500° C. and at a pressure of between about $1\times10^{-9}$ Torr and about $1\times10^{-5}$ Torr. The second p-masking layer 208 may have a silicon concentration of between about $1\times10^{15}$ atoms/cm$^3$ and about $1\times10^{22}$ atoms/cm$^3$ and a nitrogen concentration of between about $1\times10^{15}$ atoms/cm$^3$ and about $1\times10^{22}$ atoms/cm$^3$.

Alternatively, the second p-masking layer 208 is formed using a dopant implantation 220 of silicon germanium whereby silicon ions and germanium ions are directed at high energies into the top surface of the first p-masking layer 204. For example, the silicon ions may be injected at an energy of between about 1 eV and about 10 eV, and the germanium ions may be injected at an energy of between about 1 eV and about 10 eV. The silicon ion and germanium ion implantations may be performed in any order or simultaneously. The dopant implantation 220 may be performed at a temperature of between about 50° C. and about 500° C. and at a pressure of between about 1×10−9 Torr and about $1\times10^{-5}$ Torr. The second p-masking layer 208 may have a silicon concentration of between about $1\times10^{17}$ atoms/cm$^3$ and about $1\times10^{22}$ atoms/cm$^3$ and a germanium concentration of between about $1\times10^{17}$ atoms/cm$^3$ and about $1\times10^{22}$ atoms/cm$^3$.

In other embodiments, the second p-masking layer 208 is formed using a germanium dopant implantation 220 whereby only germanium ions are directed at high energies into the top surface of the first p-masking layer 204. For example, the germanium ions may be injected at an energy of between about 1 eV and about 10 eV. The dopant implantation 220 may be performed at a temperature of between about 50° C. and about 500° C. and at a pressure of between about $1 \times 10^{-9}$ Torr and about $1 \times 10^{-6}$ Torr. The second p-masking layer 208 may have a germanium concentration of between about $1 \times 10^{17}$ atoms/cm$^3$ and about $1 \times 10^{22}$ atoms/cm$^3$.

Figure 32B:
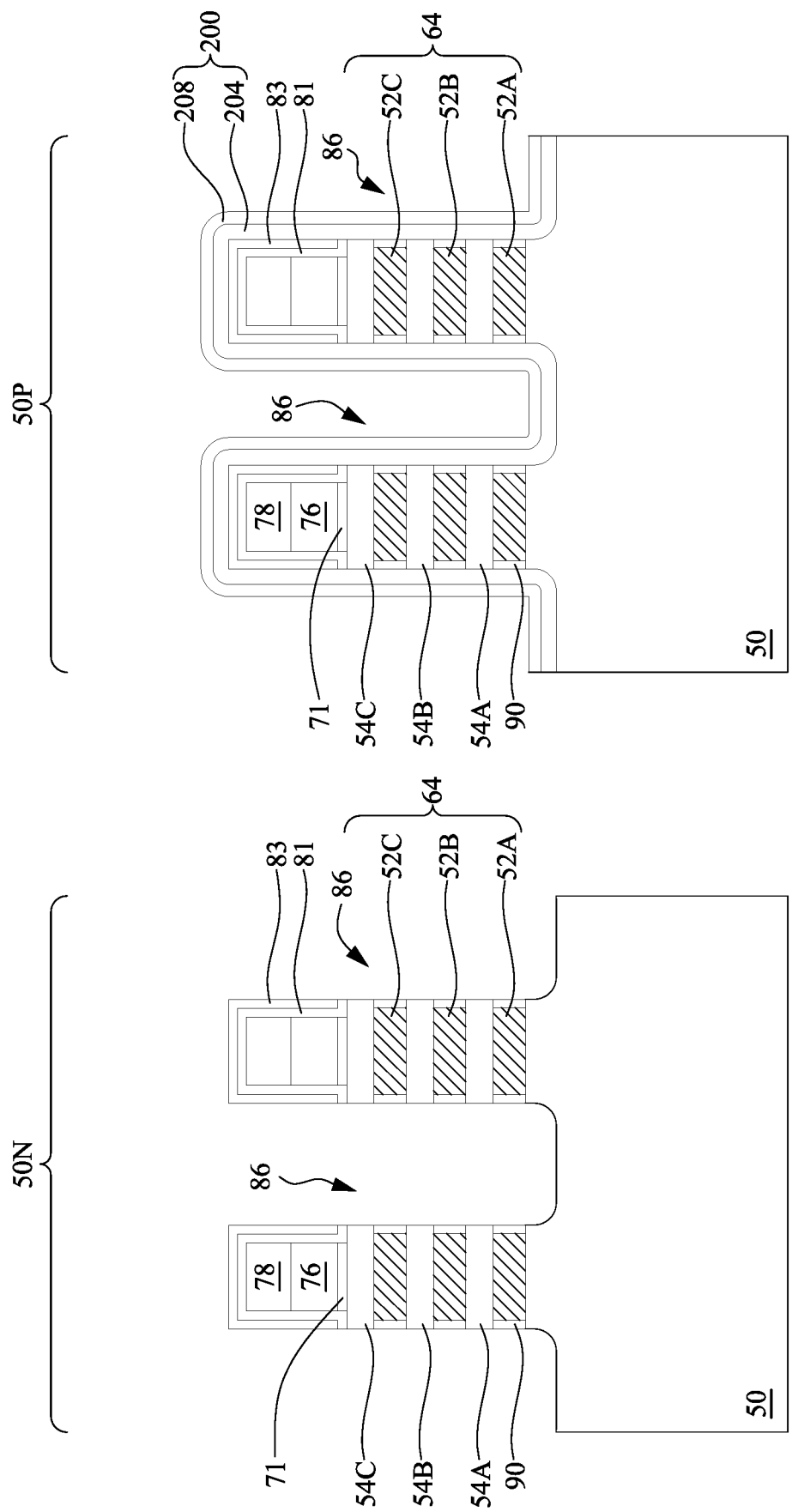
Figure 33A:
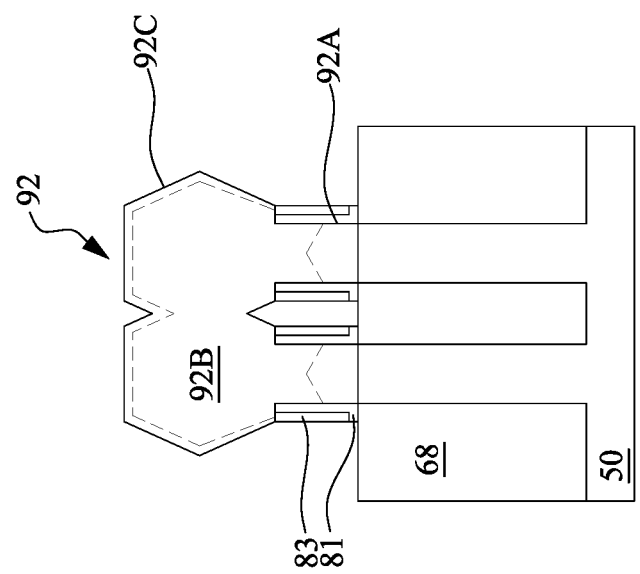
Figure 33B:
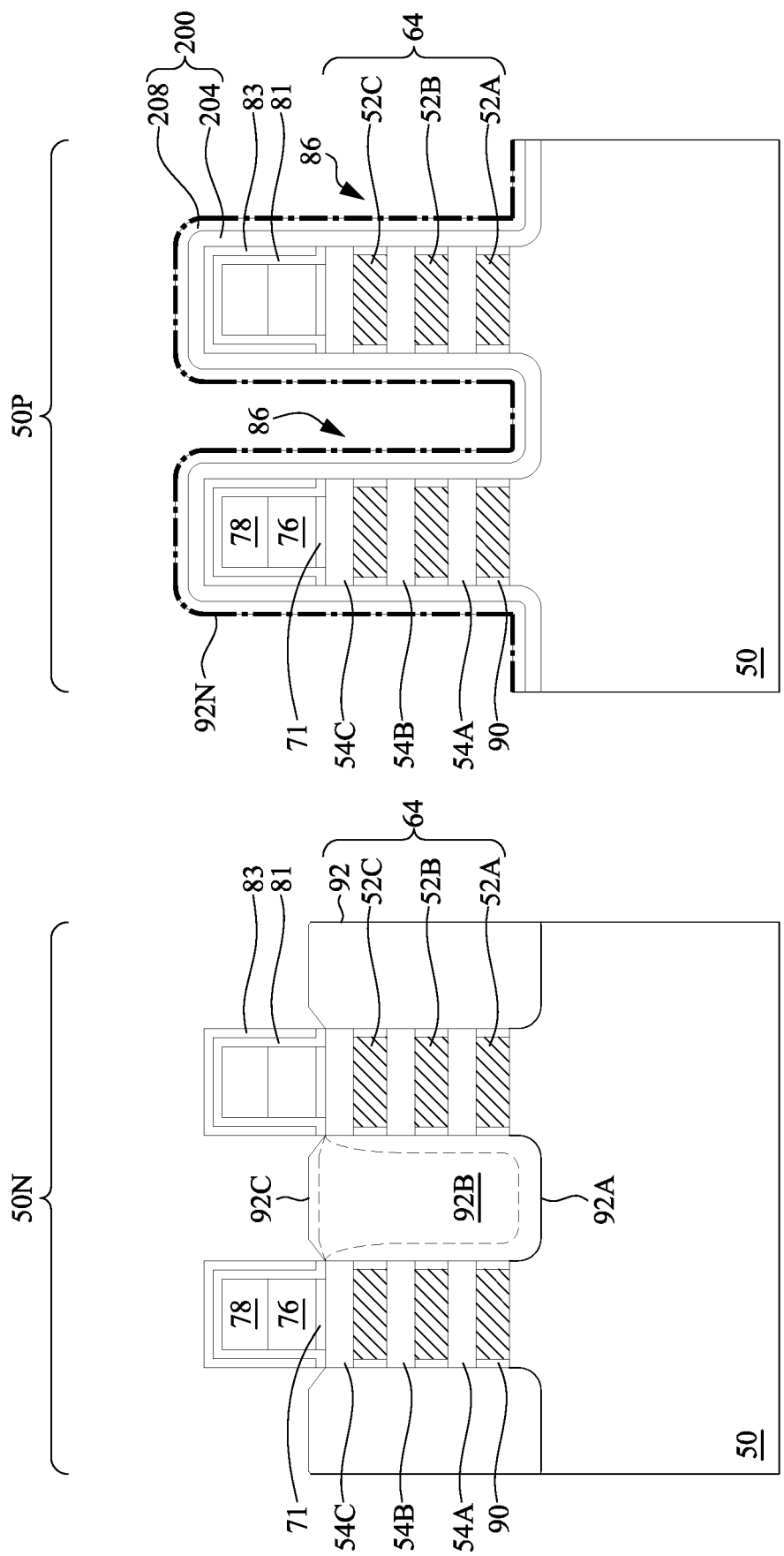
Figure 33C:
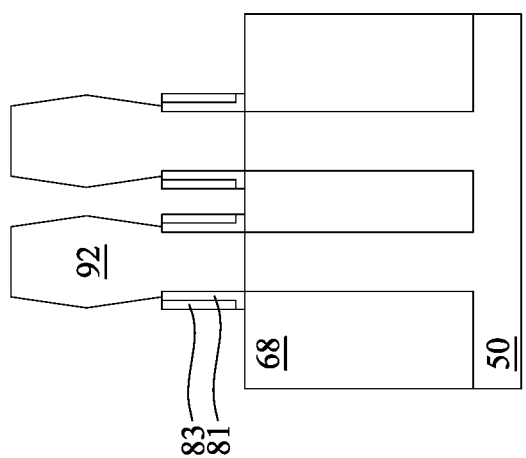
Figure 34A:
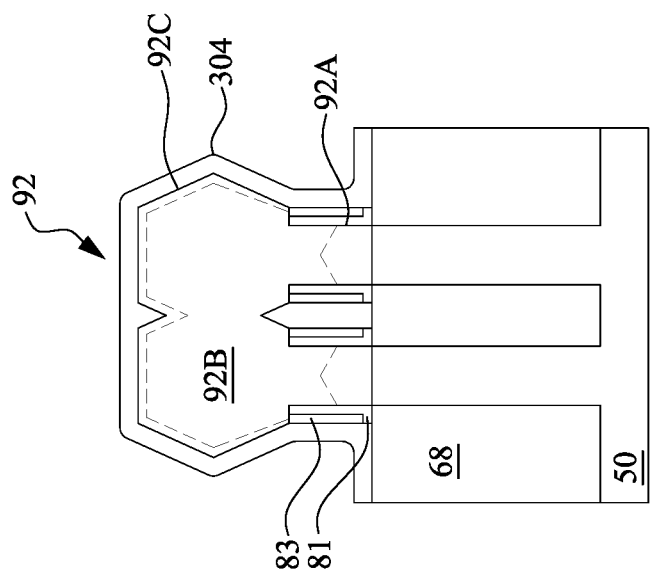
Figure 34B:
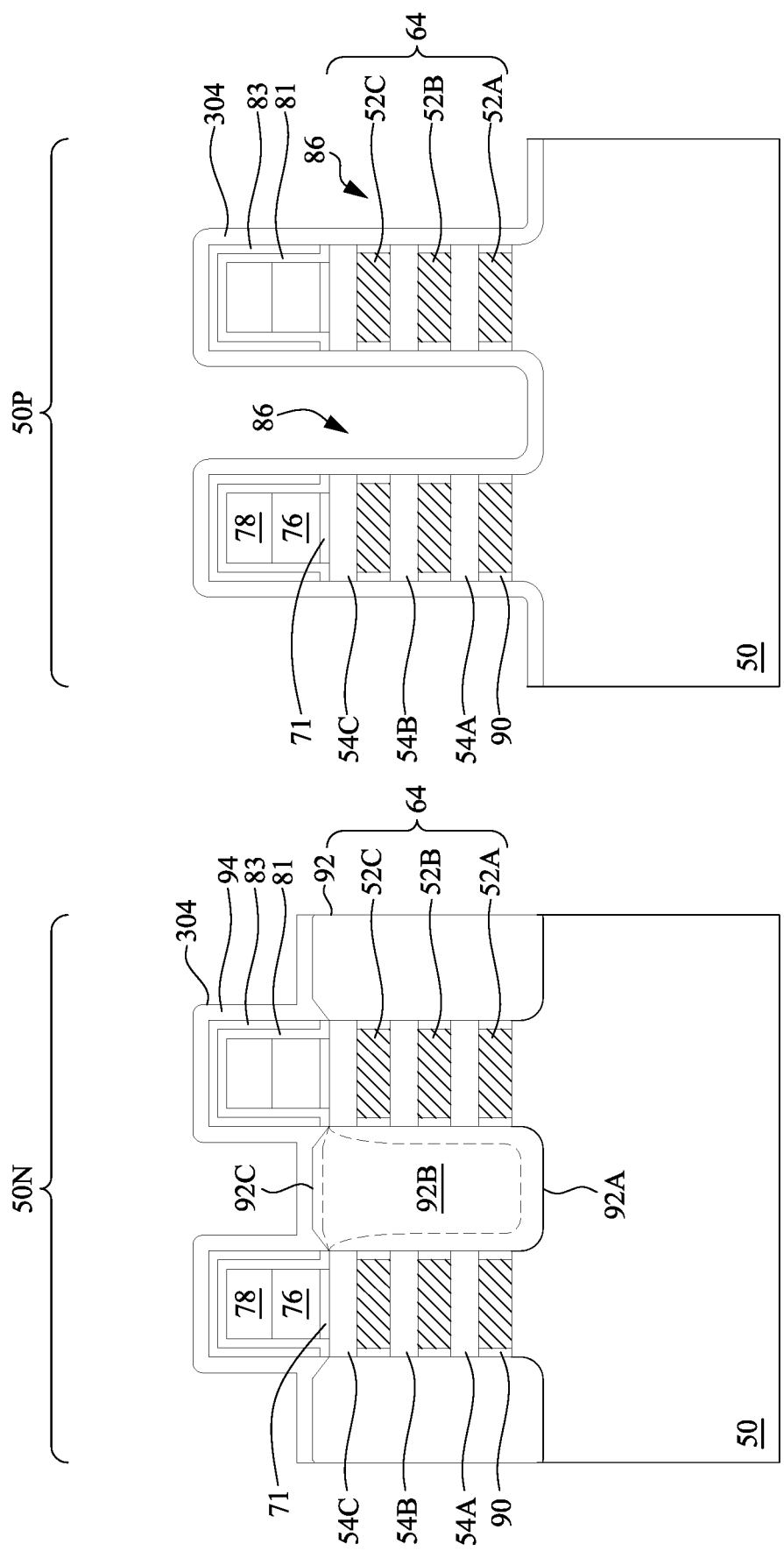
Figure 34C:
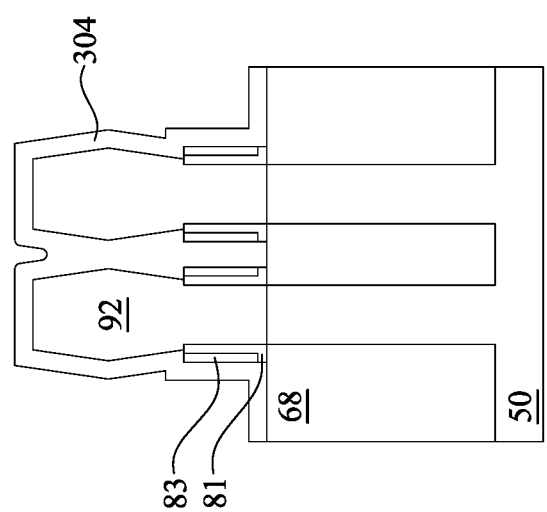

In FIGS. 32A-32B, the multilayer p-masking layer 200 is removed from the n-type region 50N as described above in connection with FIGS. 14A-14B. In FIGS. 33A-33C, the source/drain epitaxial regions 92 are formed over the n-type region 50N and the nodules 92N are formed over the multilayer p-masking layer 200 in the p-type region 50P as described above in connection with FIGS. 15A-15C. In FIGS. 34A-34C, the multilayer p-masking layer 200 and the nodules 92N are removed from the p-type region 50P, and the first n-masking layer 304 (e.g., aluminum oxide) is formed over the structures in the n-type region 50N and the p-type region 50P as described above in connection with FIGS. 16A-16C.

Following the formation of the first n-masking layer 304, the first n-masking layer 304 may have a substantially smooth exposed surface and be substantially or entirely amorphous. For example, in some embodiments the first n-masking layer 304 may be deposited to a thickness $T_4$ (see FIGS. 35D-35E) of between about 0.5 nm and about 10 nm, a density of between about 1.2 g/cm$^3$ and about 4 g/cm$^3$, and a surface roughness of between about 0.5 nm and about 5 nm.

In FIGS. 35A-35E, the second n-masking layer 308 may be formed by modifying the first n-masking layer 304 using any same methods and materials and to the same specifications discussed above for the formation of the second p-masking layer 208 (e.g., treatment 210 or dopant implantation 220) in connection with FIGS. 31A-D.

Figure 35A:
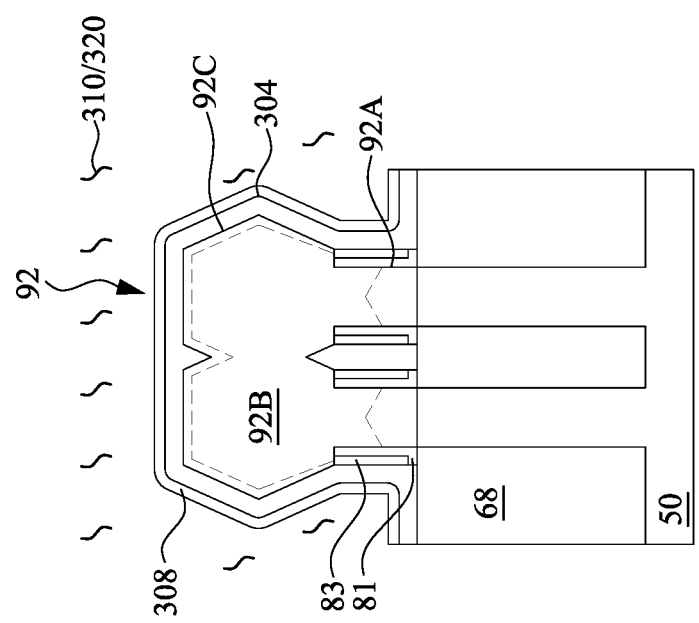
Figure 35B:
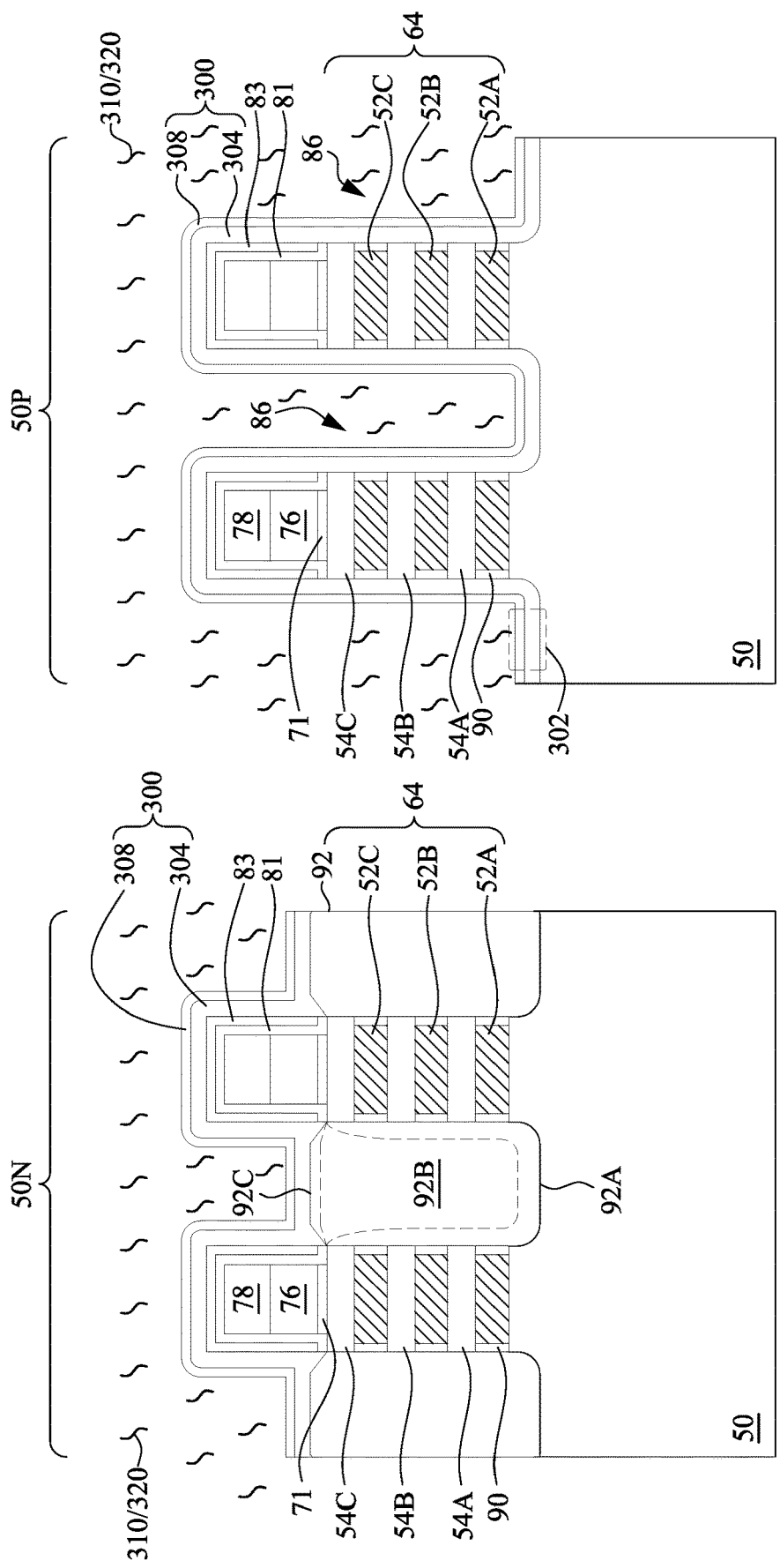
Figure 35C:
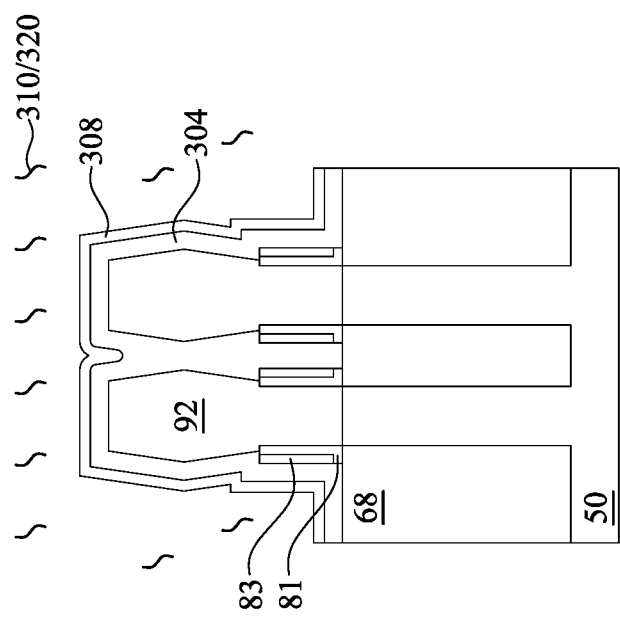

For example, referring specifically to FIGS. 35A-35D, in accordance with some embodiments, the second n-masking layer 308 may be formed using treatment 310 on the first n-masking layer 304, such as an ion treatment (e.g., a plasma treatment) or a soak treatment, as discussed above. As further discussed above, plasma ions or a precursor gas may diffuse into and react the first n-masking layer 304, resulting in a concentration gradient of impurities 312 as illustrated in FIG. 35D.

Alternatively, as illustrated in FIGS. 35A-35C and 35E, the second n-masking layer 308 may be formed using dopant implantation 320 on the first n-masking layer 304. As further discussed above, dopants 322 are directed at high energies into the first n-masking layer 304, resulting in a substantially consistent concentration of dopants 322 as illustrated in FIG. 35E.

Figure 36A:
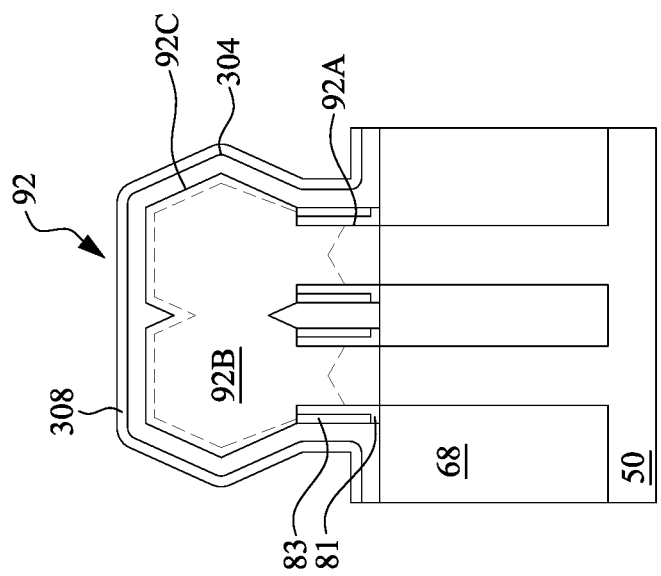
Figure 36B:
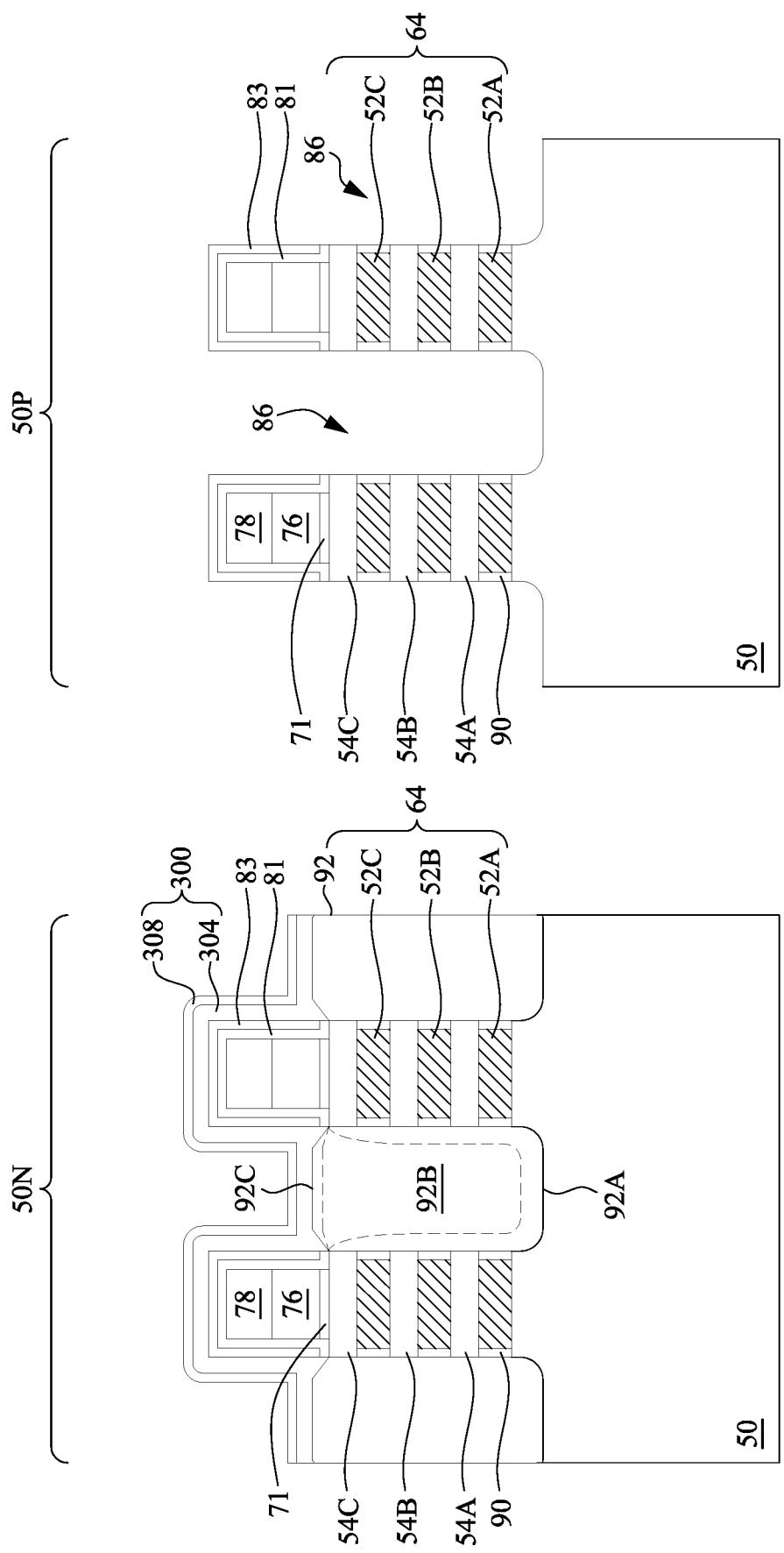
Figure 36C:
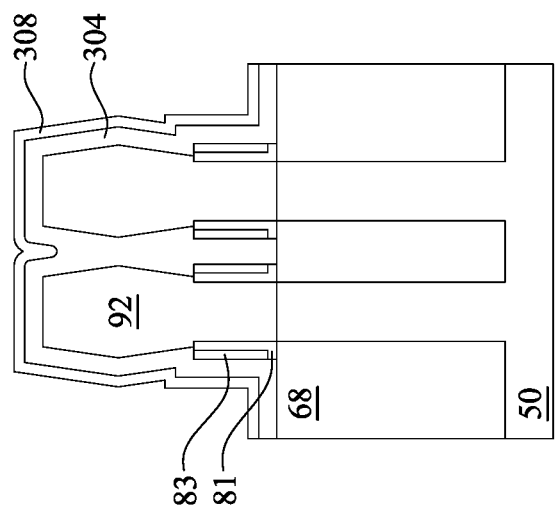
Figure 37A:
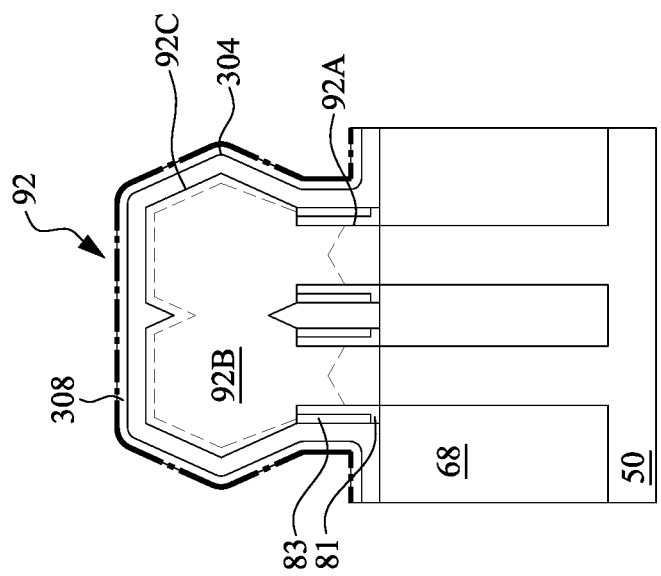
Figure 37B:
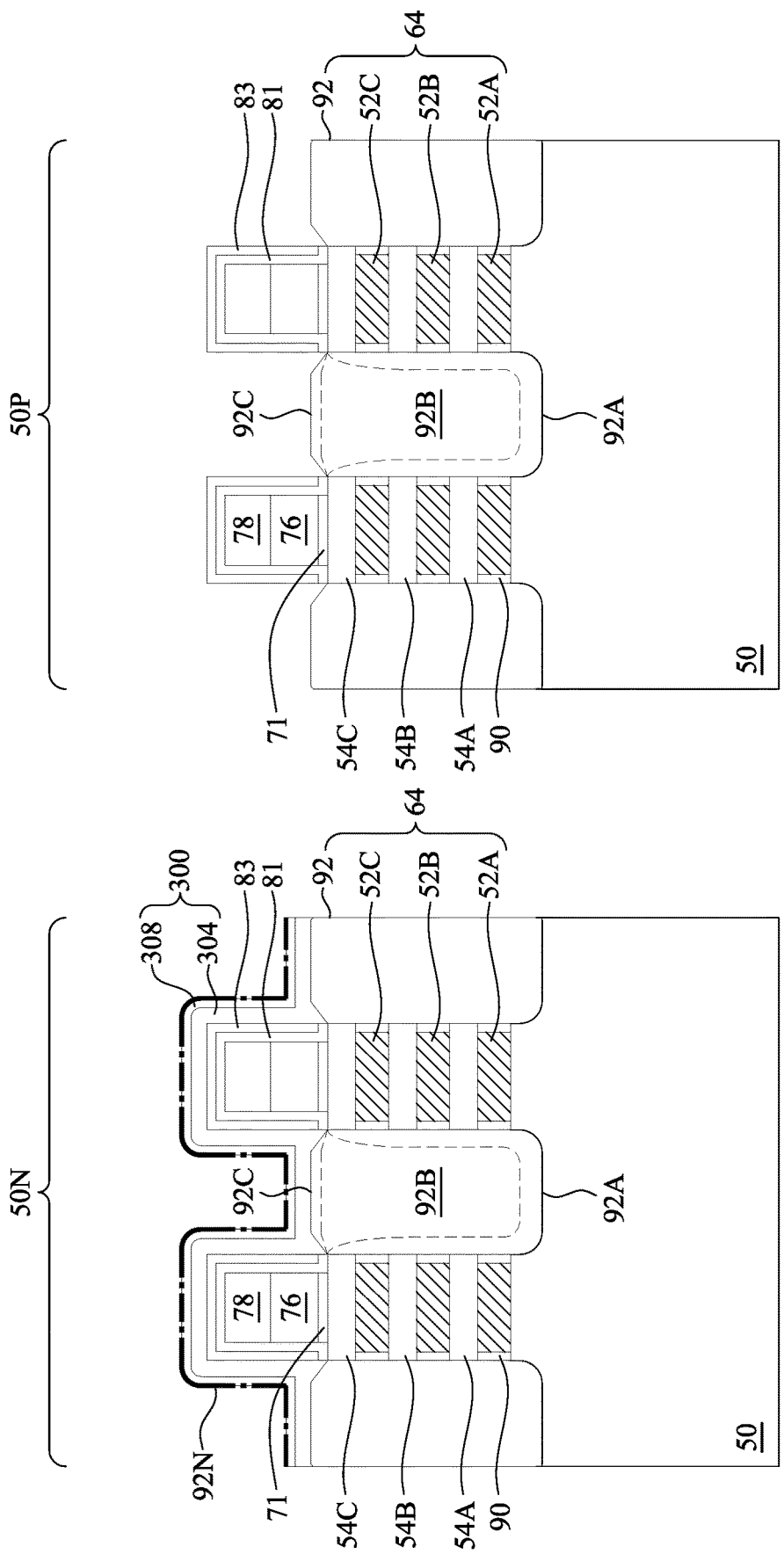
Figure 37C:
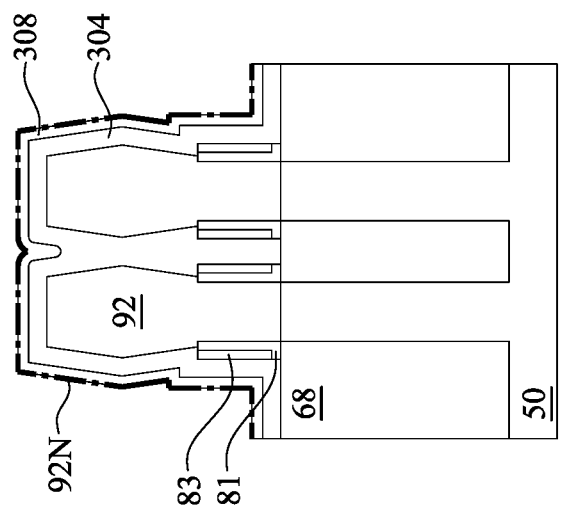

In FIGS. 36A-36C, the multilayer n-masking layer 300 is removed from the p-type region 50P as described above in connection with FIGS. 18A-18C. In FIGS. 37A-37C, the source/drain epitaxial regions 92 are formed over the p-type region 50P and the nodules 92N are formed over the multilayer n-masking layer 300 in the n-type region 50N as described above in connection with FIGS. 19A-19C. Further, the multilayer n-masking layer 300 and the nodules 92N are removed from the n-type region 50N as described above and illustrated in connection with FIGS. 20A-20D. Additional fabrication of the semiconductor device may proceed as described above and illustrated in connection with FIGS. 21A-28C.

Note that any of the processes described above to form the multilayer p-masking layer 200 may be used to form the multilayer n-masking layer 300. The process to form the multilayer n-masking layer 300 may be a same or similar process as used to form the multilayer p-masking layer 200, or the processes may be different. In addition, a person of ordinary skill would understand that the multilayer n-masking layer 300 (and the epitaxial source/drain regions 92 in the p-type region 50P) may be formed before forming the multilayer p-masking layer 200 (and the epitaxial source/drain regions 92 in the n-type region 50N).

As described above, the multilayer p-masking layer 200 may be formed with distinct deposition steps for the first p-masking layer 204 (e.g., an ALD or CVD process) and the second p-masking layer 208 (e.g., a CVD or lamination process). Alternatively, the multilayer p-masking layer 200 may be formed by first forming the first p-masking layer 204 and then modifying an upper portion of the first p-masking layer 204 using, for example, a treatment (e.g., plasma treatment or soak treatment) or a dopant implantation. Further, the multilayer n-masking layer 300 may be formed by analogous versions of any of those methods, whether using the same method or a different method used to form the multilayer p-masking layer 200.

For example, in accordance with some embodiments, the multilayer p-masking layer 200 may be formed with distinct deposition steps for the first p-masking layer 204 and the second p-masking layer 208, while the multilayer n-masking layer 300 may be formed by ex situ doping the first n-masking layer 304. In other embodiments, the multilayer p-masking layer 200 may be formed by ex situ doping the first p-masking layer 204, while the multilayer n-masking layer 300 is formed with distinct deposition steps for the first n-masking layer 304 and the second n-masking layer 308.

Embodiments may achieve advantages. For example, embodiments disclosed herein improve the yield and effectiveness in the formation of the epitaxial source/drain regions 92. In particular, forming a first masking layer (e.g., first p-masking layer 204 and first n-masking layer 304) that comprises a metal oxide allows for a thinner masking layer that forms a complete protective layer over critical dimensions that are becoming smaller as technology progresses. In addition, forming a second masking layer (e.g., second p-masking layer 208 and second n-masking layer 308) over the first masking layer achieves additional benefits, wherein the second masking layer is formed as a deposition or treatment with dielectric and/or certain semiconductor materials as described above. First, forming the second masking layer converts a smooth exposed surface of the first masking layer into a rough exposed surface with a certain chemical composition to achieve the state benefits. The resulting exposed surfaces of the multilayer p-masking layer 200 and the multilayer n-masking layer 300 have lower selectivity for epitaxial growth during the formation of the epitaxial source/drain regions 92 as compared to the surfaces of only the first p-masking layer 204 and the first n-masking layer 304, respectively. Second, the lower selectivity for epitaxial growth improves critical dimension control by minimizing the number and/or duration of epitaxial etching steps that may be performed in conjunction with the epitaxial growth. Third, the reduced epitaxial growth over the multilayer masking layers results in multilayer masking layers that may be more easily removed (e.g., by isotropic wet etching) without being hindered by large nodules 92N of epitaxial material or large numbers of nodules 92N of epitaxial material disposed over the masking layer.

In an embodiment, a method includes forming a semiconductor layer over a substrate; etching a portion of the semiconductor layer to form a first recess and a second recess; forming a first-type masking layer over the semiconductor layer, the forming the first-type masking layer includes forming a first masking layer over the semiconductor layer; and forming a second masking layer, wherein after forming the second masking layer, the second masking layer is located over a portion of the first masking layer; etching the first-type masking layer to expose the semiconductor layer; forming a first semiconductor material in the first recess; and removing the first-type masking layer. In another embodiment, the first masking layer includes aluminum oxide. In another embodiment, the forming the second masking layer includes depositing a new material layer over the first masking layer. In another embodiment, the forming the second masking layer includes modifying the first masking layer with a first chemical to convert an upper portion of the first masking layer to the second masking layer. In another embodiment, after the modifying the first masking layer, the second masking layer includes a concentration gradient of an element of the first chemical. In another embodiment, after the modifying the first masking layer, an entire thickness of the second masking layer includes a same concentration of an element of the first chemical. In another embodiment, the method further includes forming a second-type masking layer over the semiconductor layer; etching the second-type masking layer to expose the semiconductor layer; and forming a second semiconductor material in the second recess. In another embodiment, the forming the first masking layer includes depositing the first masking layer by atomic layer deposition. In another embodiment, the forming the second masking layer includes performing a dopant implantation on the first masking layer.

In an embodiment, a method includes forming a semiconductor layer over a first substrate; etching the semiconductor layer to form a first recess in a first region and a second recess in a second region; depositing a first portion of a first masking layer over the first region and the second region; forming a second masking layer over the first portion of the first masking layer; removing the first masking layer and the second masking layer from the second region; forming a first epitaxial source/drain region in the second recess; removing a remainder of the first masking layer and a remainder of the second masking layer; depositing a first portion of a third masking layer over the first region and the second region; forming a fourth masking layer over the first portion of the third masking layer; removing the third masking layer and the fourth masking layer from the first region; forming a second epitaxial source/drain region in the first recess; removing a remainder of the third masking layer and a remainder of the fourth masking layer; and forming a gate structure over the semiconductor layer. In an embodiment, the method further includes forming a second portion of the first masking layer over the first portion of the first masking layer, wherein the forming the second masking layer includes converting the second portion of the first masking layer to the second masking layer. In another embodiment, after the converting the second portion of the first masking layer to the second masking layer, the second masking layer includes a linear concentration gradient of an impurity. In another embodiment, after the converting the second portion of the first masking layer to the second masking layer, the second masking layer includes a same concentration throughout. In another embodiment, the first masking layer includes a metal oxide, and wherein the second masking layer includes one or more of silicon, germanium, and nitrogen.

In an embodiment, a method includes depositing a first masking layer over a substrate, wherein the first masking layer has a first thickness; forming a second masking layer over the first masking layer, after the forming the second masking layer, the first masking layer has a second thickness different from the first thickness, and wherein the second masking layer has a third thickness; anisotropically etching the first masking layer and the second masking layer to expose a portion of the substrate; growing a first semiconductor material over the second masking layer and a second semiconductor material over the portion of the substrate; and isotropically etching to remove the first masking layer and the second masking layer. In another embodiment, the first semiconductor material includes discontinuous nodules, and wherein the second semiconductor material is continuous. In another embodiment, a sum of the second thickness and the third thickness is greater than the first thickness. In another embodiment, a sum of the second thickness and the third thickness is about equal to the first thickness. In another embodiment, the forming the second masking layer includes treating an upper portion of the first masking layer. In another embodiment, the forming the second masking layer includes attaching functional groups to an exposed upper surface of the first masking layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a semiconductor layer over a substrate;
etching a portion of the semiconductor layer to form a first recess and a second recess;
forming a first-type masking layer over the semiconductor layer, the forming the first-type masking layer comprising:
  forming a first masking layer over the semiconductor layer, the first masking layer being a metal oxide; and
  forming a second masking layer, wherein after forming the second masking layer, the first masking layer is interposed between the substrate and an entirety of the second masking layer;
etching the first-type masking layer to expose the semiconductor layer;
forming a first semiconductor material in the first recess; and
removing the first-type masking layer.

2. The method of claim 1, wherein the forming the second masking layer comprises depositing a new material layer over the first masking layer.

3. The method of claim 2, wherein the forming the first masking layer comprises depositing the first masking layer by atomic layer deposition or chemical vapor deposition.

4. The method of claim 1, wherein the forming the second masking layer comprises performing a dopant implantation on the first masking layer.

5. The method of claim 4, wherein the dopant implantation comprises silicon ion dopants.

6. The method of claim 5, wherein the dopant implantation further comprises nitrogen ion dopants.

7. The method of claim 5, wherein the dopant implantation further comprises germanium ion dopants.

8. The method of claim 1, wherein the second masking layer comprises:
- a first portion comprising a converted upper surface of the first masking layer; and
- a second portion comprising a monolayer over the first portion.

9. A method, comprising:
- forming a semiconductor layer over a substrate;
- forming a first source/drain region, comprising:
  - etching the semiconductor layer to form a first recess in a first region and a second recess in a second region;
  - depositing a first masking layer over the first region and the second region, the first masking layer being a metal oxide;
  - forming a second masking layer over the first masking layer, wherein the forming the second masking layer comprises converting a portion of the first masking layer to the second masking layer;
  - removing the first masking layer and the second masking layer from the second region; and
  - forming a first epitaxial material in the second recess;
- removing a remainder of the first masking layer and a remainder of the second masking layer;
- forming a second source/drain region, comprising:
  - depositing a third masking layer over the first region and the second region;
  - forming a fourth masking layer over the third masking layer;
  - removing the third masking layer and the fourth masking layer from the first region; and
  - forming a second epitaxial material in the first recess;
- removing a remainder of the third masking layer and a remainder of the fourth masking layer; and
- forming a gate structure over the semiconductor layer.

10. The method of claim 9, wherein the second masking layer comprises a linear concentration profile.

11. The method of claim 10, wherein the forming the fourth masking layer comprises performing a dopant implantation on the third masking layer.

12. The method of claim 11, wherein the fourth masking layer comprises a constant concentration profile from an exposed surface of the fourth masking layer to an interface between the fourth masking layer and the third masking layer.

13. The method of claim 9, wherein the forming the fourth masking layer comprises depositing the fourth masking layer over an exposed surface of the third masking layer.

14. The method of claim 9, wherein the forming the second masking layer comprises performing a soak treatment with a silicon precursor.

15. A method, comprising:
- etching a first recess in a substrate;
- etching a second recess in the substrate;
- forming a first masking multi-layer over the substrate, the forming the first masking multi-layer comprising:
  - depositing a first dielectric layer over the substrate and in the first recess and the second recess; and
  - converting an upper portion of the first dielectric layer to a second dielectric layer;
- removing the first masking multi-layer from the first recess;
- forming a first epitaxial material in the first recess; and
- removing a remainder of the first masking multi-layer from the substrate and the second recess.

16. The method of claim 15, further comprising:
- forming a second masking multi-layer over the substrate and the first epitaxial material, the forming the second masking multi-layer comprising:
  - depositing a third dielectric layer over the substrate and in the second recess; and
  - converting an upper portion of the third dielectric layer to a fourth dielectric layer;
- removing the second masking multi-layer from the second recess; and
- forming a second epitaxial material in the second recess.

17. The method of claim 16, wherein the converting the upper portion of the first dielectric layer comprises a dopant implantation into the upper portion of the first dielectric layer.

18. The method of claim 17, wherein the converting the upper portion of the third dielectric layer comprises an ion treatment of the third dielectric layer.

19. The method of claim 15, wherein the first dielectric layer comprises an aluminum oxide, a hafnium oxide, or a zirconium oxide.

20. The method of claim 15, wherein the first dielectric layer comprises a metal oxide, and wherein converting the upper portion of the first dielectric layer to a metal oxynitride.

* * * * *